(12) United States Patent
Vronsky et al.

(10) Patent No.: US 11,234,334 B2
(45) Date of Patent: Jan. 25, 2022

(54) GUIDED TRANSPORT PATH CORRECTION

(71) Applicant: Kateeva, Inc., Newark, CA (US)

(72) Inventors: Eliyahu Vronsky, Los Altos, CA (US);
Karl Mathia, Menlo Park, CA (US);
Alexander Sou-Kang Ko, Santa Clara, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 16/385,435

(22) Filed: Apr. 16, 2019

(65) Prior Publication Data

US 2019/0246506 A1 Aug. 8, 2019

Related U.S. Application Data

(60) Division of application No. 15/828,335, filed on Nov. 30, 2017, now Pat. No. 10,433,434, which is a
(Continued)

(51) Int. Cl.
*H05K 3/44* (2006.01)
*H05K 3/46* (2006.01)
(Continued)

(52) U.S. Cl.
CPC ......... *H05K 3/4644* (2013.01); *B05C 5/0208* (2013.01); *B05D 5/12* (2013.01);
(Continued)

(58) Field of Classification Search
USPC .......................................................... 427/58
See application file for complete search history.

(56) References Cited

U.S. PATENT DOCUMENTS

| 4,069,697 A | 1/1978 | Morrison et al. |
| 4,283,929 A | 8/1981 | Heiberger |
(Continued)

FOREIGN PATENT DOCUMENTS

| CN | 104136917 A | 11/2014 |
| CN | 106457304 A | 2/2017 |
(Continued)

OTHER PUBLICATIONS

Non-Final Office Action dated Nov. 27, 2019 in U.S. Appl. No. 15/851,419.
(Continued)

*Primary Examiner* — Brian K Talbot
(74) *Attorney, Agent, or Firm* — Hauptman Ham LLP

(57) ABSTRACT

A printer deposits material onto a substrate as part of a manufacturing process for an electronic product; at least one transported component experiences error, which affects the deposition. This error is mitigated using transducers that equalize position of the component, e.g., to provide an "ideal" conveyance path, thereby permitting precise droplet placement notwithstanding the error. In one embodiment, an optical guide (e.g., using a laser) is used to define a desired path; sensors mounted to the component dynamically detect deviation from this path, with this deviation then being used to drive the transducers to immediately counteract the deviation. This error correction scheme can be applied to correct for more than type of transport error, for example, to correct for error in a substrate transport path, a printhead transport path and/or split-axis transport non-orthogonality.

14 Claims, 14 Drawing Sheets

Related U.S. Application Data continuation of application No. 15/642,188, filed on Jul. 5, 2017, now Pat. No. 9,961,783.

(60) Provisional application No. 62/489,768, filed on Apr. 25, 2017, provisional application No. 62/459,402, filed on Feb. 15, 2017, provisional application No. 62/359,969, filed on Jul. 8, 2016.

(51) Int. Cl.
    *B05D 5/12*           (2006.01)
    *B05C 5/02*           (2006.01)
    *B41J 3/407*          (2006.01)
    *B41J 13/00*          (2006.01)
    *H01L 51/00*          (2006.01)
    *B41J 29/393*        (2006.01)
    *H01L 21/67*          (2006.01)
    *H01L 21/677*         (2006.01)
    *H01L 21/68*          (2006.01)
    *B41J 2/01*           (2006.01)
    *H01L 21/683*         (2006.01)

(52) U.S. Cl.
    CPC ........... *B41J 3/407* (2013.01); *B41J 13/0027* (2013.01); *B41J 29/393* (2013.01); *H01L 51/00* (2013.01); *H05K 3/4679* (2013.01); *B41J 2/01* (2013.01); *H01L 21/67* (2013.01); *H01L 21/6715* (2013.01); *H01L 21/6776* (2013.01); *H01L 21/67784* (2013.01); *H01L 21/68* (2013.01); *H01L 21/683* (2013.01); *H01L 51/0005* (2013.01); *H05K 2203/013* (2013.01); *H05K 2203/0104* (2013.01); *H05K 2203/0736* (2013.01); *H05K 2203/166* (2013.01)

(56) References Cited

U.S. PATENT DOCUMENTS

| | | | |
|---|---|---|---|
| 4,295,741 A | 10/1981 | Palma et al. | |
| 4,470,304 A | 9/1984 | Nusbickel, Jr. et al. | |
| 4,833,591 A | 5/1989 | Eckl | |
| 5,191,200 A | 3/1993 | Werf et al. | |
| 5,489,925 A | 2/1996 | Brooks et al. | |
| 5,894,342 A | 4/1999 | Haulp et al. | |
| 5,933,573 A | 8/1999 | Lukenich et al. | |
| 7,604,439 B2 | 10/2009 | Yassour et al. | |
| 8,863,661 B2 | 10/2014 | Fraser et al. | |
| 9,505,245 B2* | 11/2016 | Lowrance | B41J 11/06 |
| 9,884,501 B2* | 2/2018 | Lowrance | B41J 11/06 |
| 2002/0079057 A1 | 6/2002 | Yoshioka et al. | |
| 2003/0097929 A1 | 5/2003 | Watanabe et al. | |
| 2003/0175414 A1 | 9/2003 | Hayashi | |
| 2004/0003738 A1 | 1/2004 | Imiolek et al. | |
| 2004/0056244 A1 | 3/2004 | Marcus et al. | |
| 2004/0086631 A1 | 5/2004 | Han et al. | |
| 2004/0118309 A1 | 6/2004 | Fedor et al. | |
| 2004/0197179 A1 | 10/2004 | Achkire et al. | |
| 2005/0001579 A1 | 1/2005 | Touzov | |
| 2005/0031975 A1 | 2/2005 | Reuhman-Huisken et al. | |
| 2005/0040338 A1 | 2/2005 | Weiss et al. | |
| 2005/0045096 A1* | 3/2005 | Kojima | H01L 21/02 118/323 |
| 2005/0257738 A1 | 11/2005 | Tateishi et al. | |
| 2006/0120833 A1 | 6/2006 | Bonora et al. | |
| 2006/0158470 A1 | 7/2006 | Vanheusden et al. | |
| 2006/0219605 A1 | 10/2006 | Devitt | |
| 2007/0031603 A1 | 2/2007 | Eron | |
| 2007/0257033 A1 | 11/2007 | Yamada | |
| 2010/0201749 A1 | 8/2010 | Somekh et al. | |
| 2011/0149000 A1 | 6/2011 | Albertalli et al. | |
| 2011/0318503 A1 | 12/2011 | Adams et al. | |
| 2012/0044292 A1 | 2/2012 | Helsel et al. | |
| 2012/0227599 A1 | 9/2012 | Fraser et al. | |
| 2013/0040061 A1 | 2/2013 | Lowrance et al. | |
| 2013/0252533 A1 | 9/2013 | Mauck et al. | |
| 2013/0284946 A1 | 10/2013 | Schaede | |
| 2013/0294877 A1 | 11/2013 | Hosek | |
| 2014/0023112 A1 | 1/2014 | Millar et al. | |
| 2014/0184683 A1* | 7/2014 | Harjee | B41J 2/04581 347/14 |
| 2014/0374375 A1 | 12/2014 | Zwiers et al. | |
| 2015/0221869 A1 | 8/2015 | Harjee et al. | |
| 2015/0314325 A1 | 11/2015 | Ko et al. | |
| 2015/0360462 A1* | 12/2015 | Lowrance | B41J 3/28 101/425 |
| 2017/0129265 A1 | 5/2017 | Lowrance et al. | |
| 2018/0014410 A1 | 1/2018 | Darrow et al. | |
| 2018/0014411 A1 | 1/2018 | Vronsky et al. | |
| 2018/0228034 A1 | 8/2018 | Darrow et al. | |
| 2018/0229497 A1 | 8/2018 | Darrow et al. | |
| 2018/0264862 A1 | 9/2018 | Lowrance et al. | |
| 2019/0252646 A9 | 8/2019 | Harjee et al. | |

FOREIGN PATENT DOCUMENTS

| | | |
|---|---|---|
| JP | 2005062819 A | 3/2005 |
| JP | 2006524435 A | 10/2006 |
| JP | 2007533153 A | 11/2007 |
| JP | 2010533057 A | 1/2014 |
| JP | 2014502220 A | 1/2014 |
| TW | 579538 B | 3/2004 |
| TW | 200420179 A | 10/2004 |
| TW | 200508140 A | 3/2005 |
| TW | 201606441 A | 2/2016 |
| TW | 201238784 B | 4/2016 |
| WO | 2013009087 A3 | 3/2013 |
| WO | 2014084888 A1 | 6/2014 |

OTHER PUBLICATIONS

Official Action dated Oct. 30, 2019 in JP Patent Application No. 2018-567850.
Official Action dated Oct. 30, 2019 in JP Patent Application No. 2018-567877.
Non-Final Office action dated Dec. 5, 2018 to U.S. Appl. No. 15/828,335.
Notice of Allowance dated Mar. 25, 2019 to U.S. Appl. No. 15/828,335.
Second Office Action dated Apr. 23, 2020 to CN Patent Application No. 201780042517.9.
Second Office Action dated Feb. 27, 2020 to CN Patent Application No. 201780042553.5.
Extended European Search Report dated Feb. 5, 2020 to EP Application 17824921.5.
Extended European Search Report dated Feb. 5, 2020 to EP Application 17824919.9.
Notice of Allowance dated Feb. 21, 2019 in U.S. Appl. No. 15/836,617.
Notice of Allowance dated Mar. 26, 2019 in U.S. Appl. No. 15/816,443.
Notification of Provisional Rejection dated May 20, 2019 in KR Application No. 10-2019-7003596.
Ex Parte Quayle Office Action dated Jun. 26, 2018 in U.S. Appl. No. 15/354,927.
Examination Report dated Oct. 9, 2018 in Taiwanese Patent Application No. 10729318.
KR Provisional Rejection dated Aug. 14, 2018 in Korean Patent Application No. 10-2017-7000812.
Non-Final Office action dated Dec. 5, 2018 in U.S. Appl. No. 15/816,443.
Non-Final Office Action dated Oct. 6, 2015 in U.S. Appl. No. 14/738,785.
Notice of Allowance dated Oct. 3, 2017 in U.S. Appl. No. 15/354,927.
Notice of Allowance dated Oct. 9, 2018 in U.S. Appl. No. 15/836,617.
Examination Report dated Feb. 26, 2018 in Taiwanese Patent Application No. 104119382.

(56) References Cited

OTHER PUBLICATIONS

Examiner Initiated Summary dated Nov. 16, 2017 in U.S. Appl. No. 15/642,037.
Extended European Search Report dated Feb. 12, 2018 in European Patent Application No. 15809195.9.
Notice of Allowance dated Dec. 4, 2017 in U.S. Appl. No. 15/642,037.
Notice of Allowance dated Nov. 16, 2017 in U.S. Appl. No. 15/642,037.
Supplemental Notice of Allowability dated Dec. 11, 2017 in U.S. Appl. No. 15/642,188.
International Search Report and Written Opinion dated Apr. 24, 2018 in International Application No. PCT/US18/16929.
Examiner Initiated Interview Summary dated Dec. 11, 2017 in U.S. Appl. No. 15/642,188.
Informal Comments Submitted By Applicant in response to Written Opinion in International Patent Application No. PCT/US/2017/040968, 2 pages, filed Nov. 17, 2017.
Informal Comments Submitted By Applicant in response to Written Opinion in International Patent Application No. PCT/US2017/040970. 2 pages, filed Nov. 14, 2017.
International Search Report and Written Opinion dated Sep. 17, 2015 in International Application PCT/US2015/35700.
International Search Report and Written Opinion dated Sep. 22, 2017 in International Patent Application No. PCT/US/2017/040968.
International Search Report and Written Opinion dated Sep. 26, 2017 in International Patent Application No. PCT/US2017/040970.
Notice of Allowance dated Nov. 27, 2017 in U.S. Appl. No. 15/642,188.
KL-80 Laser System Training Course Manual {Part 1), Renishaw apply innovation, training manual, Dec. 2008; pp. 2.1-2.26.
Non-Final Office Action dated Dec. 5, 2018 in U.S. Appl. No. 15/828,335.
Notice of Allowance dated Mar. 25, 2019 in U.S. Appl. No. 15/828,335.
First Office Action dated Jul. 16, 2019 to CN Application No. 201780042553.5.
Notice of Allowance dated Jun. 3, 2019 to U.S. Appl. No. 15/816,443.
Office Action dated Jul. 30, 2019 for CN Application No. 201780042517.9.
Office Action dated Jun. 4, 2019 to JP Application No. 2018-567877.
Office Action dated Jun. 4, 2019 to JP Patent Application No. 2018-567850.
Notice of Allowance dated May 28, 2020 to U.S. Appl. No. 15/851,419.
Provisional Rejection dated May 26, 2020 to KR Patent Application No. 10-2020-7001104.
Provisional Rejection dated May 27, 2020 to KR Patent Application No. 10-2019-7031848.
Examination Report dated Mar. 18, 2021 to TW Patent Application No. 107103499.
Notice of Final Refusal dated Nov. 6, 2020 to KR Patent Application No. 10-2019-7031848.
Notice of Reason for Refusal dated Mar. 19, 2021 to JP Application 2020-70208.
Notice of Reason of Refusal dated Dec. 14, 2020 to JP Application 2020-43824.

\* cited by examiner

GUIDED TRANSPORT PATH CORRECTION

This application is a divisional of U.S. Utility patent application Ser. No. 15/828,335, filed on Nov. 30, 2017 on behalf of first-named inventor Eliyahu Vronsky for "Guided Transport Path Correction which in turn is a continuation of U.S. Utility patent application Ser. No. 15/642,188, filed on Jul. 5, 2017 on behalf of first-named inventor Eliyahu Vronsky for "Guided Transport Path Correction, which in turn claims the benefit of U.S. Provisional Application No. 62/489,768, filed on Apr. 25, 2017 on behalf of first-named inventor Digby Pun and U.S. Provisional Application No. 62/359,969, filed on Jul. 8, 2016 on behalf of first-named inventor Digby Pun, each titled "Transport Path Correction Techniques And Related Systems, Methods And Devices," and U.S. Provisional Patent Application No. 62/459,402, filed on Feb. 15, 2017 on behalf of first-named inventor David C. Darrow for "Precision Position Alignment, Calibration and Measurement in Printing And Manufacturing Systems;" each of these applications is hereby incorporated by reference. This disclosure also incorporates by reference the following documents: U.S. Pat. No. 9,352,561 (U.S. Ser. No. 14/340,403), filed as an application on Jul. 24, 2014 on behalf of first inventor Nahid Harjee for "Techniques for Print Ink Droplet Measurement And Control To Deposit Fluids Within Precise Tolerances;" US Patent Publication No. 20150360462 (U.S. Ser. No. 14/738,785), filed as an application on Jun. 12, 2015 on behalf of first inventor Robert B. Lowrance for "Printing System Assemblies and Methods;" US Patent Publication No. 20150298153 (U.S. Ser. No. 14/788,609), filed as an application on Jun. 30, 2015 on behalf of first-named inventor Michael Baker for "Techniques for Arrayed Printing of a Permanent Layer with Improved Speed and Accuracy;" and U.S. Pat. No. 8,995,022, filed as an application on Aug. 12, 2014 on behalf of first-named inventor Eliyahu Vronsky for "Ink-Based Layer Fabrication Using Halftoning To Control Thickness."

BACKGROUND

Certain types of industrial printers can be applied to precision manufacture, for example, to the fabrication of electronic devices.

To take one non-limiting example, ink jet printers can be used to deposit one or more super-thin layers of an electronic display device or a solar panel device. The "ink" in this case differs from conventional notions of ink as a dye of a desired color, and instead can be an organic monomer deposited as discrete droplets that spread somewhat and meld together, but that are not absorbed and instead retain a deliberate layer thickness that helps impart structural, electromagnetic or optical properties to the finished device; the ink is also typically deliberately made to be translucent with a resultant layer being used to generate and/or transmit light. A continuous coat of the ink deposited by the printing is then processed in place (e.g., cured using ultraviolet light, or otherwise baked or dried) to form a permanent layer having a very tightly regulated thickness, e.g., 1-10 microns, depending on application. These types of processes can be used to deposit hole injection layers ("HILs") of OLED pixels, hole transfer layers ("HTLs"), hole transport layers ("HTLs"), emissive or light emitting layers ("EMLs"), electron transport layers ("ETLs"), electron injecting layers ("EILs"), various conductors such as an anode or cathode layer, hole blocking layers, electron blocking layers, polarizers, barrier layers, primers, encapsulation layers and other types of layers. The referenced materials, processes and layers are exemplary only. In one application, the ink can be deposited to create a layer in each of many individual electronic components or structures, for example, within individual microscopic fluidic reservoirs (e.g., within "wells") to form individual display pixels or photovoltaic cell layers; in another application, the ink can be deposited to have macroscopic dimensions, for example, to form one or more encapsulation layers cover many such structures (e.g., spanning a display screen area having millions of pixels).

The required precision can be very fine; for example, a manufacturer's specification for fabricating a thin layer of an organic light emitting diode ("OLED") pixel might specify aggregate fluid deposition within a pixel well to a resolution of a picoliter (or to even a greater level of precision). Even slight local variations in the volume of deposited fluid from specification can give rise to problems. For example, variation in ink volume from structure-to-structure (e.g., pixel-to-pixel) can give rise to differences in hue or intensity differences or other performance discrepancies which are noticeable to the human eye; in an encapsulation or other "macroscopic" layers, such variation can compromise layer function (e.g., the layer may not reliably seal sensitive electronic components relative to unwanted particulate, oxygen or moisture), or it can otherwise give rise to observable discrepancies. As devices become smaller and smaller these problems become much more significant. When it is considered that a typical application can feature printers having tens-of-thousands of nozzles that deposit discrete droplets each having a volume of 1-30 picoliters ("pL"), and that manufacturing process corners for the printheads can lead to inoperative nozzles and individual error in any of droplet size, nozzle location, droplet velocity or droplet landing position, thereby giving rise to localized ink volume delivery variation, it should be appreciated that there are very great challenges in producing thin, homogeneous layers that closely track desired manufacturing specifications.

One source of error in achieving fine precision relates to the use of mechanical components in the fabrication processes relative to the scale of products being manufactured. As a non-limiting example, most printers have mechanical conveyance systems that move one or more printheads, a substrate, or both in order to perform printing. Some printers also feature conveyance systems for rotating or offsetting components (e.g., moving or rotating printheads to change effective pitch between nozzles); each of these conveyance systems can impart fine mechanical or positioning error that in turn can lead to non-uniformity. For example, even though these conveyance systems typically rely on high-precision parts (e.g., precision tracks or edge guides), they can still impart jitter or translational or rotational inaccuracy (e.g., such as millimeter, micron or smaller scale excursions in the transport path) that makes it difficult to achieve the required precision and uniformity throughout the transport path lengths used for manufacture. To provide context, an apparatus used to fabricate large size HDTV screens might feature a "room sized" printer which is controlled so as to deposit an ultra-thin material layer on substrates meters wide by meters long, with individual droplet delivery planned to nanometer-scale coordinates; the transport paths in such an apparatus can be meters in length. Note that there are many other mechanical components that can give rise to some form of error in such a system, for example, transport path systems used to interchange printheads, camera assemblies to align or inspect a substrate, and other types of moving parts. In such a system, even very fine precision mechanical parts can create excursions that affect the nanometer-scale coordinates just referenced. Thus, the required layers become thinner and thinner, and the require precision becomes smaller and smaller relative to the product being fabricated, it becomes even more imperative to carefully control and/or mitigate sources of potential positional error.

There exist some conventional techniques for reducing positional and translational error generally in these types of fabrication systems. First, a substrate can be coarsely-aligned with printer transport and then manually fine-aligned (potentially repeatedly during the fabrication process); such a process is time-consuming, i.e., it generally impedes the goal of having an automated, fast, assembly-line style process for producing consumer products. It is also generally quite difficult to obtain the required micron- or nanometer-precision with such a manual process. There also are some errors that cannot be adequately addressed with such a technique, for example, errors caused by transport path discrepancies, as just introduced above (e.g., error which manifests itself after a substrate has been aligned). As a second example, US Patent Publication No. 20150298153 relates to processes that measure fine positional and/or rotational errors in substrate position and that correct for those errors in software, for example, by reassigning which nozzles are used to print or by otherwise changing the nozzle drive waveforms which are used to fire nozzles; in other words, generally speaking, these techniques attempt to "live with" fine positional and rotational error (thereby preserving print speed) and they then attempt to adjust which nozzles are used and when and how those nozzles are electronically controlled, so as to remedy error (e.g., using a preplanned raster without having to re-adjust scan paths dependent on error). However, despite the utility of compensating for alignment error in software, the measuring and accounting for this error and re-computing firing assignments for thousands of nozzles in software can take substantial computing resources and time.

What are needed are additional techniques for correcting for motion, rotation and position error in mechanical systems in a manufacturing apparatus. Still further, what are needed are techniques for correcting for error in a moving component of a manufacturing system in order to simulate an "ideal" edge or transport path. Such techniques, if applied to precision manufacturing processes, especially printing systems of the type described, would reduce the need for substantial computing resources and time to re-render raster control data and, overall, lead to a simpler and/or faster and/or more accurate print process. The present invention addresses these needs and provides further, related advantages.

BRIEF DESCRIPTION OF THE FIGURES

FIG. 1 shows the substrate at two hypothetical positions (103' and 103") with respective rotation and translation error ($\Delta x$, $\Delta y$, and $\Delta \theta$). Transport path error and associated substrate rotation and translation error is seen as exaggerated relative to drawing scale, to assist with explanation.

Figure 1:
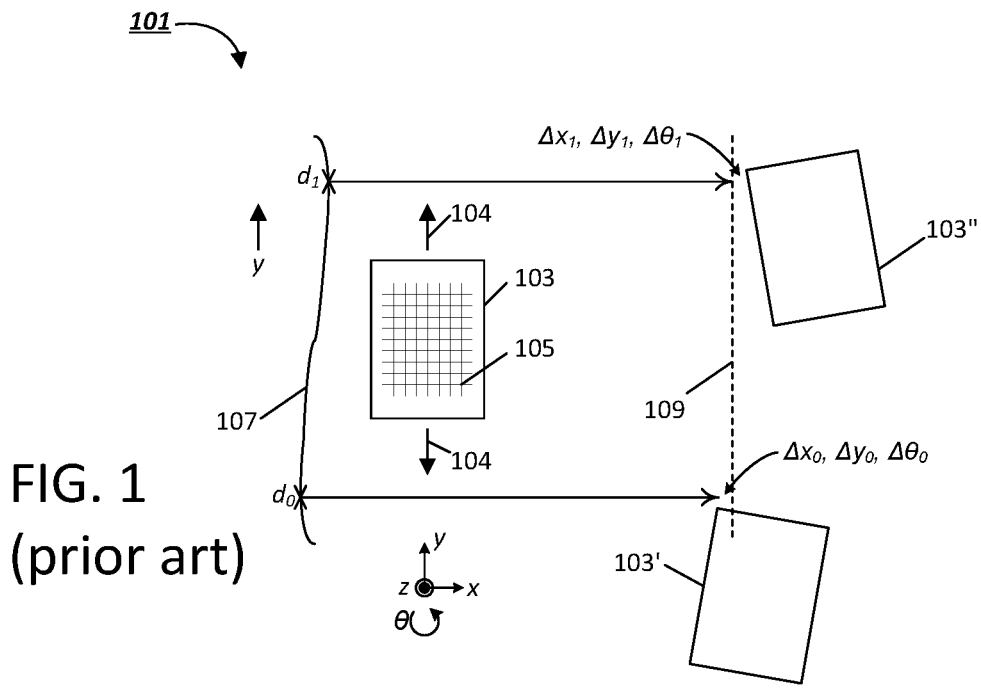
FIG. 1 illustrates a substrate 103 as it is transported through an industrial printing system along a transport path 107; at its right side.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques for mitigating transport path error in a manufacturing apparatus or printer, and/or for fabricating a thin film for one or more products of a substrate as part of a repeatable print process. The various techniques can be embodied in various forms, for example, in the form of a printer or manufacturing apparatus, or a component thereof, in the form of control data (e.g., precomputed correction data or transducer control data), or in the form of an electronic or other device fabricated as a result of these techniques (e.g., having one or more layers produced according to the described techniques). While specific examples are presented, the principles described herein may also be applied to other methods, devices and systems as well.

DETAILED DESCRIPTION

This disclosure provides improved techniques for correcting transport path error and/or for fabricating a layer on a substrate with a high degree of positional accuracy. In one embodiment, these techniques are applied to a manufacturing apparatus or system that produces a layer of an electronic display, a solar panel or another electronic device or, indeed any other type of precision device or product. The manufacturing system or fabrication system includes a conveyance system and a component will be guided along a transport path to assist with manufacturing. The path length is typically quite long relative to the required positioning precision. In a typical implementation, for example, the conveyance path length can be meters, but the required positioning can be micron-scale or even finer (e.g., nanometer-scale or finer). To assist with precise positioning, one or more sensors are used to detect deviation between the component and an optical beam, in one or more dimensions. Deviation detected by the one or more sensors is then used to derive position correction signals which are fed to one or more transducers and used to offset the deviation, with the result that the component tracks the optical path notwithstanding fine mechanical error associated with the transport path. In one embodiment, the one or more sensors provide feedback that causes the transducers to always "zero-out" positional and rotational error.

More specifically, these techniques can optionally be applied to a printer used to fabricate electronic products where the printer deposits material onto a substrate at precise coordinates. The conveyance system in this context can be any mechanical system used by the printer, for example, a gripper used to advance a substrate, a printhead motion system used to transport a printhead (e.g., orthogonally to motion of a gripper), a camera conveyance system, a fly-height or printhead height adjustment system, and other types of assemblies as well. In the immediately ensuing discussion, an example will be narrated where these techniques are applied to gripper path adjustment; it should be understood that the techniques described herein are not limited to a gripper conveyance system, nor are they limited to the context of printers in general. Conversely, it should also be understood that these techniques may optionally be applied to two or more conveyance systems or transport systems in a manufacturing system, such as to control for any of x, y and/or z position, or associated rotational degrees of freedom, as desired. In one example discussed below, these techniques are applied independently to each of gripper and printhead transport paths, and are used in concert with a position feedback system for each transport path, in order to provide for precise positioning in x, y and/or z axes and in order to ensure coordinate system orthogonality and precise position control in a printing system.

In one example, a glass substrate meters long and meters wide is introduced into a "room-sized" printer, where the printer will print individual droplets of "ink" at very precise coordinates (e.g., at precise nanometer or sub-nanometer coordinates). Two conveyance systems are used to position droplets, including a "gripper" which advances the substrate back-and-forth along a "fast" or "in-scan" direction, and a printhead conveyance system which moves the printhead in a "slow" or "cross-scan" direction (e.g., the printhead is repositioned in between ensuing scans so that printing occurs in a swath as the substrate moves under the printhead). In variations, both systems can be moved simultaneously, or the printhead or substrate can be stationary while the other moves in two or more dimensions. The droplet landing locations are selected such that deposited droplets meld together on the glass substrate and provide gapless area coverage, so as to typically form a liquid coat without pinholes, gaps or other defects. The "ink" differs from traditional notions of ink for graphics printers and is typically a relatively viscous material (e.g., an organic monomer) that is colorless or, alternatively stated, where native color of the material is unimportant; the ink is typically not absorbed and spreads only to a limited extent, such that the finished layer provides a specifically-desired layer thickness or other specifically-desired electrical, magnetic, light-generating, structural or similar property. For example, the ink can in one embodiment be an organic monomer, where a deposited coat (once droplets meld adequately) is then cured using ultraviolet light to form a polymer layer. The liquid coat, once formed, is then hardened, dried, cured, developed, or otherwise processed ("processed") so as to form a permanent or semi-permanent layer of an electronic product being fabricated on the glass substrate. These techniques can be used to deposit light generating layers of individual pixels of electronic displays, encapsulation layers, and potentially other types of layers; for example, the techniques disclosed herein can be applied to a wide variety of manufacturing processes, including without limitation, to the deposition of precision coatings for "smart windows" and other types of electronic, optical, or other devices. Note that when used to form layers of precision electronic components (e.g., micron- or nanometer-scale structures), each of the droplets in the foregoing examples must typically be deposited at very fine positional coordinates, e.g., too much or two little ink, or poorly position droplets can result in defective or suboptimal components. While precision mechanical parts (e.g., tracks or edge guides) are used to help ensure accurate motion, these systems can still result in mechanical jitter that disrupts proper droplet placement.

In embodiments herein, to correct for this issue, a conveyance system (e.g., a gripper) can have two components including a first (or "track-guided") component that moves along the conveyance path, and a second (or "offsettable") component, with one or more transducers being used to offset the second component relative to the first. For example, the first component follows a track, while the second component mounts a vacuum chuck that is used to engage the substrate; in other embodiments, other technologies can be used to engage and/or transport the substrate. As the first component experiences jitter and error, this error is detected and used to drive the transducers, which cause the second component to offset the error such that the substrate travels an ideal path. In one embodiment, this is achieved by using a laser beam and/or optics and/or a detector to mark an ideal path, with the second component mounting one or more of these optical components in a manner so as to detect deviation of the second component from this marked, ideal path. The detected deviation is used to immediately drive the transducers to counteract that deviation. In one implementation, a simple two-cell detector can be used to detect path deviation in one dimension, while in another implementation, a four-cell or more complicated design can be used to detect error in two or more dimensions; for example, in the context of the example just presented, the glass substrate can be supported on an air bearing (i.e., above a gas floatation table) while the gripper can use suction to selectively engage and then to transport the substrate; the gripper's "second component" in one embodiment can be offset in the cross-scan dimension, as well as for height so as to match a fly-height of the substrate above the air floatation table (or otherwise to levelize the gripper). Naturally, other implementations will occur to those of ordinary skill in the art; as noted above, the techniques described herein can be applied to a wide range of manufacturing and/or conveyance systems (e.g., application to a printer, gripper, printhead or similar components are to be considered "optional").

Note that whatever the source of the error (e.g., whether attributed to the conveyance system as "repeatable" error or otherwise), the techniques described herein immediately correct position of the thing being transported so that it experiences ideal motion, at least in one or more dimensions orthogonal to the direction of transport. These techniques are especially useful where precise positional and/or orientation control is desired, e.g., in an assembly-line style process, where each substrate or each product can experience fine repeatable or non-repeatable position and/or orientation error.

To correct for and/or mitigate error, in one embodiment, fine-positioning transducers are driven without a fixed pivot point to counteract the mechanical imperfections. These transducers perform fine tuning of substrate position and/or orientation, and thereby counteract the effects of the mechanical imperfections in at least one dimension. In this manner, although the conveyance system (e.g., the gripper, substrate, printhead, camera or other transport path) continues to be characterized by mechanical imperfections, motion of the substrate and/or printhead is made to approximate ideal travel. In one embodiment, a transport path is substantially linear and transport substantially occurs along a first dimension (e.g., the "y"-dimension) while two or more transducers each independently apply linear offsets in an independent dimension (for example, the "x"-dimension). Driven in common mode, these transducers permit offset of imperfections associated with the conveyance system which affect "x"-dimensional position of the substrate. For example, the transported thing can be made to travel a virtual straight edge in the "y"-dimension. Driven in differential mode, the transported thing can also be rotated in the "xy" plane, to correct for orientation error also caused by mechanical imperfections of the transport path. Note that three or more transducers can be used to simultaneously correct for error in multiple dimensions, e.g., to "levelize" gripper or printhead height, as will be further discussed below.

In a split-axis system used for fabricating electronic devices on a substrate, a "gripper" can be used to move the substrate along a first dimension (e.g., the "y"-dimension). The gripper has a first component that rides along an edge or track and a second component (typically a vacuum device) that engages and locks to the substrate; the transducers can be positioned operatively between these components so as to provide selective offset between the first component and the second component at two or more respective points of interaction, to provide both common and differential mode displacement as referenced above. As the first component experiences translational and rotational excursions caused by mechanical imperfections in the conveyance system (e.g., in a second dimension), the transducers are driven so as to exactly equalize those excursions in that dimension, and essentially provide for the second component a "virtual edge" or "virtual transport path" uncharacterized by mechanical error. Note that errors can be linear or nonlinear and the corrections correspondingly can be linear or nonlinear. In optional embodiments, this type of system can be embodied in a printer or printing system, e.g., with the y-dimension being a substrate transport dimension and/or one of an "in-scan" or "cross-scan" dimension, and with the x-dimension being a printhead transport dimension and/or the other of the "in-scan" or "cross-scan" dimension. Note that the described reference frames are arbitrary and can be inverted or swapped for other reference frames or for other degrees of freedom.

As noted, there may be multiple transport paths in a manufacturing system, and these techniques can be applied to any one of these transport paths or any combination of them, and can be applied to correct positional error in one dimension (or rotational error) or errors in multiple dimensions. Several examples will help underscore this point.

First, in one contemplated implementation, these techniques are used to correct for cross-scan dimensional error in substrate position as a gripper moves along a transport path. A gripper has first and second components as referenced above and linear transducers that operatively couple these components in at least two points of interaction, with the transducers structured so as to provide for a "floating" pivot point. As the first component travels down a conveyance path, deviation from an optical guide or from a desired optical orientation is detected; signals produced from this detected deviation are used to control the transducers so as to provide "common-mode" and "differential-mode" offsets that repeatably provide for translational offset in the cross-scan dimension and rotational adjustment of the substrate, so as to drive the deviation or error to zero. The substrate therefore is advanced in a straight path notwithstanding mechanical imperfections of the conveyance system. Various embodiments of the mentioned transducers will be provided below but, briefly, in one embodiment, "voice coils" can be used for these transducers, so as to provide very precise, microscopic throws. To help provide structural support and interconnection between the first and second components, a floating, mechanical pivot assembly compatible with the common and differential drive modes can also optionally be used. In other embodiments, a piezoelectric or other transducer can instead be used.

In an optional extension to this first example, gripper position (and/or the position of the second component of the gripper) can also be regulated in an in-scan dimension. For example, in one embodiment, an electronic drive signal (used to advance the gripper, or otherwise used to trigger printer nozzle firing) is adjusted so as to correct for positional error of the substrate in the in-scan dimension. It is also possible to use another transducer (e.g., another voice coil or other transducer) to offset the first component relative to the second component in the in-scan dimension. In a first technique, in-scan positional error can be measured and used to offset individual nozzle firings (i.e., as the printhead(s) and substrate move relative to each other, so as to effectuate nozzle firing at precisely the corrected, intended in-scan positions); for example, delays in nozzle firings can be calculated and programmed into a printhead for each nozzle, with firings then driven off of a common trigger signal. In a second technique, a common or shared nozzle trigger signal can be generated as a function of gripper position (and/or position of the first component of the gripper) and can be corrected for error so that the trigger signal is generated so as to simulate error-free movement of the gripper. As regards this optional extension, it was earlier mentioned that in one implementation, correction techniques can be applied to each of gripper and printhead conveyance paths and used in concert with a position feedback system for each conveyance path, in order to provide for precise positioning in x and y axes and to ensure coordinate system orthogonality and precise position control in a printing system. In one such implementation, the gripper system has a linear encoder that provides positional feedback, for example, by imaging visible marks or "ticks" associated with its conveyance path; such markings for example can be applied via an adhesive tape which marks "each micron" (or other regular distance measure) of advancement relative to a track or guide. This positional feedback can optionally be used to correct for in-scan dimensional advancement of the gripper (e.g., so that the gripper is inherently or transparently positioned correctly relative to the in-scan direction). In a system where such positional feedback is applied to each conveyance path (e.g., such that a similar linear encoding system is also used for printhead in-scan position regulation), transducer-based correction techniques can provide offsets orthogonal to the direction of conveyance, for each of the printhead and the gripper, in order to define a coordinate reference system and to precisely control droplet placement. These techniques by themselves do not necessarily inherently correct for non-orthogonality between conveyance axes (e.g., x and y axes associated respectively with the gripper and printhead conveyance systems); in some embodiments, therefore, additional techniques described herein can be optionally applied to correct positioning of optical beams used to mark desired transport paths, or otherwise to control error correction systems to as to address non-orthogonality. When combined with optional techniques for height regulation and/or correction, these techniques help provide for precise position control of all elements in the manufacturing system. These various advantages and synergies of these various techniques will be elaborated on below.

Reflecting on the principles discussed thus far, an optical source and detector and any associated optics (depending on implementation) can be used to guide and/or sense positional deviation of a transported component. At least one transducer can be used to correct for transport path error by displacing a thing being transported in a dimension orthogonal to the direction of transport using both common-mode and differential-mode control, i.e., as a function of the detected deviation, using feedback. In a still more detailed embodiment, this type of control can be applied to correct for transport path error in two different transport paths, for example, to "y"-axis motion of a first conveyance system and to "x"-axis motion of a second conveyance system, using respective sets of transducers. Correcting two different transport paths in this manner helps facilitate precise correction over deposition and/or fabrication parameters. For example, in the context of a split-axis printing system, introduced above, correction of both of gripper/substrate path and printhead path effectively normalizes a "print grid" (a coordinate reference system used to define where droplets will be printed), and provides for a system where the system's understanding of print grid coordinates is precisely correct and is not undermined by errors in mechanical systems associated with transport. These techniques and various combinations and permutations discussed herein (including the incorporated-by-reference documents) help provide for precise positional control over deposited droplets. For example, these techniques can be further applied to "z-axis" (e.g. height) or other dimensional motion control; alternatively, the techniques described herein can be combined with the use of per-nozzle droplet parameters and/or nozzle parameters to provide for highly accurate control over deposited liquid volumes, as for example described in U.S. Pat. No. 9,352,561 and U.S. Patent Publication No. 2015/0298153.

This disclosure will roughly be organized as follows: (1) FIGS. 1-3E will be used to provide an introduction relating to depositing a material on a substrate, causes of fine alignment error and associated remedies; (2) FIGS. 4A-5 will be used to introduce more specific techniques, that is, relating to on-line and off-line processes relating to measuring/detecting and counteracting error in a contemplated split-axis print environment; (3) FIGS. 6A-6E will be used to describe specific mechanical structures in one or more detailed embodiments; (4) FIGS. 7A-H will be used to discuss various use cases and optional extensions; and (5) FIGS. 8A and 8B will be used to discuss multidimensional control (e.g., x and z axis control) of a conveyance system component.

Prior to proceeding to the introduction, it would be helpful to first introduce certain terms used herein.

Specifically contemplated implementations can include an apparatus comprising instructions stored on non-transitory machine-readable media. Such instructional logic can be written or designed in a manner that has certain structure (architectural features) such that, when the instructions are ultimately executed, they cause the one or more general purpose machines (e.g., a processor, computer or other machine) each to behave as a special purpose machine, having structure that necessarily performs described tasks on input operands in dependence on the instructions to take specific actions or otherwise produce specific outputs. "Non-transitory" machine-readable or processor-accessible "media" or "storage" as used herein means any tangible (i.e., physical) storage medium, irrespective of the technology used to store data on that medium, e.g., including without limitation, random access memory, hard disk memory, optical memory, a floppy disk, a CD, a solid state drive (SSD), server storage, volatile memory, non-volatile memory, and other tangible mechanisms where instructions may subsequently be retrieved by a machine. The media or storage can be in standalone form (e.g., a program disk or solid state device) or embodied as part of a larger mechanism, for example, a laptop computer, portable device, server, network, printer, or other set of one or more devices. The instructions can be implemented in different formats, for example, as metadata that when called is effective to invoke a certain action, as Java code or scripting, as code written in a specific programming language (e.g., as C++ code), as a processor-specific instruction set, or in some other form; the instructions can also be executed by the same processor or different processors or processor cores, depending on embodiment. Throughout this disclosure, various processes will be described, any of which can generally be implemented as instructions stored on non-transitory machine-readable media, and any of which can be used to fabricate products. Depending on product design, such products can be fabricated to be in saleable form, or as a preparatory step for other printing, curing, manufacturing or other processing steps, that will ultimately create finished products for sale, distribution, exportation or importation where those products incorporate a specially-fabricated layer. Also depending on implementation, the instructions can be executed by a single computer and, in other cases, can be stored and/or executed on a distributed basis, e.g., using one or more servers, web clients, or application-specific devices. Each function mentioned in reference to the various FIGS. herein can be implemented as part of a combined program or as a standalone module, either stored together on a single media expression (e.g., single floppy disk) or on multiple, separate storage devices. The same is also true for error correction information generated according to the processes described herein, i.e., a template representing positional error as a function of transport path position can be stored on non-transitory machine-readable media for temporary or permanent use, either on the same machine or for use on one or more other machines; for example, such data can be generated using a first machine, and then stored for transfer to a printer or manufacturing device, e.g., for download via the internet (or another network) or for manual transport (e.g., via a transport media such as a DVD or SSD) for use on another machine. A "raster" or "scan path" as used herein refers to a progression of motion of a printhead or camera relative to a substrate, i.e., it need not be linear or continuous in all embodiments. "Hardening," "solidifying," "processing" and/or "rendering" of a layer as that term is used herein refers to processes applied to deposited ink to convert that ink from a fluid form to a permanent structure of the thing being made; these terms are relative terms, e.g., the term "hardened" does not necessarily required that the finished layer be objectively "hard" as long as the finished form is "harder" than the liquid ink deposited by the printer. The term "permanent," as in a "permanent layer," refers to something intended for indefinite use (e.g., as contrasted with a manufacturing mask layer which is typically removed as part of the manufacturing process). Throughout this disclosure, various processes will be described, any of which can generally be implemented as instructional logic (e.g., as instructions stored on non-transitory machine-readable media or other software logic), as hardware logic, or as a combination of these things, depending on embodiment or specific design. "Module" as used herein refers to a structure dedicated to a specific function; for example, a "first module" to perform a first specific function and a "second module" to perform a second specific function, when used in the context of instructions (e.g., computer code) refer to mutually-exclusive code sets. When used in the context of mechanical or electromechanical structures (e.g., an "encryption module," the term "module" refers to a dedicated set of components which might include hardware and/or software). In all cases, the term "module" is used to refer to a specific structure for performing a function or operation that would be understood by one of ordinary skill in the art to which the subject matter pertains as a conventional structure used in the specific art (e.g., a software module or hardware module), and not as a generic placeholder or "means" for "any structure whatsoever" (e.g., "a team of oxen") for performing a recited function. "Electronic" when used to refer to a method of communication can also include audible, optical or other communication functions, e.g., in one embodiment, electronic transmission can encompass optical transmission of information (e.g., via an imaged, 2D bar code), which is digitized by a camera or sensor array, converted to an electronic digital signal, and then exchanged electronically. The terms "transducer" and/or "actuator" are used generally in an interchangeable manner, and without regard to the format or type of transducer or actuator; for example, a "voice coil" and a "piezoelectric transducer" are each examples of actuators/transducers.

Also, reference is made herein to a detection mechanism and to alignment marks or fiducials that are recognized on each substrate or as part of a printer platen or transport path or as part of a printhead. In many embodiments, the detection mechanism is an optical detection mechanism that uses a sensor array (e.g., a camera) to detect recognizable shapes or patterns on a substrate (and/or on a physical structure within the printer). Other embodiments are not predicated on a sensor array, for example, a line sensor can be used to sense fiducials as a substrate is loaded into or advanced within the printer. Note that some embodiments rely on dedicated patterns (e.g., special alignment marks) while others rely on recognizable optical features (including geometry of any previously deposited layers on a substrate or physical features in a printer or printhead), each of these being a "fiducial." When referring generally to "light," "optics" or "optical," in addition to using visible light, alternative embodiments can rely on ultraviolet or other nonvisible light, magnetic, radio frequency or other forms of electromagnetic radiation. Also note that some embodiments herein will be discussed with reference to a printhead, printheads or a printhead assembly, but it should be understood that the printing systems described herein can generally be used with one or more printheads; in one contemplated application, for example, an industrial printer features three printhead assemblies, each assembly having three separate printheads with mechanical mounting systems that permit positional and/or rotational adjustment, such that constituent printheads (e.g., of a printhead assembly) and/or printhead assemblies can be individually aligned with precision to a desired grid system. Various other terms will be defined below, or used in a manner in a manner apparent from context.

I. Introduction

FIGS. 1, 2A-2B and 3A-3E are used to introduce several techniques discussed in this disclosure and some of the problems these techniques address.

More specifically, FIG. 1 represents a prior art process 101 associated with some type of transport mechanism. In this specific example, it is assumed that there is a substrate 103 that is to be printed upon with droplets deposited at selected nodes of a print grid 105; the print grid 105 is illustrated as centered in the substrate to denote that in this position, it is indented that droplets of ink from the printhead will land at precise positions (i.e., at locations represented by nodes of the print grid) with predictability that translates to layer uniformity. Note however, that the print grid, while illustrated in this manner, is defined relative to the printer (not specifically the substrate) and extends to anywhere that printing can occur (e.g., the printable area can be larger than the substrate, and error in substrate position can potentially translate to error in droplet landing locations). Also, the spacings of vertical lines and horizontal lines are generally thought to be predictably spaced, however, this is typically based on an assumption that advancement along x and y transport paths are precisely accurate (and/or linear). Finally, note also that while a printer, substrate and print grid are exemplified here, these problems are not unique to printers and that techniques described herein can be applied to a wide variety of situations where something is to be mechanically transported, rotated or moved. The context of a printing process, a substrate and a print grid are to be used as a non-limiting, illustrative example to introduce problems and techniques described in this disclosure.

It is assumed that printing will occur as the substrate is generally transported as represented by arrows 104 and, further, that a conveyance system mechanism is to guide the substrate along a transport path 107; this transport path is illustrated in FIG. 1 as slightly crooked, representing in this example mechanical imperfections in the conveyance system (e.g., in some type of edge guide, track or traveler, or other means used to steer the substrate 103). Note that in a typical industrial printing process, such as for making OLED display panels as described earlier, the substrate might be on the order of two meters by three meters in size, whereas the nonlinearities in path 107 might be on the order of microns or even smaller. The crookedness (or other error) in path 107 as depicted in FIG. 1 is thus exaggerated for purposes of discussion and illustration. Whereas error of this scale might be inconsequential in many applications, in certain manufacturing processes (e.g., the manufacture of OLED displays and/or certain other electronic devices on large substrates), this type of error might limit achievable product size, lifetime, or quality. That is to say, the droplets generally speaking have to be deposited at precise positions so that they meld together and produce a homogeneous layer without leaving gaps or pinholes; the droplets upon landing spread only to a limited extent, and surface irregularity in the finished layer can limit achievable layer thinness and otherwise create quality issues. Even slight misposition of droplet landing locations can affect product quality and/or manufacturing reliability.

FIG. 1 as a figure is conceptually divided into two halves, including a left half and a right half. The left half of the figure shows the substrate 103 and a slightly crooked transport path 107. The substrate 103 is to be advanced back and forth along this path 107 in what is generally designated the "y" dimension, as referenced by arrows 104. Numeral 103 denotes that the substrate is at some point properly aligned with the print grid 105; the print grid as depicted in this FIG. is an abstraction where vertical lines represent the apparent paths of respective nozzles of a printhead as the printhead and substrate are moved relative to each other, while horizontal lines denote a digital firing signal or other ability of a nozzle to be recharged and fire repeated droplets of ink, i.e., the spacings of these horizontal lines typically represent "how fast" the nozzles can be fired. Perhaps otherwise stated, the print grid 105 has nodes, each of which represents an opportunity to eject a droplet of ink; as indicated earlier, it is desired to deposit ink in a manner that is precisely controlled as to position, and leaves no pinholes, which is in part achieved as a function of having precise knowledge as to where each droplet will land on the substrate. Note further that droplets are deposited at discrete positions, but are viscous and thus typically spread to form a continuous liquid coat having no gaps or irregularities; volume per unit area is generally correlated in advance with a desired thickness or other property of the final layer, and thus droplet densities and relative positions can in theory be selected in a manner (given expected droplet size) to produce the desired effect, e.g., to promote an even layer of desired thickness following spreading and melding of droplets (this is discussed in U.S. Pat. No. 8,995,022, which is incorporated by reference).

The print grid 105 is graphically depicted at the left-half of the FIG. in a manner "squared up" with the substrate 103, denoting that printing will general occur at desired droplet landing locations.

Unfortunately, the errors in the transport path 107 (i.e., the crookedness) can effectively distort the print grid 105, meaning that droplets do not necessarily land where they are supposed to relative to the substrate, because the substrate as it is advanced experiences fine positional and rotational error. The right hand side of FIG. 1 shows substrate translation and/or orientation error as the substrate is advanced from a first position do along the transport path 107, with the substrate position and yaw denoted by 103' relative to a (virtual) ideal "reference edge" 109, to a second position $d_1$ along the transport path, with the substrate position and yaw denoted by 103" relative to the reference edge 109. As seen, the substrate experiences, due to the errors (e.g., crookedness) in the transport path 107, offset and rotational error in multiple dimensions; the error in this example is seen to be horizontal and vertical offset $\Delta x_0$ and $\Delta y_0$, and angular offset $\Delta \theta_0$ within the xy plane when the substrate has been moved to the first position $d_0$, and different horizontal and vertical offset $\Delta x_1$ and $\Delta y_1$, and angular offset $\Delta \theta_1$ when the substrate has been advanced to the second transport path position $d_1$. Because the nature of these errors changes as the substrate is advanced, these errors distort the print grid, meaning that although a planned print process should (in theory) produce the desired layer properties, in fact, droplet deposition can be distorted, potentially creating quality issues. If left uncorrected, these various errors may create pinholes, thin zones and other imperfections and that limit the precision and/or quality achievable with the printing systems; once again, this may limit device size (e.g., it may be difficult to impossible to produce high quality miniaturized products or products that have better quality or resolution, such as very thin large area display screens). The effect of error of the type mentioned is to distort the print grid; for example, while the system and print planning might effectively assume a rectilinear print grid (105 in FIG. 1), "y"-error and/or jitter (i.e., parallel to the transport path) effectively distorts the separation between the horizontal lines of that print grid; similarly, "x"-dimension error and/or jitter effectively distort separation between the vertical lines of that print grid, with the consequence being error in deposition locations of the individual droplets. These types of errors might result in too little or too great fluid deposition in various pixel wells, or other non-uniformities, potentially leading to brightness and/or hue variation or other errors in a finished display—in the context of a "macroscopic layer" such as an encapsulation error that spans many electronic components, these types of errors can lead to layer non-uniformity and potentially compromise layer function.

Note that as illustrated in this example, the depicted errors in some cases may be simply a repeatable function of the transport path 107, i.e., because the transport path in this example is seen as curved, there is non-linear displacement in the x-dimension, non-linear displacement in the y-dimension, and nonlinear skew; other types of errors, such as z-dimensional error, pitch and roll, can also potentially occur on a repeatable basis but are not depicted in this particular FIG. Thus, in an application such as an industrial printer used to create fine (e.g., micron or smaller scale) electronic, optical, or other structures that rely on uniformity of the type mentioned, and where a series of substrates is to be printed on as part of an "assembly-line" style fabrication process, the same errors can potentially occur from substrate-to-substrate. There are also other potential sources of error which may be unique to a given substrate and/or which might represent changing conditions, for example, temperature variation.

While error affecting substrate travel has been illustrated, there are also potentially other sources of similar error that can affect device quality and/or process reliability. For example, a split-axis printer typically moves not only the substrate, but a printhead or camera, or other mechanical components. Briefly, in systems that move one or more printheads (generally in the "x" dimensions relative to FIG. 1), similar path error can result in "x," "y" rotational or other error in the printhead(s) (relative to the dimensions of FIG. 1). For example, if a printhead has error at different positions, such typically also has the effect of distorting the vertical lines of the print grid 105 (i.e., making them unevenly spaced). Similar analogies can be stated for other transport path analogies in an industrial printing system of the type referenced. It is generally desired to reduce the effects of these layers to improve predictability and reliability in layer fabrication and, generally, to have the ability to fabricate thinner, homogeneous layers.

Figure 2A:
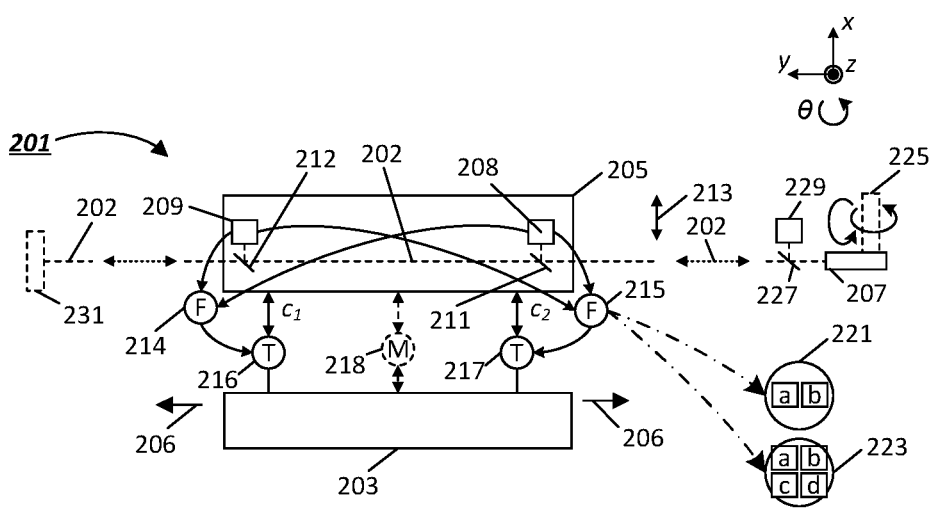
FIG. 2A is a schematic view of a system 201 that dynamically corrects for mechanical error. A first component 203 travels along a transport path 206 (generally aligned with the "y" axis in this example), and mirrors 211/212 and sensors 208/209 detect deviation from an optical guide 202 (e.g., a laser beam); during travel of the first component, transducers 216 and 217 are automatically driven in response to signals from sensors 208/209 to equalize the deviation (e.g., in one or more dimensions, such as x, z and/or $\theta$), such that a second component 205 follows an ideal path, notwithstanding the mechanical error.

To address these issues, one embodiment provides a transport path correction system that detects and negates one or more forms of path error. FIG. 2A shows an embodiment 201 that has two principal components, including a first, track-guided component 203 and a second, offsettable component 205. Both of these components are to move generally together in the general direction represented by arrows 206. In one implementation, these two components can be part of a vacuum gripper that is used to engage and advance a substrate along a "fast" axis; in another implementation, these two components can instead be part of a printhead traveler, for example, that travels a track and that mounts a printhead for use in printing droplets onto a substrate.

The depicted embodiment uses an optical source 207, which directs a beam of light 202 in a manner that will serve to guide or facilitate desired travel, in this case, perfectly straight travel that simulates a "virtual edge guide." In the depicted scheme, the optical source 207 is stationary and the beam 202 it emits is sensed by two optical detectors 208 and 209, both mounted to the second component. In addition, two beam splitters 211 and 212 are used to redirect light from the optical path to the detectors 208/209 in a manner that will be used to sense deviation of the second component from the optical path and to correct for that deviation. Note that the depicted structure is not required for all embodiments, e.g., specifically-contemplated variations feature the light source mounted to the second component with one or more beam-splitters and/or one or more detectors being stationary; other configurations are also possible and will occur to those having ordinary skill in the art.

To correct for path deviations, a signal from each of the detectors is fed to processing circuitry 214/215 as necessary, which applies a function "F" to those signals in order to develop correction signals that will be applied as feedback to correct for path deviation; while two sets of such circuitry are depicted, it is possible to use only one circuit (e.g., a software-driven processor) or to have significant overlap of circuit elements. The correction signals, in turn, are fed to one or more transducers "T" which immediately apply correction so as to "zero-out" deviation from the optical path; that is, advantageously, the processing circuitry and/or detectors produce signals which are "zero" (or do not cause further transducer adjustment) when the second component 205 is synched with the optical path and which always drive a return to zero when there is deviation from the optical path; note that this structure is not required for all embodiments. In the figure, the depicted embodiment is seen to rely on two transducers, specifically numbered 216 and 217; each of these transducers provides for a substantially linear throw in a direction orthogonal to the direction of transport. In this example the use of two transducers at respective points of interaction (c1/c2) between components 203 and 205 provide for common-mode and differential-mode control, to respectively offset component 205 linearly from the first component 203 (in the direction of arrows 213) and to provide for rotation of component 205 relative to component 203, as represented by the angular measure "0." The transducers can be any desired type of transducer suitable to the throws at-issue, including without limitation, piezoelectric transducers; in an embodiment where a substrate is supported by an air bearing (and the component 205 uses a vacuum gripper to engage the substrate), the transducers can advantageously be voice coils, which provide for relatively large maximum throws (e.g., from submicron to 100 microns or more) with a high degree of repeatability and reliability. The combination of common-mode and differential mode control over the transducers essentially provides for a floating pivot point between components 203 and 205 which can be offset generally in the "x" direction (note that the xyz coordinate labels seen in the figure are arbitrary in this example). To help provide mechanical structural support between components 203 and 205, in some embodiments, a mechanical linkage ("M") 218 can be used which constrains components 203 and 205 to move with each other in the "y" direction while at the same time permitting free offset between these components in the "x" direction and relative xy rotation. Such additional structural linkage can be especially advantageous where voice coils are used as the transducers, to help constrain any unnecessary loading on the transducers in directions orthogonal to a direction of transducer displacement. Numeral 221 provides additional detail relating to a detector, and shows a two cell design, with the cells being denoted by values "a" and "b;" briefly, in one design, light from the light source hits one or both of these sensors, and a difference between voltages produced by each of these sensors is used to straighten the second component 205 relative to the optical path. For example, in a two-cell design, the value "(a−b)/(a+b)" produces a positive or negative output in proportion to the amount of deviation from the midpoint of the two cells; such a signal alone can be used to drive the associated transducer to a position where the optical path is centered between the two cells. Note that in some embodiments, processing circuitry 214/215 can be combined with the detectors, e.g., purchased as a single unit that provides a digital or analog output representing disproportional signal sensed by each cell of the detector.

In some embodiments, it is possible to sense path deviation in more than one dimension, e.g., in each of x and z dimensions in connection with the depicted coordinate system. For detection of this deviation, a four-cell design can be used, represented by numeral 223 in the figure. For example, the value "[(a+c)−(b+d)]/(a+b+c+d)]" can be used to sense x dimensional deviation from the desired path, and the value [(a+b)−(c+d)]/(a+b+c+d)] ca be used to sense z dimensional deviation from the desired path. Note that a separate, second set of correction transducers (not seen in this figure) may be required, depending on implementation, to correct for errant motion in a second (or third, fourth, etc.) degree of freedom; the configuration of transducers is similar to that depicted already in FIG. 2A, except that the direction of transducers displacement can be, e.g., along the z dimension. Note both that the use of linear transducers is not required for all embodiments and, conversely, corrections can be made for one or more rotational degrees of freedom, for example, to levelize a surface or edge and correct for pitch, yaw and/or roll.

FIG. 2A also illustrates a few further optional components that may be used in some embodiments. First, numeral 225 refers to an adjustment mechanism that can be used to align and/or adjust the optical source 207. In one embodiment, the optical source is a laser and numeral 225 references a screw-based precision mount that changes the attitude and/ or yaw of the laser relative to the direction of transport. Second, numerals 227/229 refer to a beam splitter and detector that can be used for the same purpose, e.g., by mounting such a detector in a manner that is fixed relative to the optical source 207, the optical source can be periodically recalibrated (and adjusted, e.g., using adjustment mechanism 225) to ensure proper orientation. It is also possible to use a standard 231 at a far end of the optical path to assist with alignment and/or automatically provide feedback relating to proper orientation of the light source; in one embodiment, this standard can be a simple target or crosshairs (e.g., a laser is adjusted until its beam strikes center) and in another embodiment, this standard can be a detector/circuit that provides electronic feedback, e.g., permitting manual or automatic alignment of the light source.

Figure 2B:
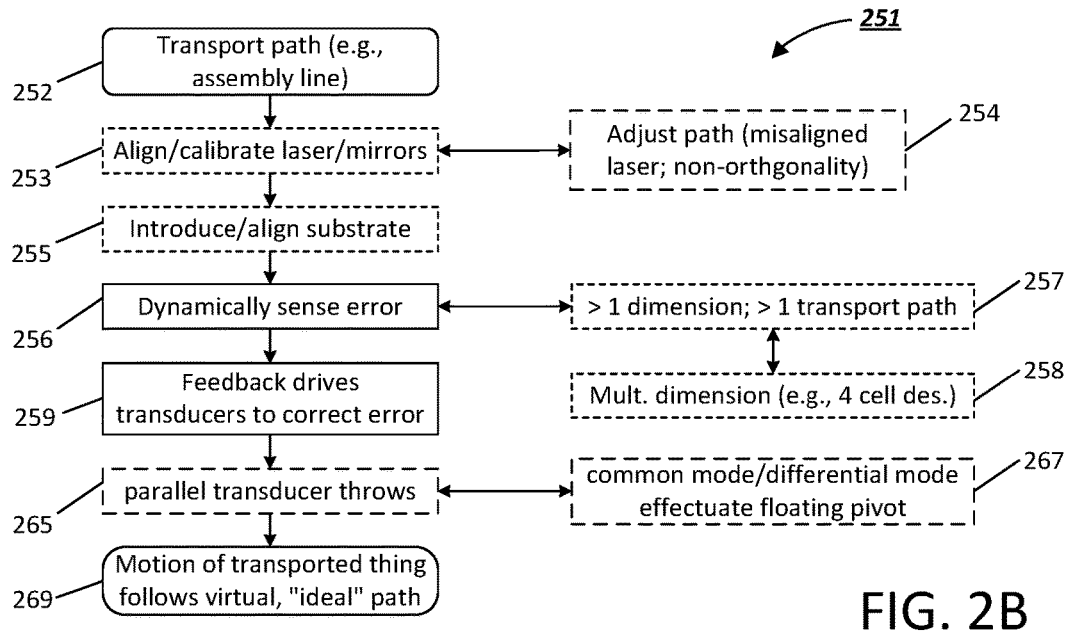
FIG. 2B is a flow chart associated with correcting positional and/or rotational error as a transported component is advanced along a transport path.

FIG. 2B is a flow chart that depicts method steps 251 that implement some of the techniques introduced above. As denoted by numeral 252, the method can be embodied in a manufacturing system having a transport path where it is desired to correct for fine motion, position or orientation error of a conveyance system; for example, a manufacturing system can perform high precision product "assembly-line-style" manufacturing using a printer for materials deposition, as introduced previously. Initially, alignment or calibration steps 253 can be performed to ensure that an optical beam is directed exactly as desired to mark straight travel; for example, as introduced previously, the optical beam can be used to image a stationary target with crosshairs and adjusted 254, either manually by a human operator or automatically based on electronic feedback, until the optical beam is incident with a reticle formed by the crosshairs. In a typical implementation, calibration can be performed at initial installation, at start-up, periodically (e.g., daily or weekly), at the occurrence of certain milestone events (e.g., detected error greater than a threshold, or temperature change greater than a threshold amount), or otherwise as desired. A series of substrates 255 is then sequentially introduced and aligned with the printer's coordinate reference system to ensure that individual panel products on those substrates are in a known position relative to the optical beam (e.g., as formed by a properly aligned laser); this process will be further discussed below, but in one embodiment, the combination of optical alignment marks for each transport path (e.g., position feedback for the gripper and printhead) and the use of two transducer-based error offset systems and associated optical paths effectively define a coordinate reference system for the printer and regulate motion in that coordinate reference system; each given substrate in the series can be individually aligned to this coordinate reference system by imaging fiducials on the given substrate and adjusting either the substrate position/orientation or the print recipe so that printing will occur on each panel exactly as desired. Printing then occurs on the aligned substrate; as each conveyance or transport system is operated, error (i.e., deviation from each marked optical path) is dynamically measured, per numeral 255, optionally for more than one transport path and/or one dimension per transport path, as indicated by numeral 257, and optionally using one error correction system to correct for multidimensional error (e.g., x and z deviation using a 4-cell detector design), per numeral 258. Dynamic corrections 259 are then applied as feedback to instantaneously correct error and to change the position and orientation of the "second component" relative to the first component, so as to drive deviation from the associated optical path to zero, i.e., such that the transported "thing" (e.g., substrate, camera, printhead or other element) travels the desired, perfectly straight path notwithstanding microscopic jitter that can still influence the conveyance system. As noted earlier, in one embodiment, position regulation along the direction of conveyance (e.g., in a direction parallel to an optical beam used as a guide) can be optionally assisted through the use of a position regulation system, for example, which measures marks on an adhesive tape proximate to the conveyance path, e.g., with alignment marks for every micron of travel along the transport path; the transducer-based correction system in such an embodiment is therefore relied upon to correct for path deviation which in a direction orthogonal to the direction of the marked optical path, as well as rotational deviation (e.g., optionally using two or more transducers, per numeral 265, and differential-mode control over the two or more transducers, per numeral 267). The result is that the thing being transported follows a virtual, ideal path, as referenced earlier and as identified by numeral 269.

Having introduced transducer-based correction and the use of an optical guide, applications to path error control will now be discussed, again in the exemplary context of an industrial split-axis printer environment.

Figure 3A:
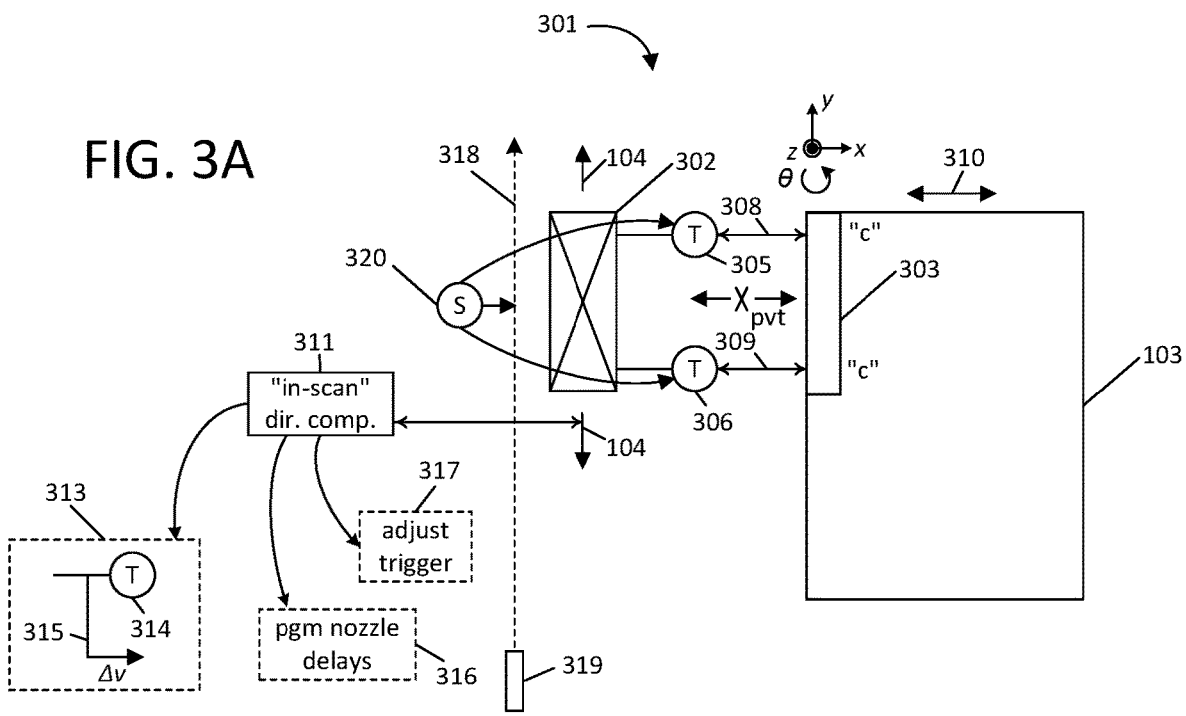
FIG. 3A is a schematic diagram showing one or more transducers that perform fine mechanical adjustments to correct for errors referenced in connection with FIG. 1 (i.e., in this example, as part of a "gripper" that advances the substrate); as noted, an optical guide such as a laser source 319 can be used to define a desired path, with deviation from this path being sensed by one or more sensors 320. One or more transducers "T" are driven as a function of this deviation, with the result that the substrate (in this example) travels a "perfectly straight" or "jitter free" transport path.

FIG. 3A shows an embodiment 301 for reducing conveyance path error in a gripper system that advances a substrate, such as the substrate 103 from FIG. 1. More specifically, it is once again assumed that the substrate is to be advanced back and forth along a path represented by arrows 104. In this example, the substrate will be advanced using a gripper; a first component 302 of the gripper will travel along path 107 (from FIG. 1), generally along a track extending in the "y"-dimension. The gripper also has two transducers (T), 305 and 306, which operatively connect the first component 302 with a second component 303, which engages an edge of the substrate. In one exemplary case, the substrate is supported on an air bearing above a floatation table to provide for nearly frictionless support; in other examples, other mechanisms can be used for support and transport. The two transducers each are controlled to displace the second component relative to the first component along a common direction (e.g., in an "x" dimension as illustrated in the FIG.), as represented by arrows 310. Each transducer can be independently controlled, leading to a situation where "common-mode" control offsets the second component linearly toward and away from the first component 302 in the x-dimension at the respective point of engagement, while "differential-mode" control pivots second component relative to the first about a pivot point "$X_{pvt}$." Because the transducers can be electronically driven in a manner having both common and differential drive components, the pivot point "$X_{pvt}$" is seen to be a floating pivot point; in some embodiments, this floating pivot point can be an abstract concept, while in others, a mechanical structure provides for pivot while also providing a structural coupling between the gripper's two components. Note that while this figure shows the gripper as engaging the substrate near its top-left corner, in a typical environment, it may be desired that the gripper engage the substrate midway along its length, e.g., to provide reciprocal moments for the transducers (e.g., to facilitate control over both common-mode and differential-mode displacement).

The first component 302 follows the error-encumbered path, 107 from FIG. 1, while the second component locks to the thing being transported (e.g., in this case, the substrate 103, e.g., using a vacuum) and is dynamically offset so as to follow a straight path. The transducers 305 and 306 are seen to be independently controllable to move the substrate as indicated by arrows 308 and 309, and are controlled in a manner so as to exactly negate x-dimension- and θ-rotation-induced error in the path 107, such that substrate motion tracks an ideal "reference edge" (see line 109 from FIG. 1). Note that in alternative designs, instead of having linear throws that are parallel to one another, transducer 305 could effectuate rotation while transducer 306 could effectuate a linear throw, or the transducers could be made to produce offsets in the "y" dimension or any other desired dimension, with corresponding effect of mitigating substrate position or rotation error. In FIG. 3A, the gripper's first component 302 moves along the "y" dimension, while the transducers 305 and 306 each push and pull the substrate along a linear range of motion along the "x" dimension, via contact at respect contact points "c." Again, each transducer in this example can be a linear motor, a piezoelectric transducer, a voice coil, or another type of transducer.

In the split-axis printing system of this example, the substrate is advanced in the "y" dimension relative to the printhead(s) for a particular "scan" or raster motion; the "y" dimension in this example therefore also forms the "in-scan" dimension. The printhead(s) are then moved in the "x" dimension to reposition the printhead(s) for an ensuing scan (i.e., in the "cross-scan" dimension); the substrate is then advanced in the reverse direction, for the ensuing scan, with successive scans continuing until the entire liquid coat has been created. The substrate can then be advanced (typically out of the printer, to another chamber), where the liquid coat is cured, dried or otherwise processed so as to convert the liquid coat to a permanent structure having desired electrical, optical and/or mechanical properties. The printing system is then ready to receive another substrate, for example, to perform similar printing on that ensuing substrate according to a common, predefined "recipe."

It was noted earlier that error along transport path 107 (from FIG. 1) can potentially lead to error in multiple dimensions, i.e., not just offset in the x dimension. With a conveyance system regulated for position (e.g., using alignment marks as referenced earlier), this can be less of a concern, but in other systems, variations in angle of that path might lead to nonlinearities in y-position of the substrate as well. In such an implementation, y-dimensional error can optionally be corrected using other forms of means 311 for correcting substrate motion in the "in-scan" dimension; options include for example, using a third transducer 314 to effectuate throws of the gripper's first and/or second components in the in-scan dimension, to normalize y-dimensional advancement of the substrate. In other embodiments, feedback can instead be used to adjust an electronic control signal 315 (e.g., as a feedback signal, delta signal, or electronic drive signal) for advancement of the gripper, to impart a slight velocity increase or decrease (Δv) to counteract y-dimensional error, or the gripper's motion can be caused to match positional markers as introduced above. In yet another optional embodiment, it is also possible to perform adjustments in software, for example, computing and programming individual, y-position dependent nozzle firing delays (as represented by box 316), i.e., the nozzles of the printhead can, in some embodiments, be "told" to print slightly earlier or later as the substrate and printhead(s) are moved relative to each other in the "y" dimension, in a manner that exactly cancels out "y" dimension positional error of the substrate relative to the printer. Also, per numeral 317, in another embodiment, it is possible to adjust a "trigger" signal used to time nozzle firing, to have the effect of shifting the horizontal lines of the print grid (see numeral 105 from FIG. 1) so as to cancel out positional error of the substrate relative to the printer. Note that "in-scan" or "y-axis" compensation of a gripper is not required for all embodiments.

FIG. 3A also shows an optical system used to define desired travel; as introduced earlier, an optical beam 318 is directed from a light source 319 (e.g., a laser) in the direction of travel (e.g., in this case, parallel to the y-dimension as referenced in the figure. At least one sensor or detector 320 is used to image this path and detect deviation from the optical beam 318 as the gripper and substrate move along their transport path. Advantageously, the at least one sensor or detector 320 is mounted in a manner fixed to the gripper's second component 303, such that as travel occurs, feedback signals derived from the sensor or detector 320 are used to reorient and displace the substrate in the x dimension and in xy orientation so that substrate motion exactly corresponds to the marked optical path (318), notwithstanding that motion of the gripper's first component continues to experience mechanical jitter. As noted earlier, in contemplated variations, the optical source 319 and sensor(s)/detector(s) 320 can be configured differently, for example, with the optical source 319 mounted to the gripper's second component 303, using beam splitter optics mounted to the gripper, and so forth; such design variations are well within the skill of one familiar with optics.

Reflecting on the subject matter of FIG. 3A, it should be observed that by using two or more transducers in a mechanical conveyance system, one can correct for errors in the transport path or other motion errors (e.g., for a non-linear guide or track or edge). Whereas path errors might exist as represented by numeral 107 in FIG. 1, the techniques and structures introduced above attempt to "live with" this repeatable error in the transport path (e.g., the gripper's first component 302 continues to travel this error-encumbered path), but the transducers effectuate throws or other corrections to equalize and/or negate this path error in at least one dimension, and thus the thing being moved (the substrate in this example) travels an idealized path, such as represented by numeral 109 in FIG. 1. In one embodiment, these motion corrections can be mechanically effectuated by two or more transducers, each having a linear throw parallel to one another and substantially orthogonal to a direction of conveyance (e.g., transducers 305 and 306, each independently controllable with a linear throw in a direction (e.g., 310) substantially orthogonal to a direction of arrows 104).

While these techniques can be applied to virtually any mechanical conveyance system, it was earlier-mentioned that one field that could benefit from these techniques relates to industrial printers where ink droplets have to be deposited at very precise positions. For example, one contemplated embodiment is as a printer used to fabricate light emitting devices, such as organic LED display devices (e.g., cell phone screens, HDTV screens, and other types of displays), and "panel" devices such as solar panels. In this regard, in the application discussed above (e.g., where a substrate meters wide and long is printed upon), a number of conventional systems rely on an air flotation table to advance the substrate during printing. The gas ingress and egress in such a system can be carefully controlled, to avoid imparting effects to the substrate (e.g., temperature, electrostatic charge buildup or other effects which might influence ink behavior) that could potentially produce defects in the finished layer. In other words, gas flow is used to create a fluidic bearing underneath the substrate, to create a substantially frictionless surface that the substrate is moved on during printing; the second component 303 from FIG. 3A in such an application can support a vacuum chuck that engages the substrate, or multiple vacuum locks that engage respective parts of the substrate. In such an application, in order to achieve the "micron-scale" (or smaller) throws used to negate non-linearities and provide for preside path advancement, the transducers 305 and 306 can advantageously be formed as voice coils which use compression and expansion (i.e., in a direction normal to a direction of force supported by the gas bearing of the floatation table) to effectuate the microscopic throws used to achieve precise printhead and nozzle alignment with the substrate. That is to say, for electronic flat panel fabrication in particular, and for OLED display device fabrication in particular, it has been found that (frictionless) flotation support and the use of a vacuum gripper is important to minimizing defects and maximizing device lifetime, and the use of voice coils as the transducers provide an effective component for providing the required throws in such a system. Other types of transducers, however, can also be used to achieve throws pertinent to the particular type of application, for example, through the use of piezoelectric transducers, linear motors or other types of transducers. In such a system, a floating, mechanical pivot mechanism can optionally be used in aid of the voice coils to provide structural linkage and mechanical support for error correction.

Figure 3B:
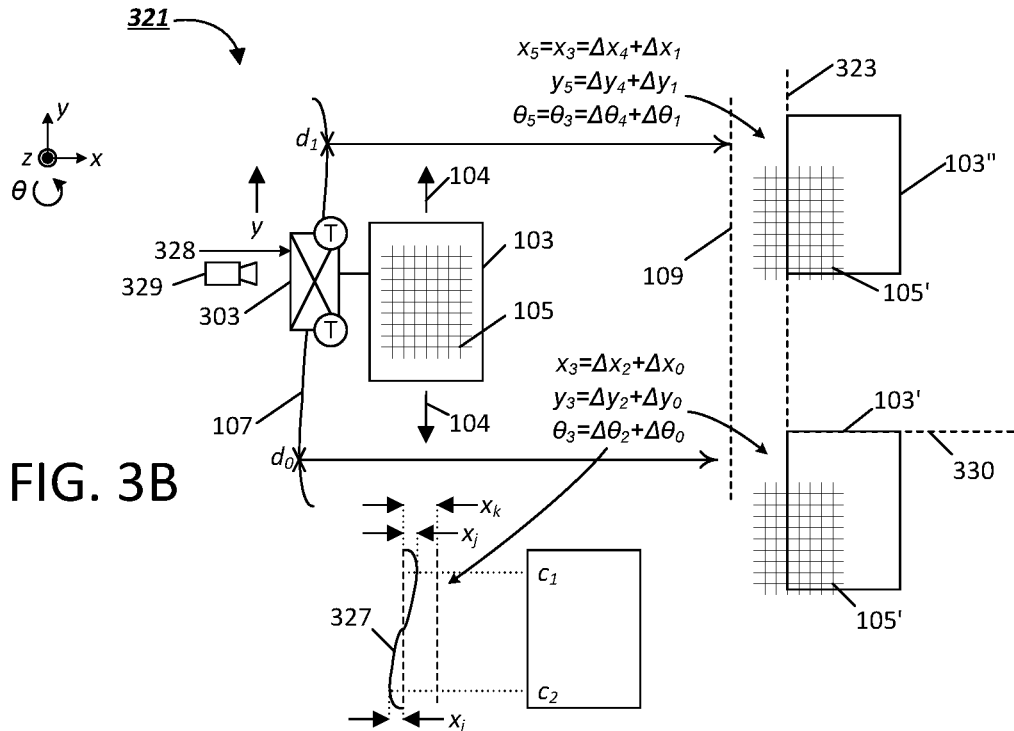
FIG. 3B depicts a transport path 107 having mechanical imperfections, just as with FIG. 1; however, in this case, transducers "T," such as introduced relative to FIG. 3A, are used to perform fine tuning adjustment for the substrate position and/or orientation as the gripper advances on the path 107. The result is that the substrate now moves according to "ideal" motion (e.g., a perfectly straight "ideal" edge and/or jitter free path), as represented by a virtual straight edge 323.

FIG. 3B provides a view 321 similar to the view of FIG. 1, but further illustrates ends attainable using the mechanism of FIG. 3A. More specifically, FIG. 3B shows the substrate 103 and gripper from FIG. 3A as they advance along the path 107. As with FIG. 1, the path 107 is once again assumed to have error manifested as some form of crookedness or variation; once again, this could be error in an edge guide, track or other mechanism—this error imparts positional and/or rotational error to the gripper. In this case, however, the gripper is seen as having transducers "T" which are controlled so as to counteract this error, e.g., in the form of voice coil displacements that compensate for or that equalize variations in the path 107. Note again that the magnitude of error is seen as greatly exaggerated relative to the scale of FIG. 3B, e.g., in practice, the path may be meters long (e.g., for a 3 meter long substrate is transported through a room-sized printer), while the crookedness may be on the order of micron or submicron in scale.

At position $d_0$ of the gripper along the path, it will be recalled from FIG. 1 that native transport path error was equivalent to $\Delta x_0$, $\Delta y_0$, and $\Delta \theta_0$. For the system of FIG. 3B, however, the transducers are actuated to displace and/or rotate the substrate, as seen at the lower right hand side of FIG. 3B and as designated by numeral 103'. That is, the transducers "T" displace the gripper's second component and the substrate relative to the gripper's first component and the track or edge guide 107 so as to have absolute position $x_3$, $y_3$ and $\theta_3$. In the context of FIG. 3B, the quantity $x_3$ represents an absolute x-position that effectively defines a virtual edge 323 offset from the error-encumbered transport path 107, the quantity $y_3$ corresponds to optional positioning offset of the substrate to offset it to an arbitrary "smoothed" or normalized advancement (330) relative to the in-scan (or transport) direction, and the quantity $\theta_3$ corresponds to a desired angular orientation of the substrate; for the example of FIG. 3B, it can be assumed for the moment that $y_3$ and $\theta_3$ are "zero," e.g., that the substrate is oriented so as to be exactly vertical (i.e., squared off relative to the flotation support table, without "y"-dimensional correction, though this need not be the case for all embodiments). In FIG. 3B, the print grid is depicted at numeral 105' to have a consistent x and $\theta$ relationship relative to the substrate 103'; as the substrate is advanced from position do to position $d_1$, the transducers are controlled so as to maintain this consistent positional relationship between the substrate and the vertical lines of the print grid, i.e., such that the substrate is aligned (notwithstanding error along the path 107) to have absolute position $x_3$ and $\theta_3$, and is thus depicted at 103" as having exactly this relationship relative to the print grid at 105". Note that in these examples, although the print grid is illustrated as maintaining a predetermined relationship relative to the substrate, the print grid is defined by the printhead positioning and substrate and printhead conveyance systems, and what is really desired is that the printhead and substrate conveyance mechanism maintain a consistent, predetermined relationship relative to each other, and that a coordinate system established by this linkage be precisely aligned relative to each product being fabricated; in some embodiments, a printer coordinate reference system is first calibrated (and regulated), so as to effectively define the print grid, and each the substrate (or a product being fabricated thereon) is thereafter specially aligned relative to the print grid as it is introduced (i.e., to the printer), via a per-product or per-substrate alignment process—this will be further exemplified below.

Equations are depicted at various positions in the FIG. to indicate how a constant positional relationship is maintained. More specifically, it will be recalled that native, repeatable error in the transport path 107 at position do equated to positional and rotational offsets of $\Delta x_0$, $\Delta y_0$, and $\Delta \theta_0$. The transducers "T" are therefore controlled so as to add further offsets of $\Delta x_2$, $\Delta y_2$, and $\Delta \theta_2$, where these values are applied as a function of detected error at position do along the transport path. That is, in one embodiment, these values are the negative of the error $\Delta x_0$, $\Delta y_0$, and $\Delta \theta_0$, i.e., they exactly cancel the error and optionally offset the substrate to some predetermined x/y/θ value. In one embodiment, the depicted transducers "T" only correct the substrate position in x and $\theta$ (e.g., any "y" dimensional correction is optionally effectuated using a position feedback/regulation system, such as previously described). Note how, at position $d_1$, the transducers are controlled so as to add different offset as a function of different error at position on the transport path 107, i.e., to add offsets of $\Delta x_4$, $\Delta y_4$, and $\Delta \theta_4$. As depicted in FIG. 3B, values $x_5$ and $\theta_5$ can be exactly equal to values $x_3$ and $\theta_3$, though once again, this need not be the case for all embodiments.

Positional control at micron scale or better in many respects is less intuitive than it might seem, e.g., in one embodiment, each of the gripper conveyance system and the printhead conveyance system mounts a camera, which is used to find a common alignment mark and thereby establish a origin for a coordinate system matching the two transport paths. This process, and the conveyance systems for each of the printhead(s) and substrate in such a system, effectively define the printer's coordinate reference system (and in large part determine configuration of a print grid according to which droplets can be deposited). U.S. Provisional Patent Application No. 62/459,402, incorporated earlier by reference, provides information relating to the use of these cameras, position detection, and related calibration; basically stated, in addition to finding a common coordinate (or "origin") point in one disclosed system, each conveyance system uses an optical tape and optical sensor to provide precise (e.g., micron-by-micron) position detection and feedback, such that the conveyance system (e.g., first component of the gripper) "knows" exactly where it is relative to the printer's coordinate system, and these various components cooperate to effectively define a complete printer coordinate system; indeed, the use of such a system can obviate the need for component offset in the direction of transport, e.g., the gripper is simply driven to the specific, appropriate position value in the direction of transport.

Once the "origin point" is established by the referenced camera-alignment process, the two conveyance systems are articulated to determine relative coordinates between each conveyance system's camera and a reference point of the conveyance system (e.g., corresponding to a printhead nozzle position for example), and this then permits a precise identification of any point relative to the printer's coordinate system, assuming a correct understanding as to the relationship (e.g., orthogonality) between coordinate axes. As noted earlier, in such a system, the printer's "understanding" of droplet landing locations is dependent on the print grid, which in turn is defined by this coordinate system; transport path motion error in such a system, if left uncorrected, could potentially lead to a situation where a particular print grid location (e.g., associated with an understanding of combined specific gripper/printhead position) deviates from actual position of these components. By correcting transport path error in the manners described herein, using the various devices described herein, this permits the system to correct for that path error such that a substrate and printhead are each positioned in a manner corresponding to print grid assumptions. In fact, as noted elsewhere herein, even errors such as minor non-orthogonality between the transport paths can be corrected using optional rotational offsets (e.g., non-zero values for $\theta_3$ and $\theta_5$) and/or, as previously mentioned, by adjusting optical guides (e.g., optical beams for one or more transport paths) to correct for non-orthogonality in the transport paths.

Continuing with the example provided by FIG. 3B, each substrate that is then introduced into the system has one or more fiducials that are identified and used to precisely understand position of the substrate (or a panel product thereon) during printing; as each substrate is introduced, its fiducials are detected (e.g., using one or more of the cameras), and a mechanical system can be used to properly orient/align the substrate so as to correspond to an expected position (note that this process is not necessary for all embodiments, e.g., it is also possible to adjust printer control information, i.e., by modifying the print recipe and/or firing triggers or particulars to accommodate known substrate misalignment or disorientation).

The bottom portion of FIG. 3B shows how two linear transducers (e.g., voice coils) on the gripper are driven to correct for rotational error as well as positionally offset the substrate in a manner corresponding to an idealized edge (e.g., via displacement in the "x" dimension). More specifically, a localized portion of the transport path is designated by numeral 327 as having a fair amount of curvature, which deviates from an idealized straight edge 109 of the transport path. At two effective contact points between the substrate and the transport path (designated "$c_1$" and "$c_2$," respectively), this error is respectively assumed to be "$x_i$" (depicted as a offset relative to the idealized straight edge in a negative direction) and "$x_j$" (depicted as an offset relative to the idealized straight edge in a positive direction); here, it is assumed that it is desired to precisely position a left edge of the substrate (or a printable area of the substrate) at absolute position "$x_k$" from the idealized transport path (e.g., corresponding to depicted virtual edge 323); numeral 105' denotes a slight offset of the print grid so as to accommodate the entire range of "x" positional error imparted by the system and optionally provide some slight buffer. To effectuate this correction, the positive error at position "$c_1$" (i.e., $x_i$) is further offset by an amount of "$x_k-|x_i|$," while the negative error at position "$c_2$" (i.e., $x_j$) is further offset by an amount of "$x_k+|x_j|$." The two depicted transducers "T" are controlled to this end and so straighten the substrate relative to the idealized straight edge; similar corrections are performed at all other times during movement of the gripper along the transport path 107 in dependent on error at the pertinent position, i.e., such that the substrate follows the virtual path associated with absolute position "$x_k$."

Several points should be noted relative to this discussion. First, although the gripper is depicted in this FIG. as a single unit, in fact, it can consist of many parts (e.g., the aforementioned first and second components, or as a distributed series of 2, 3, 5 or another number of grippers or gripper components that engage the substrate at different locations). Second, while in this embodiment, the two transducers are depicted as parallel linear actuators (e.g., each a voice coil or piezoelectric transducer), this is not required for all embodiments. That is, depending on embodiment, the transducers "T" can be coupled in series, and can be rotational, linear or other types of actuators; in still other embodiments, more than or fewer than two transducers can be used. Third, as noted above, a variety of mechanisms exist to identify position along the transport path, for example, a signal (e.g., drive signal, timing signal, etc.) can be used for this purpose, as denoted by numeral 328, or a position sensor 329 (such as a camera) can be used; in one specifically contemplated embodiment, as referenced above and discussed in U.S. Provisional Patent Application No. 62/459,402, a position marking system and position detector is used for each conveyance path, to measure and/or regulate associated position (e.g., for printhead transport and substrate transport). Clearly, many alternatives are possible.

Figure 3C:
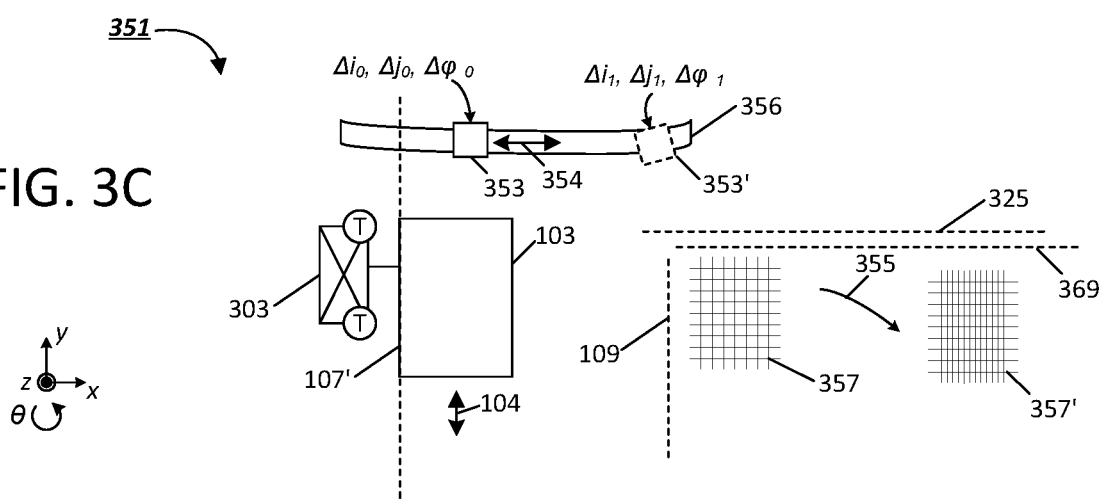
FIG. 3C is similar to FIG. 3B, in that it shows use of transducers "T" to correct for transport path error. However, in this case, error also potentially arises from a second transport path 356, in this case, manifested as the non-ideal position or orientation of a printhead (or camera or other assembly) as it is transported in the general direction of arrows 354.

As referenced earlier, a fabrication apparatus or system can have multiple conveyance paths; in the context of a split-axis printer, in one embodiment as referenced earlier, a printer coordinate reference system can be defined in dependence on separate printhead and substrate transport paths. FIG. 3C is used to discuss positional error stemming from inaccuracies in a second transport path such as the printhead transport path. Such a context is generally depicted by numeral 351 in FIG. 3C. A substrate is advanced by a gripper in a first dimension (i.e., using one conveyance system, as represented by arrows 104) and a printhead is advanced along a second transport path 356 in a second dimension (i.e., using another conveyance system, as represented by arrows 354). At a first position 353 of the printhead along a transport path associated with the latter conveyance system, the printhead experiences error of $\Delta i_0$, $\Delta j_0$, and $\Delta \varphi_0$; note that the variables i, j and $\varphi$ represent x and y offsets (and angular rotation in the xy plane), but that i, j and $\varphi$ are used instead of x, y and $\theta$ to distinguish this example from that of the gripper conveyance system. As denoted in phantom lines at the right side of the FIG., as the printhead is advanced to position 353', the error is $\Delta i_1$, $\Delta j_1$, and $\Delta \varphi_1$. Once again, this error is a function of position along the transport path 356, with change in error potentially being linear or non-linear. If left uncorrected, this error could also distort printing and create the manufacturing precision issues as referenced earlier. Note that in this example, it is assumed that any motion of the substrate 103 relative to the gripper's transport path is corrected using the depicted gripper (and its transducers "T"), but the issue is that the printhead traveler also might create error, resulting in x, y or $\theta$ error of the printhead, and which changes the expected landing positions of droplets ejected from nozzles of the printhead. The effects of these errors are exemplified relative to an intended print grid 357 as indicated by arrow 355, i.e., the effect of unintended printhead rotation (and/or unintended "x"-dimensional displacement) is seen via distorted print grid 257' (in analogous fashion, unintended printhead rotation displacement in the "y"-dimension would effectively result in a 'squeezing together' of vertical print grid lines).

In the context of the FIG., it is also desired that the printhead experience ideal motion, that is, motion uncharacterized by unintended mechanical error. That is to say, in this example, it is desired that the printhead also follow a virtual, ideal (e.g., straight) transport path 325, such as will effectively correspond to an unperturbed print grid (e.g., denoted by numeral 357); this is achieved in one embodiment by causing the transported object (i.e., the printhead) to follow both virtual, "ideal" gripper motion, denoted by vertical line 109, as well as virtual, "ideal" printhead motion, represented by horizontal line 325.

In a manner much the same as with gripper path correction, a conveyance system for the printhead transport path can optionally also use an optical guide (e.g., a laser source and associated optics/detection system) and a set of transducers to facilitate idealized printhead positioning; to this effect, responsive to dynamically-sensed error the transducers advantageously provide displacement to an arbitrary "absolute" position that accommodates the entire range of "y" positional error of the printhead optionally provide some slight buffer, such that the printhead motion corresponds to a virtual path 369 that also provides a fixed, known position corresponding to the "offset" print grid (105' from FIG. 3B).

Figure 3D:
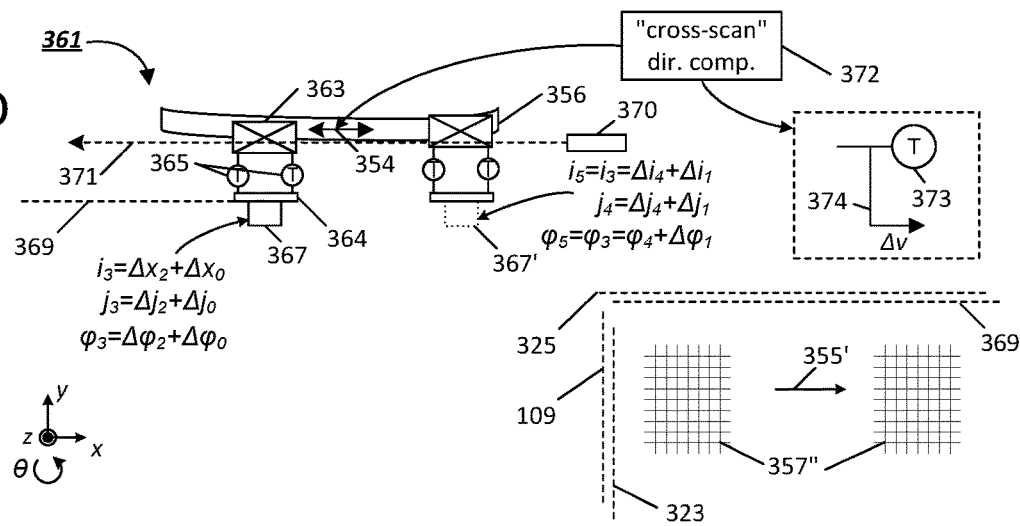
FIG. 3D is similar to FIG. 3C in that it depicts motion of a printhead along an edge or track 356 but, as illustrated, a printhead assembly now also has its own optical guide 371 and transducer assembly(ies) to provide for fine tuning positional and rotational corrections that mitigate error in the edge or track 356; the result is that the printhead now also effectively travels a virtual "ideal" path 325 (or 369, as will be discussed below).

FIG. 3D provides an illustration 361 of a system intended to redress this type of error. That is, FIG. 3D shows a second transport path 356 used to support lateral motion of one or more printheads, in the general direction indicated by arrows 354. A printhead assembly includes a first "track guided" component 363, which rides along the transport path 356 (e.g., along a track or guide), and a second, offsettable component 364, which mounts the printhead(s). These first and second components are once again operatively coupled by one or more transducers 365. The transducers in this example are each linear actuators which support microthrows that offset the second component in the "y" dimension (and/or "z" dimension), with common-mode and differential mode drive once again being used to selectively effectuate linear displacement and/or xy plane rotation ($\theta$). As denoted by both numeral 367 and numeral 367' (each representing the printhead(s) at respective positions along the "cross-scan" or "x" dimension), correction permits the printhead(s) to follow a virtual ideal path 369 uncharacterized by mechanical error (i.e., even though the first component 363 continues to travel the error-encumbered second transport path 356). An optical source 370 is once again positioned to direct an optical beam 371 so as to detect and correct for jitter in a dimension orthogonal to the direction of the optical beam; note that, depending on design (and size and/or available space on the printhead assembly), it may be desired to have the second component 364 mount the optical source and detect beam deviation relative to stationary detector and/or optics (not shown in the FIG.) rather than detect motion of the detector and/or optics relative to a stationary beam. Just as was the case with the gripper embodiment, the transducers of FIG. 3D can be controlled to offset the printhead to an absolute y position (i.e., corresponding to line 369) such that when the printhead is at position 367, the aforementioned error of $\Delta i_0$, $\Delta j_0$, and $\Delta \varphi_0$ is further offset by $\Delta i_2$, $\Delta j_2$, and $\Delta \varphi_2$, and such that when the printhead is at position 367', the transducers are controlled to offset the printhead to add offset $\Delta i_4$, $\Delta j_4$, and $\Delta \varphi_4$; i and $\varphi$ typically have a constant value at position 367 and position 367' and are both also typically zero, but again, this is not required for all embodiments. Just as with the prior gripper example, the depicted transducer configuration is exemplary only, and different transducers (e.g., rotational transducers) can be used, and can be applied to different conveyance systems and/or dimensions. Further, just as with the prior example, the depicted transducers in this embodiment offset the printheads using both common and differential mode control to effectuate a floating pivot point; the result is that a desired "error free" transport path 325 is offset to an arbitrary position 369, sufficient to encompass any "y" or in-scan dimensional jitter which is attributable to imperfections in the second transport path 356. As indicated by numeral 355', the result of these dynamically-applied corrections (and the optional use of gripper corrections as referenced earlier) effectively normalizes the print grid, as indicated by numeral 357". Note that as referenced by function box 372, it is also possible to use another transducer 373 or to use drive signal correction techniques 374 and/or position feedback/regulation techniques, as discussed earlier, to offset position of part or all of the printhead assembly to correct cross-scan positional error.

Reflecting on the principles discussed thus far, correction of each of the substrate path to a "virtual," straight edge, and the printhead path to a "virtual," straight edge, permits both of the substrate and the printhead to be placed in a manner so as to conform to print grid assumptions (e.g., to the printer's coordinate reference system) notwithstanding fine error imparted by the mechanical systems. These techniques may optionally be combined with drive control techniques (or other described techniques to correct each transported thing along its dimension of transport) to further improve system accuracy. Once again, these techniques can also be extended to other motion dimensions and fabrication and/or mechanical systems as well.

Figure 3E:
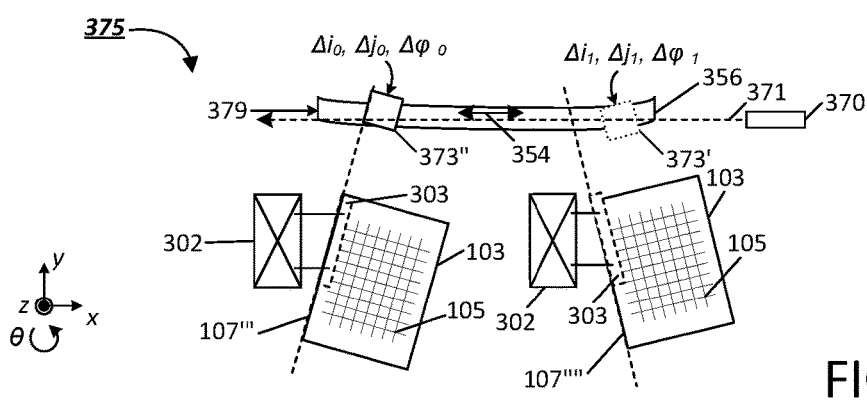
FIG. 3E is similar to FIG. 3C in that it depicts motion of a printhead along an edge or track 356; however, although the printhead transport path has an optical guide, corrections to match printhead jitter are instead applied by a transducer-based error correction system associated with another transport path, in this case, transducers associated with the gripper.

FIG. 3E presents another example 375, namely, an alternative embodiment where error in one transport path can be corrected using one or more transducers "T" associated with a second transport path. In this case, it can be assumed that a gripper assembly includes two linear transducers that are controlled once again in common and differential modes to effectuate cross-scan offset and rotational correction without a fixed pivot point. Note that in the case of this FIG., errors are once again micron or nanometer scale; the depicted angles and offsets are thus greatly exaggerated in the FIG. to assist with description. In this case, the FIG. shows icons for "two grippers," although in reality these represent exactly the same gripper and position of the gripper along the "in-scan" dimension for two respective scans; in this case, however, one of the conveyance paths (i.e., path 356, for the printhead assembly) does not have its own transducer-based error correction system (or, as an option, it does have such a system but the depiction corresponds to an implementation where the gripper's error correction system will be further driven to correct for coordinate axis non-orthogonality). The gripper's error correction system is thus controlled in this example to also correct for printhead conveyance path jitter which is orthogonal to optical beam 371, or for non-orthogonality between the transport paths; that is to say, detected deviation in the printhead conveyance path (or non-orthogonality) is corrected in this example by adding addition mitigating offsets into the gripper's second component 303, e.g., by combining deviations/error corrections from desired paths of multiple conveyance systems. In this embodiment, it should therefore be assumed that the two grippers represent two alternate sets of transducer control signals that respectively correct for printhead system error (or non-orthogonality) $\{\Delta i_0, \Delta j_0, \text{ and } \Delta \varphi_0\}$ at printhead position 373' and printhead system error (or non-orthogonality) $\{\Delta i_1, \Delta j_1, \text{ and } \Delta \varphi_1\}$ at printhead position 373" (i.e., corresponding to respective scans). That is, even though it was assumed in connection with FIG. 3B that gripper transport in the "y" dimension had been corrected to an ideal edge (relating to the gripper transport path), through the use of mitigating offsets and angles provided by the gripper systems' transducers, in one embodiment, one may also correct for errors in the printhead path (or other errors) using these same transducers. As depicted, further offset and/or rotations are added so as to effectively reposition the substrate so as to have the intended position and orientation relative to the printhead (e.g., to produce motion in a way that matches printhead error, as denoted by alternate transformed edges 107''' and 107''''). Other error correction techniques can also be applied to enhance these processes.

As the forgoing discussion implies, while the previous examples show correction of error in one or two transport paths, the principles described in reference to FIG. 3E can be applied to correct for fine error in any number of transport paths, e.g., one, two, three, four, five and so forth, with corrections for multiple transport paths being applied to a single drive path (e.g., to transducers used for substrate conveyance) or to correct errors in a first number of transport paths via mitigating corrections applied to a second, fewer number of transport paths. As noted, this discussion also applies to correction of non-orthogonality, e.g., where the gripper and printhead transport paths are not exactly at ninety degrees separation; this can be treated as equivalent to a case of measured printhead x-position-dependent error, with corresponding corrections applied by offsetting a transported component in either conveyance system. Note also, while the term "transport path" is exemplified in the figures as positional change along a curvilinear path, the principles discussed above and fine error correction procedures can also be applied to correct for fine error in any dimension, i.e., including rotation and accurate angular orientation—for example, in an embodiment where a mechanism is rotated, it is possible to measure "jitter" in angular rate of change or orientation, and to use transducers and/or drive signal correction as exemplified above to correct for such fine error. Finally, while FIG. 3E shows the factoring of printhead transport path error (or other non-gripper error) into gripper corrections, it is of contemplated that these various transport paths are interchangeable, e.g., gripper system positional error can be corrected for using printhead system error-correction transducers.

Figure 3F:
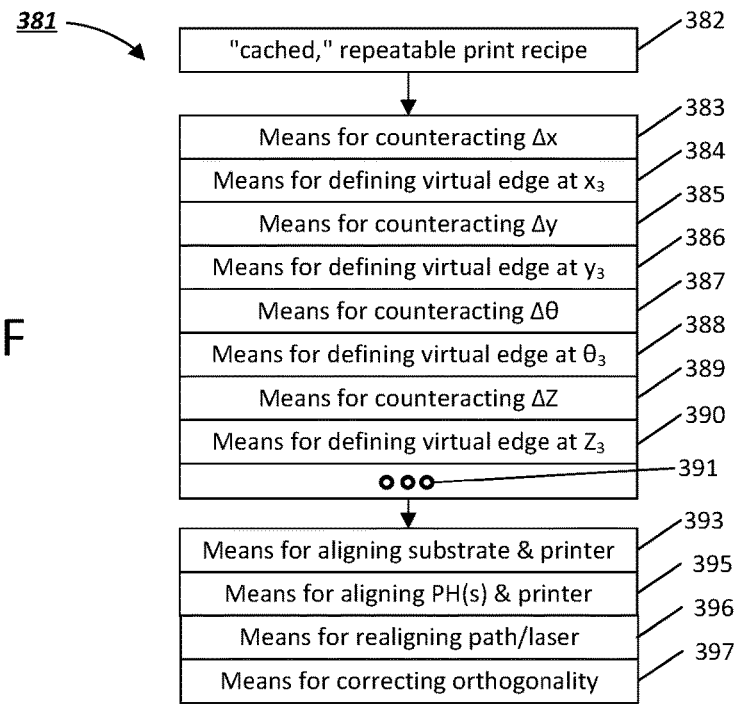
FIG. 3F is an illustrative diagram showing a mechanism for correcting for transport path error, for example, by performing compensating countermotions (or other error mitigation) in up to six different degrees of freedom (e.g., potentially including three translational degrees of freedom, as well as yaw, pitch and/or roll).

FIG. 3F indicates the techniques presented above can be embodied in many different forms to correct transport path error, as denoted generally by numeral 381. In the context of a printer for manufacturing applications, a print recipe can be stored or cached in advance in a manner that will be used to repeatably print, e.g., on many substrates on a successive basis as part of an assembly-line-style process, as indicated by numeral 382. As non-limiting examples, the techniques described herein can then be applied to correct for fine motion errors along paths associated with motion of the substrate, motion of one or more printheads or printhead assemblies, motion of a camera assembly or inspection tool, and so forth. Note that one advantage of a system that is designed to drive error to zero is that the effects of various other environmental variables such as temperature can be largely disregarded in terms of error correction—path deviation, whatever the temperature, drives path corrections so that position and orientation during transport exactly conform to the motion of the optical beam or guide. These techniques permit automated correction of motion along these transport paths for fine error, such that motion of the substrate (or optionally, any of these systems) is made to correspond to an ideal path, notwithstanding that the actual transport drive mechanism (e.g., motion of a gripper, edge guide, traveler, etc.) is still encumbered by path error which imparts unintended offsets, non-linearities and other errors. Generally speaking, correction is done by a subsystem independent of the print recipe, in a manner that permits print planning to assume that the substrate is ideally placed. For example, the structures described herein in one embodiment provide means for counteracting an error or unintended offset "$\Delta x$" in a first dimension relative to a transport path, where the first dimension is independent from the transport path (meaning it includes at least one component orthogonal thereto). Such means can comprise at least one transducer that is controlled as a function of transport path position to reduce or eliminate "$\Delta x$," as denoted by numeral 383 in FIG. 3F. Such means generally comprises transducers that are electronically controlled to effectuate positional displacement as a function of dynamic error that varies according to position along the transport path, and/or other factors. As represented by numeral 384, these structures (or a different, potentially overlapping set of structures) can provide means for defining a virtual edge at a specific, arbitrary position in the first dimension (e.g., at "$x_3$" in the embodiment from FIG. 3F) and offsetting a gripper component relative to the transport path (or a structure being transported) to such position; as before, such means also generally comprises transducers and associated hardware and/or instructional logic that causes the transducers to negate or equalize error. Per numeral 385, in another embodiment, the structures described herein provide means for counteracting an error "$\Delta y$" in a second dimension relative to the transport path; this second dimension is optionally independent from the transport path, but it can also (instead) represent a common dimension to the transport path or otherwise be generally synonymous with the transport path. Such means can optionally comprise at least one transducer that is controlled as a function of transport path position (and/or other factors) to reduce or eliminate "$\Delta y$" such as, for example, by correcting position of a transported "thing" for the embodiment depicted above, or for otherwise adjusting velocity or motion along the transport path, or using a position feedback system as referenced earlier. In yet another variation, per numeral 386, the same structures that might be applied to counteract "$\Delta y$" can provide means for defining a virtual edge at a specific (absolute or relative) position in the second dimension (e.g., at a non-zero "$y_3$," relative to the embodiment above) and offsetting the transport path (or a structure being transported) to such position; such means also generally comprises transducers and logic to cause the transducers to effectuate positional displacement as a function of dynamically-sensed error as an object is advanced along the transport path. In one embodiment, this means can encompass another transport path or associated error correction system, e.g., an error correction system associated with printhead transport (e.g., so as to compensate for nozzle firing times, substrate, printhead or other positional error, or other sources of error. In yet another embodiment (387), transducers similar to those discussed above can be applied to counteract rotational error ($\Delta \theta$); in one embodiment, this means can comprise a single transducer that converts electrical energy to structural rotation and, in other embodiments, two or more positional transducers can be applied to the same effect. For example, as discussed above, one implementation can use two voice coils, each a linear transducer, that when operated independently provide for rotational adjustment of the thing being transported, with a floating, mechanical pivot mechanism used to provide structural rigidity in support of the voice coils. These structures (or a different, potentially overlapping set of structures) can also provide means for defining (388) a virtual edge at a specific (absolute or relative) angular relationship relative to the first and second dimensions discussed above (e.g., at "$\theta_3$," in the embodiment above) and for offsetting the transport path (or a structure being transported) in a manner corresponding to such an orientation. In still another embodiment (389), structures described herein provide means for counteracting an offset "$\Delta z$" in a third dimension relative to a transport path, where the third dimension is optionally independent from the transport path, as well as the first and second dimensions referenced above. Such means once again can comprise at least one transducer that is controlled by hardware and/or software logic as a function of dynamically measured error to reduce or eliminate that error; transducers and supporting logic can also be used to define a virtual edge at $Z_3$ (390). Per numeral 391 and an associated set of ellipses, these techniques can be applied to a multitude of degrees of freedom including correction of and/or offset in any of three positional dimensions and any of three rotational dimensions (i.e., yaw, pitch and/or roll). In some embodiments, as represented by numeral 393, means for correcting for misalignment can be applied to align a substrate to the printer's coordinate reference system;

such means can include position sensor such as a camera, a handler or other transport device, a processor and associated support instructional and/or hardware logic that repositions the substrate relative to desired printing (or conversely, adjusts printing to match a mal-aligned substrate). Per numeral 395, means for correcting error in and/or aligning a printhead (PH) can include transducers with support for a floating pivot point and/or common and differential correction modes, as referenced above. Per numeral 396, the system can also comprise means for realigning or adjusting the optical source (e.g., by adjusting attitude and yaw of the laser), so as to provide for a calibrated path and/or printer coordinate reference system. A system can also include means (397) for correcting (non)-orthogonality of the coordinate reference system.

It should be noted that each of the referenced dimensional references, e.g., to the "x", "y", "θ" or other dimensions is arbitrary, that is, these can refer to any dimension and are not limited to Cartesian, angular, regular or rectilinear coordinates; in one embodiment, the "x" and "y" dimensions respectively correspond to the "cross-scan" and "in-scan" dimensions of a fabrication system, but this need not be the case for all embodiments.

By correcting for motion error in such a manner, the described processes provide for a "virtual" and/or ideal and/or straight transport path, notwithstanding that a mechanical motion system might still be encumbered, and might continue to track existent, repeatable flaws. Applied in the context of a manufacturing system, such as the aforementioned industrial printers, these techniques provide a powerful tool to enable precision positioning and manufacturing.

Figure 4A:
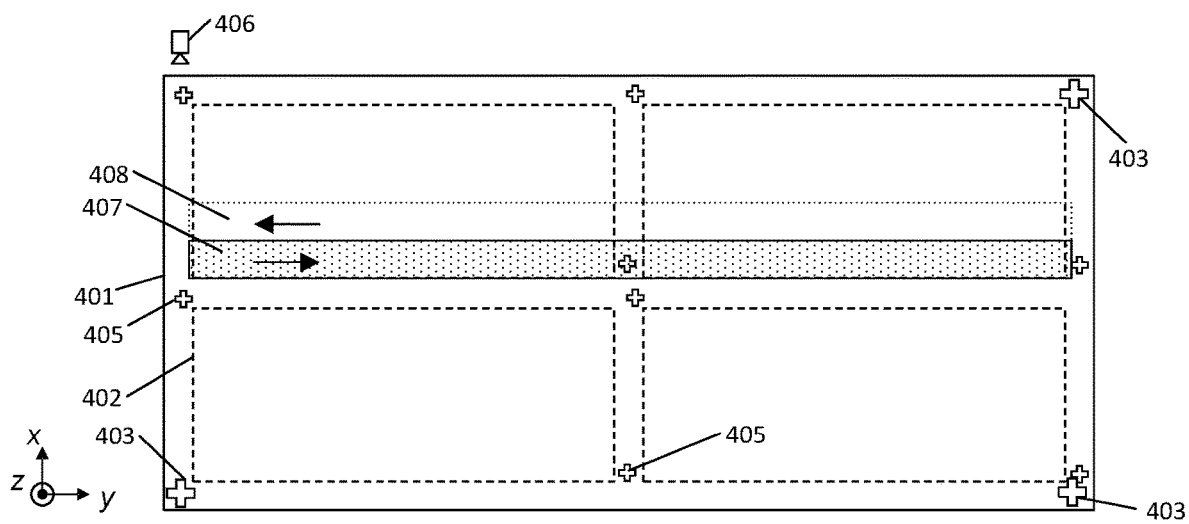
FIG. 4A provides a plan view of a substrate, and shows a raster or scanning process; a shaded area 407 represents a single scan path, while a clear area 408 represents another. As indicated by a dimensional legend in the FIG., in this example, an "x" axis corresponds to a cross-scan dimension while a "y" axis corresponds to an in-scan dimension.
Figure 4B:
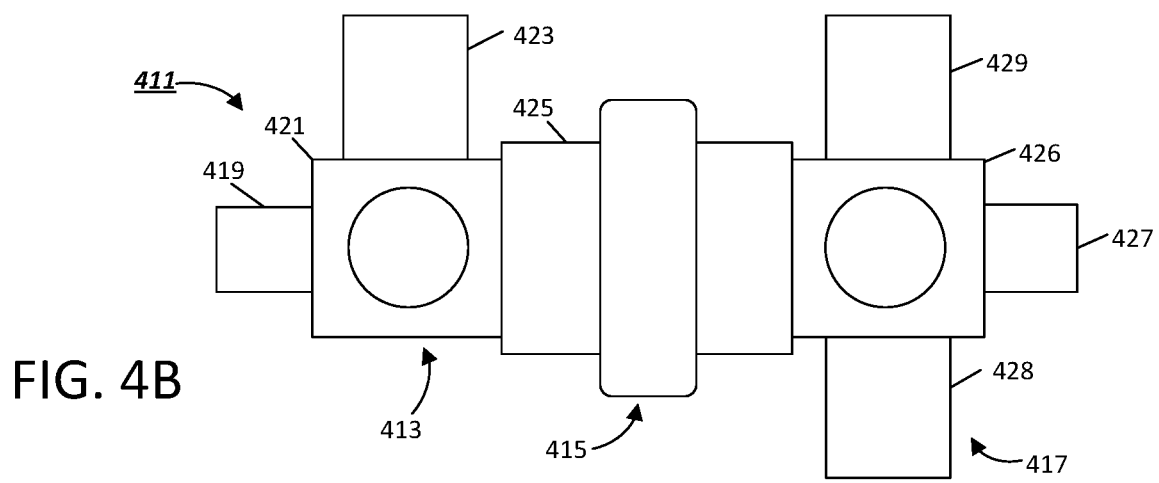
FIG. 4B provides a plan, schematic view of a fabrication machine that includes multiple modules, one of which (415) features a printer within a controlled atmosphere.
Figure 4C:
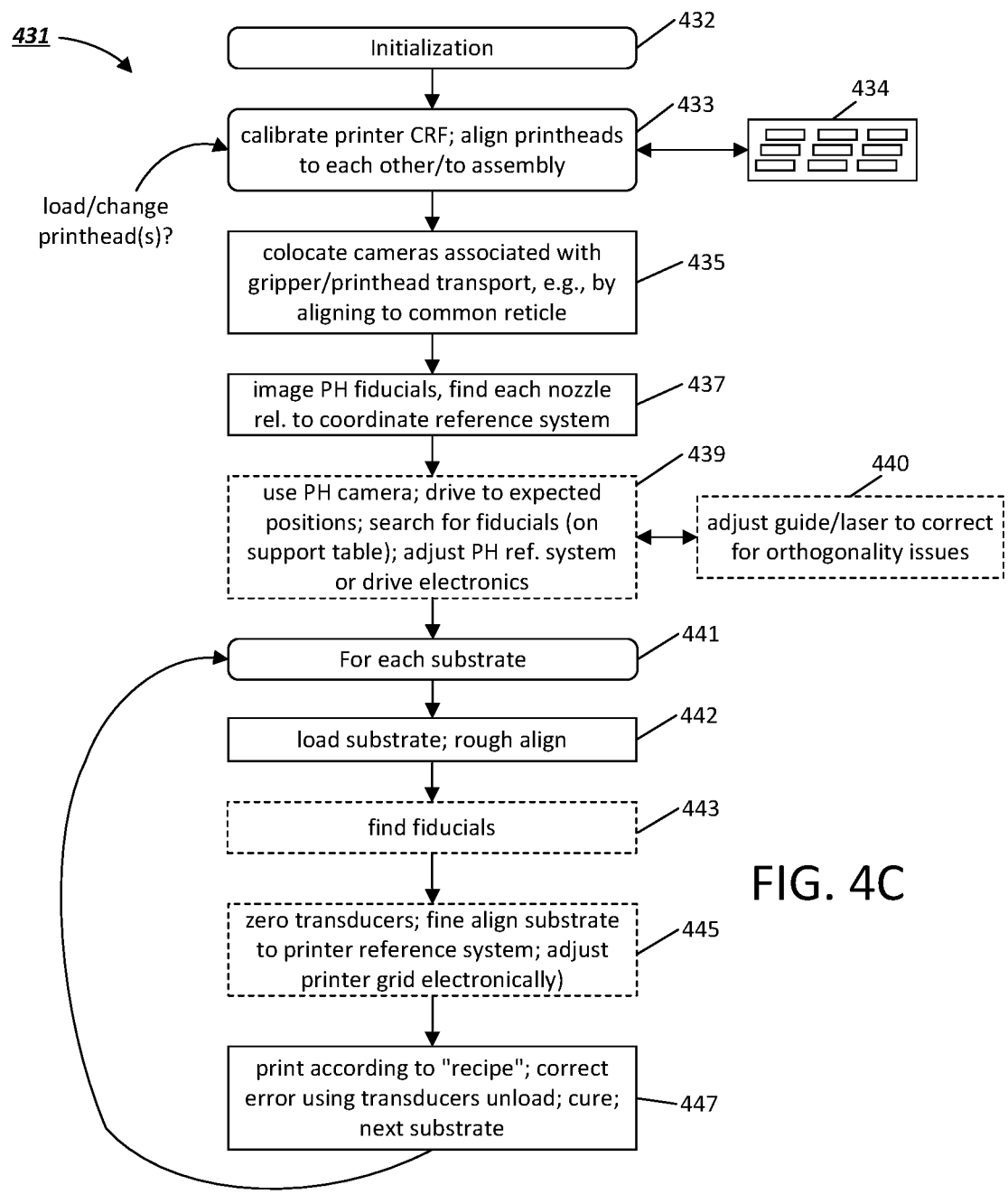
FIG. 4C is a block diagram that illustrates one method 431 of dynamically correcting transport path error in an industrial printing system.
Figure 5:
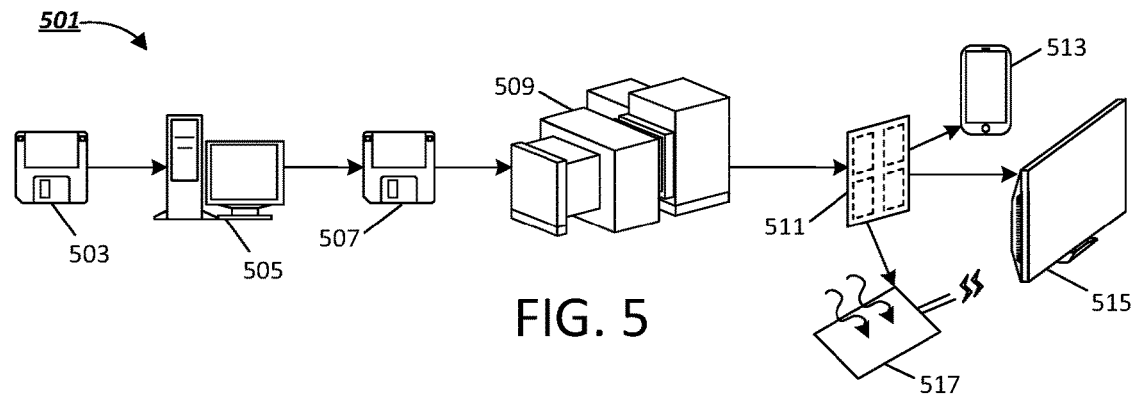
FIG. 5 is an illustrative view showing a series of optional tiers, products or services that can each independently embody techniques introduced herein; for example, these techniques can be embodied in the form of software (per numeral 503), or as printer control data (per numeral 507), to be used to control a printer to print on a substrate or otherwise to correct for error, or as a product made in reliance on these techniques (e.g., as exemplified by numeral 511, 513, 515 or 517).

II. On-Line and Off-Line Processes Associated with a Split-Axis Manufacturing System FIGS. 4A-5 are used to discuss some specifics associated with a typical split-axis fabrication system. FIG. 4A is used to discuss typical scanning motion used in thus a fabrication system to deposit material that will form a layer of an electronic device, while FIG. 4B is used to discuss configuration of a specific manufacturing system that relies on a printer and processing chamber. FIG. 4C will be used to discuss a process in which each substrate in a series of substrates is aligned with a coordinate reference system used by a printer, while FIG. 5 will be used to discuss the process of fabricating an electronic device (or a specific layer of such a device).

More particularly, FIG. 4A depicts a substrate 401, with a number of dashed-line boxes representing individual panel products. One such product, seen in the bottom left of the FIG., is designated using reference numeral 402. Each substrate (in a series of substrates) in one embodiment has a number of alignment marks, such as represented by numeral 403. In one embodiment, two such marks 403 are used for the substrate as a whole, enabling measurement of substrate positional offset relative to mechanical components of the printer (e.g., the gripper) and, in another embodiment, three or more such marks 403 are used to facilitate additional adjustments (e.g., rotational adjustment). In yet another embodiment, each panel (such as any of the four depicted panels) is accompanied by per-panel alignment marks, such as marks 405; this latter scheme permits gripper adjustment so that the individual panel being printed is precisely aligned to the printer's coordinate reference system. Whichever scheme is used, one or more cameras 406 are used to image the alignment marks in order to identify substrate position relative to the printer's coordinate reference system; in one embodiment, cameras are mounted to each of the gripper and the traveling printhead assembly, and these cameras can be respectively controlled so as to image substrate one or more substrate fiducials and identify precise substrate (and/or product) position and orientation relative to positions along the printer's axes of transport (i.e., relative to the printer's coordinate reference system). In another contemplated embodiment, a single motionless camera is used, and the transport mechanism of the printer (e.g., a handler and/or air flotation mechanism) moves the substrate to position each alignment mark in sequence in the field of view of the single camera; in a different embodiment, the camera is mounted on a two dimensional motion system for transport relative to the substrate. In yet other embodiments, low and high magnification images are taken, the low magnification image to coarsely position a fiducial for high resolution magnification, and the high magnification image to identify precise fiducial position according to a printer coordinate system; a line or CCD scanner can also be used. Reflecting on the earlier discussion, in one embodiment, the transport mechanism(s) of the printer (and associated feedback/position detection mechanisms) control(s) motion to within about a micron of intended position, with the imaging system used per-substrate to align (and to optionally mechanically reposition) the substrate to the printer's coordinate reference system until reasonably-accurate alignment is achieved; in another embodiment, measured positional error and/or orientation error can be used to customize/adjust the print recipe, in software, such that printing is distorted so as to match the detected substrate position/orientation.

In a typical implementation, printing will be performed to deposit a given material layer on the entire substrate at once (i.e., with a single print process providing a layer for multiple products). Note that such a deposition can be performed within individual pixel wells (not illustrated in FIG. 4A, i.e., there would typically be millions of such wells for a television screen) to deposit light generating layers within such wells, or on a "blanket" basis to deposit a barrier or protective layer, such as an encapsulation layer. Whichever deposition process is at issue, FIG. 4A shows two illustrative scans 407 and 408 along the long axis of the substrate; in a split-axis printer, the substrate is typically moved back and forth (e.g., in the direction of the depicted arrows) with the printer advancing the printhead positionally (i.e., in the vertical direction relative to the drawing page) in between scans. Note that while the scan paths are depicted as linear, this is not required in any embodiment. Also, while the scan paths (e.g., 407 and 408) are illustrated as adjacent and mutually-exclusive in terms of covered area, this also is not required in any embodiment (e.g., the printhead(s) can be applied on a fractional basis relative to a print swath, as necessary or desired). Finally, also note that any given scan path typically passes over the entire printable length of the substrate to print a layer for multiple products in a single pass. Each pass uses nozzle firing decisions according to the print recipe, with control over the transducers (not shown in FIG. 4A) used to ensure that each droplet in each scan is deposited precisely where it should be relative to substrate and/or panel boundaries.

FIG. 4B shows one contemplated multi-chambered fabrication apparatus 411 that can be used to apply techniques disclosed herein. Generally speaking, the depicted apparatus 411 includes several general modules or subsystems including a transfer module 413, a printing module 415 and a processing module 417. Each module maintains a controlled environment, such that printing for example can be performed by the printing module 415 in a first controlled atmosphere and other processing, for example, another deposition process such an inorganic encapsulation layer deposition or a curing process (e.g., for printed materials), can be performed in a second controlled atmosphere; these atmospheres can be the same if desired. The apparatus 411 uses one or more mechanical handlers to move a substrate between modules without exposing the substrate to an uncontrolled atmosphere. Within any given module, it is possible to use other substrate handling systems and/or specific devices and control systems adapted to the processing to be performed for that module. Within the printing module 415, as discussed, mechanical handling can include use (within a controlled atmosphere) of a flotation table, gripper, and alignment/fine error correction mechanisms, as discussed above.

Various embodiments of the transfer module 413 can include an input loadlock 419 (i.e., a chamber that provides buffering between different environments while maintaining a controlled atmosphere), a transfer chamber 421 (also having a handler for transporting a substrate), and an atmospheric buffer chamber 423. Within the printing module 415, it is possible to use other substrate handling mechanisms such as a flotation table for stable support of a substrate during a printing process. Additionally, a xyz-motion system (such as a split-axis or gantry motion system) can be used to reposition and/or align the substrate to the printer, to provide for precise positioning of at least one printhead relative to the substrate, and to provide a y-axis conveyance system for the transport of the substrate through the printing module 415. It is also possible within the printing chamber to use multiple inks for printing, e.g., using respective printhead assemblies such that, for example, two different types of deposition processes can be performed within the printing module in a controlled atmosphere. The printing module 415 can comprise a gas enclosure 425 housing an inkjet printing system, with means for introducing a non-reactive atmosphere (e.g., nitrogen or a noble gas) and otherwise controlling the atmosphere for environmental regulation (e.g., temperature and pressure, gas constituency and particulate presence).

Various embodiments of a processing module 417 can include, for example, a transfer chamber 426; this transfer chamber also has a including a handler for transporting a substrate. In addition, the processing module can also include an output loadlock 427, a nitrogen stack buffer 428, and a curing chamber 429. In some applications, the curing chamber can be used to cure, bake or dry a monomer film into a uniform polymer film; for example, two specifically contemplated processes include a heating process and a UV radiation cure process.

In one application, the apparatus 411 is adapted for bulk production of liquid crystal display screens or OLED display screens, for example, the fabrication of an array of (e.g.) eight screens at once on a single large substrate. The apparatus 411 can support an assembly-line style process, such that a series of substrates is processed in succession, with one substrate being printed on and then advance for cure while a second substrate in the series is concurrently introduced into the printing module 415. The screens manufactured in one example can be used for televisions and as display screens for other forms of electronic devices. In a second application, the apparatus can be used for bulk production of solar panels in much the same manner.

The printing module 415 can advantageously be used in such applications to deposit organic light generating layers or encapsulation layers that help protect the sensitive elements of OLED display devices. For example, the depicted apparatus 411 can be loaded with a substrate and can be controlled to move the substrate between the various chambers in a manner uninterrupted by exposure to an uncontrolled atmosphere during the encapsulation process. The substrate can be loaded via the input loadlock 419. A handler positioned in the transfer module 413 can move the substrate from the input loadlock 419 to the printing module 415 and, following completion of a printing process, can move the substrate to the processing module 417 for cure. By repeated deposition of subsequent layers, each of controlled thickness, aggregate encapsulation can be built up to suit any desired application. Note once again that the techniques described above are not limited to encapsulation processes, and also that many different types of tools can be used. For example, the configuration of the apparatus 411 can be varied to place the various modules 413, 415 and 417 in different juxtaposition; also, additional, fewer or different modules can also be used. In one embodiment, the depicted apparatus 411 can be daisy-chained with other modules and/or systems, potentially to produce other layers of the desired product (e.g., via different processes). When a first substrate in a series is finished (e.g., has been processed to deposit material that will form the layer in-question), another substrate in the series of substrates is then introduced and processed in the same manner, e.g., according to the same recipe.

While FIG. 4B provides one example of a set of linked chambers or fabrication components, clearly many other possibilities exist. The techniques introduced above can be used with the device depicted in FIG. 4B, or indeed, to control a fabrication process performed by any other type of deposition equipment.

Once printing is finished, the substrate and wet ink (i.e., deposited liquid) can then be transported for curing or processing of the deposited liquid into a permanent layer. For example, a substrate can have "ink" applied in a printing module 415, and then be transported to a curing chamber 429, all without breaking the controlled atmosphere (i.e., which is advantageously used to inhibit moisture, oxygen or particulate contamination). In a different embodiment, a UV scanner or other processing mechanism can be used in situ, for example, being used on split-axis traveler, in much the same manner as the aforementioned printhead/camera assembly.

FIG. 4C provides another flow chart relating to system alignment, with a series of steps being generally designated using numeral 431. The method begins with system initialization, per numeral 432; for example, this initialization can be performed at each power-up, or on an ad-hoc (e.g., operator-commanded) or periodic basis. An alignment/detection operation 433 is thereafter performed for the various conveyance paths, for example, to identify a common point as an origin or common point of reference, and to identify precise position of each nozzle within the coordinate reference system established by this point and the positional feedback (and position indicators) associated with each transport path; as indicated at the left side of the FIG. this operation (or system initialization) can be performed if desired following a maintenance operation, for example, resulting in a change of the printheads or other system components (e.g., which might result in nozzles at different locations relative to the printer's coordinate reference system. Note that numeral 434 represents a typical printhead assembly configuration, i.e., where the assembly mounts nine printheads (this may be one large assembly or a number of subassemblies, for example, three "ink-sticks" that each mount three printheads in a staggered configuration). In one embodiment, there can be 256-1024 nozzles per printhead.

Elaborating on the alignment procedure, and as described by U.S. Provisional Application No. 62/459,402, a detachable optical reticle can be attached in a known position (e.g., coaxially) with a "downward-facing" camera of the printhead assembly, and the both the gripper and the printhead are articulated along their transport paths until this camera and an "upward-facing" camera mounted to the gripper "find" each other (i.e., they both image the reticle, for example, they are positioned until each camera image finds the reticle or an associated set of crosshairs directly in the associated, captured image). This point can then be used to define a common reference point or origin point of the coordinate reference system, as represented by numeral 435. Each axis of transport is then moved so that one of these cameras images a fiducial associated with the other conveyance system. For example, per numeral 437, the gripper and printhead conveyance systems are articulated until the gripper's "upward-facing" camera finds a fiducial or alignment mark of the printhead, and using a search algorithm, precisely locates the center point of each print nozzle. The position of each motion system—gripper/printhead assembly—along its respective transport path (e.g., in observation of precise positional placement facilitated by alignment marks from an optical tape) then permits precise definition of this fiducial or alignment mark in the printer's coordinate reference system, and so forth. Each nozzle can be precisely defined in terms of the printer's coordinate reference system, enabling accurate control over where droplets are ejected. Relative to other potential sources of error, e.g., unintended non-orthogonality between transport axes, this error can be detected using additional fiducials or alignment marks (e.g., a fixed fiducial associated with the printer support table is image by one or both cameras, per numeral 439, with associated adjustments made to the coordinate reference system, optical guide system, or the recipe, or alternatively, the optical guide/laser can be adjusted as part of a manual or electronic calibration process, per numeral 440, until precise alignment and orthogonality are achieved.

Optionally, such a calibration process can be performed periodically or any time system parameters are changed, e.g., a new printhead is introduced, potentially introducing nozzles at previously known locations relative to the printer's coordinate reference system.

During run time, the introduction of each substrate in a series of substrates may potentially introduce unintended misalignment between where printing is supposed to occur (relative to the printer) and where printing does occur (relative to the substrate). Each substrate is therefore subjected to an position and/or orientation detection process, per numeral 441, with associated error being factored into electronic print particulars or to reposition the given substrate for printing of a layer (so that printing occurs in in precise registration relative to substrate fiducials and relative to other layers deposited on the substrate which are also in precise registration relative to those fiducials). Per numeral 442, as each given substrate in the series is introduced into the printing module (e.g., 415 from FIG. 4B), it is first roughly aligned using one or more bankers and/or mechanical handlers. With the given substrate and its associated fiducials in approximately the correct position, an imaging system (such as the "downward-facing" camera system mounted by the printhead assembly) is then employed, using a search algorithm and suitable image processing, to precisely find one or more substrate fiducials, per numeral 443. For example, this detection can be performed using a spiral or similar search pattern which searches about a fiducial expected position until precise fiducial position and/or orientation has been detected. A series of optional and/or alternative correction processes can then be employed so as to precisely position and/or reposition the substrate; for example, as indicated variously by process box 445, in one embodiment, the aforementioned transducers can be driven so as to provide precise substrate positioning (e.g., a vacuum lock of the gripper's "second component" is not adjusted, but the transducers are articulated in common- and/or differential-drive modes until the substrate fiducial has exactly the right start position and orientation. The transducer positions corresponding to this substrate position/orientation can then be used as a zero level or position, with error corrections (during production) then superimposed thereon or otherwise defined relative to these positions. Alternatively or in addition, a mechanical handler can be used to reposition the substrate as necessary. As still another alternative, the recipe can be adjusted in software, as disclosed in US Patent Publication No. 20150298153, to correct for alignment error (e.g., with correction for repeatable error left for transducers associated with the gripper and/or printhead conveyance systems, as referenced earlier). Per numeral 445, printing then occurs according to the desired print recipe; following printing, the just-printed substrate is unloaded for cure (e.g., it is transported to a processing chamber), while the system receives or prepares to receive a new substrate under robotic- or human-direction.

FIG. 5 represents a number of different implementation tiers, collectively designated by reference numeral 501; each one of these tiers represents a possible discrete implementation of the techniques introduced herein. First, techniques as introduced in this disclosure can take the form of instructions stored on non-transitory machine-readable media, as represented by graphic 503 (e.g., executable instructions or software for controlling a computer or a printer). Second, per computer icon 505, these techniques can also optionally be implemented as part of a computer or network, for example, within a company that designs or manufactures components for sale or use in other products. Third, as exemplified using a storage media graphic 507, the techniques introduced earlier can take the form of a stored printer control instructions, e.g., as data that, when acted upon, will cause a printer to fabricate one or more layers of a component dependent on the use of different ink volumes or positions to mitigate alignment error, per the discussion above. Note that printer instructions can be directly transmitted to a printer, for example, over a LAN; in this context, the storage media graphic can represent (without limitation) RAM inside or accessible to a computer or printer, or a portable media such as a flash drive. Fourth, as represented by a fabrication device icon 509, the techniques introduced above can be implemented as part of a fabrication apparatus or machine, or in the form of a printer within such an apparatus or machine. It is noted that the particular depiction of the fabrication device 509 represents one exemplary printer device, for example, as discussed in connection with the FIG. 4B. The techniques introduced above can also be embodied as an assembly of manufactured components; in FIG. 5 for example, several such components are depicted in the form of an array 511 of semi-finished flat panel devices that will be separated and sold for incorporation into end consumer products. The depicted devices may have, for example, one or more light generating layers or encapsulation layers or other layers fabricated in dependence on the methods introduced above. The techniques introduced above can also be embodied in the form of end-consumer products as referenced, e.g., in the form of display screens for portable digital devices 513 (e.g., such as electronic pads or smart phones), as television display screens 515 (e.g., OLED TVs), solar panels 517, or other types of devices.

Having thus discussed in detail sources of positional error and associated remedies, this disclosure will now turn to discussion of a more detailed embodiment of a specific fabrication apparatus.

III. Specific Implementations

FIGS. 6A-6E are used to discuss specific printer implementations, namely, as applied to the manufacture of OLED display or solar panels. Depending on product design, the printer seen in these FIGS. can be used to deposit a layer for an array of products at-once on a substrate (e.g., many smart phone or other portable device displays, perhaps hundreds at a time, such as conceptually represented by the individual, arrayed products on substrate 411 from FIG. 4A), or a single product per substrate such as the display screen of the HDTV 415 or solar panel 417 from FIG. 4A. Many other example applications will be apparent to those having skill in the art.

Figure 6A:
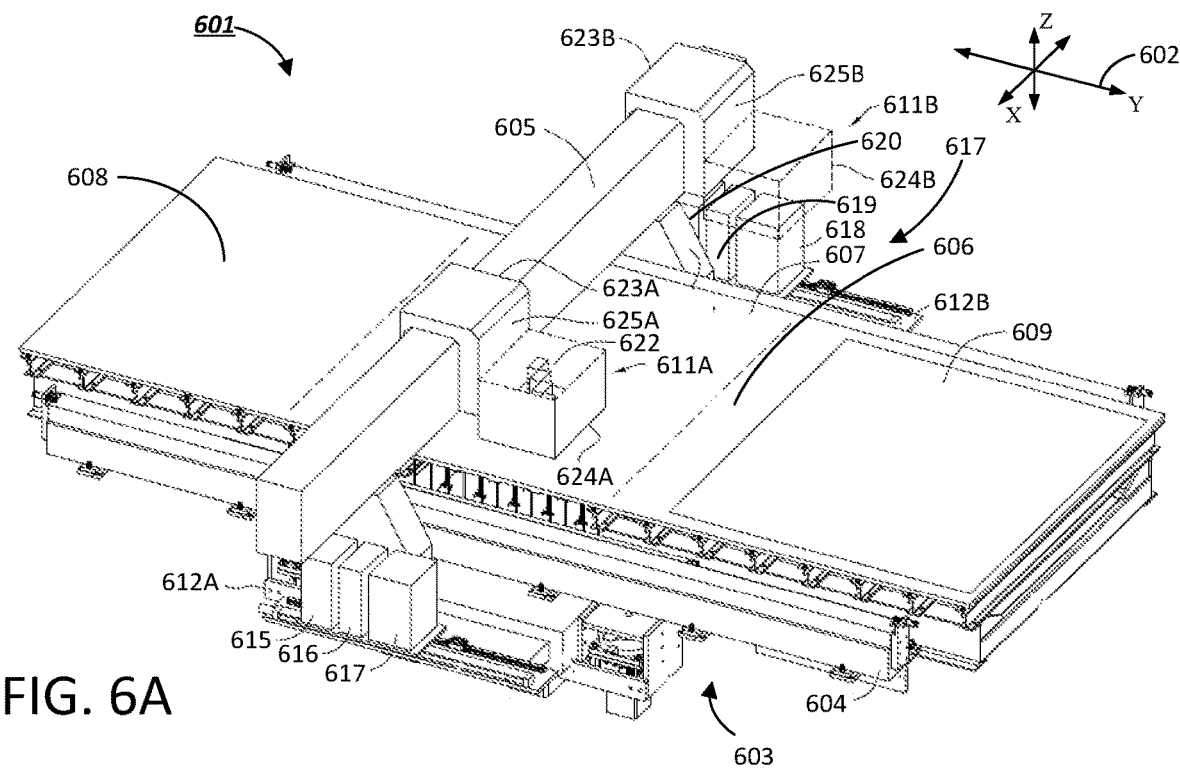
FIG. 6A is a detail, perspective view of one embodiment of an industrial printer, such as the printer inside the printing module of FIG. 4B.

More specifically, FIG. 6A shows a printer 601 as having a number of components which operate to allow the reliable placement of ink drops onto specific locations on a substrate. Printing in the illustrated system requires relative motion between each printhead assembly and the substrate. This can be accomplished with a motion system, typically a gantry or split-axis system. Either a printhead assembly can move over a stationary substrate (gantry style), or both the printhead assembly and substrate can move, in the case of a split-axis configuration. In another embodiment, a printhead assembly can be substantially stationary while the substrate is moved along both x- and y-axes relative to the printheads.

The printer comprises a printer support table 603 and a bridge 605; the printer support table 603 is used to transport substrates (such as substrate 609) using a planar flotation support surface mounted by a frame 604, while the bridge 605 is used for transport of a number of printheads and various support tools, for example, an optical inspection tool, cure device, and so forth. As noted earlier, a gripper (e.g., a vacuum gripper, not seen in this FIG.) provides a "fast axis" for conveying the substrate (e.g., in what is referred to elsewhere herein as the "y" dimension, see, e.g., dimensional legend 602), while the bridge permits one or more printhead assemblies 611A and 611B (and/or cameras) to move back and forth along the bridge 605 along a "slow axis." To effectuate printing, a printhead assembly (e.g., the primary assembly 611A) will be positioned at a suitable position along the bridge while the vacuum gripper moves the substrate in a generally linear manner along the "y" dimension, to provide for a first scan or raster; the printhead assembly 611A or 611B is then typically moved to a different position along the bridge 605 and stopped, with the vacuum gripper then moving the substrate 609 back in the opposite direction underneath the new printhead assembly position, and so forth, to provide an ensuing scan or raster, and so forth.

The printer support table 603 can have a porous medium to provide for the planar floatation support surface. The planar flotation support surface includes an input zone, a print zone and an output zone, which are respectively designated using numerals 606-608; the substrate 609 is depicted in the input zone 606, ready to be printed on. A combination of positive gas pressure and vacuum can be applied through the arrangement of ports or using a distributed porous medium provided by the support table. Such a zone having both pressure and vacuum control can be effectively used to provide a fluidic spring between the flotation table surface and each substrate 609. A combination of positive pressure and vacuum control can provide a fluidic spring with bidirectional stiffness. The gap that exists between the substrate 609 and the surface of the flotation table can be referred to as the "fly height," with this height regulated by controlling the positive pressure and vacuum port states. In this manner, a z-axis height of the substrate can be carefully controlled at various parts of the printer support table, including without limitation, in the print zone 607. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means could potentially cause substrate chipping or catastrophic breakage. At other regions of the printer support table, the fly height need not be as precisely controlled, for example, in the input or output zones 606 and 608, or it can be controlled to provide a different fly height or fly height profile. A "transition zone" between regions can be provided such as where a ratio of pressure to vacuum nozzles increases or decreases gradually. In an illustrative example, there can be an essentially uniform height between a pressure-vacuum zone, a transition zone, and a pressure only zone, so that within tolerances the three zones can lie essentially in one plane. A fly height of a substrate over pressure-only zones elsewhere can be greater than the fly height of a substrate over a pressure-vacuum zone, such as in order to allow enough height so that a substrate will not collide with a printer support table in the pressure-only zones. In an illustrative example, an OLED panel substrate can have a fly height of between about 150 microns ($\mu$) to about 300$\mu$ above pressure-only zones, and then between about 30$\mu$ to about 50$\mu$ above a pressure-vacuum zone. In an illustrative example, one or more portions of the printer support table 603 or other fabrication apparatus can include an air bearing assembly provided by NewWay Air Bearings (Aston, Pa., United States of America). A porous medium can be obtained such as from Nano TEM Co., Ltd. (Niigata, Japan), such as having physical dimensions specified to occupy an entirety of the substrate 609, or specified regions of the substrate such as display regions or regions outside display regions. Such a porous medium can include a pore size specified to provide a desired pressurized gas flow over a specified area, while reducing or eliminating mura or other visible defect formation.

In the example of FIG. 6A, a handler or other conveyance system (not shown) delivers each substrate 609 to the input region 606 of the printer support table 603. The vacuum gripper engages the substrate 609, transports it from the input zone 606 into the print zone 607 and then moves the substrate back-and-forth for printing, to effectuate respective "near-frictionless," low-particle-generating, high-speed scans along the fast axis of the printer, according to the particular recipe. When printing is finished, the vacuum gripper then transports the substrate to the output zone 608, where a mechanical handler takes over and conveys the substrate to the next processing apparatus; during this time, a new substrate can be received in the input zone 606, and the vacuum gripper is then transported back to that zone to engage that new substrate. In one embodiment, deposited droplets of ink are allowed to meld together in the output zone, e.g., via a brief rest or settling period during which the substrate is allowed to remain in the output zone, with printing and settling and ensuing cure being performed within in a controlled environment (e.g., generally in a nitrogen or noble gas atmosphere, or other non-reactive environment).

The depicted printer 601 also can include one or more maintenance or management bays 612A and 612B, each of which can store tools 615-620 for modular engagement by one or both printhead assemblies, for example, printheads, cameras, "ink sticks;" similarly, in one embodiment, these bays are configured for interaction with other components, such as a droplet measurement module, a purge basin module, a blotter module, and so forth, optionally within the same enclosed space (enclosure volume) or a second volume. In one embodiment, a printhead assembly can simultaneously mount three "ink sticks," as denoted by numeral 622, with each "ink stick" supporting three printheads and supporting fluidics and circuit contacts in a manner adapted for modular engagement with the printhead assembly. The ink delivery system (not separately shown in FIG. 6A) comprises one or more ink reservoirs, ink supply tubing to convey ink between the reservoirs and one or more of the printhead assemblies, and suitable control circuitry, while the motion system (also not separately shown in FIG. 6A) comprises electronic control elements, such as a subsystem master processor and control systems and actuating elements for the gripper and printhead assemblies, and suitable control code.

The printhead assemblies 611A/611B each comprise a traveler 623A/623B which rides along the bridge (i.e., on a track or guide) and an engagement mechanism 624A/624B mounted proximate to a front surface 625A/625B of the bridge to robotically engage and disengage each of the ink sticks or other tools on a modular basis as desired with each support bay 612A/612B. Each printhead assembly (611A/611B) is supported by a linear air bearing motion system (which is intrinsically low-particle generating) or other linear motion system to allow it to move along the bridge 605. Each printhead assembly is accompanied by fluidic and electronic connections to at least one printhead, with each printhead having hundreds to thousands of nozzles capable of ejecting ink at a controlled rate, velocity and size. To provide one illustrative example, a printhead assembly can include between about 1 to about 60 printhead devices, where each printhead device can have between about 1 to 90 printheads, with each printhead having 16 to about 2048 nozzles, each capable of expelling a droplet having of volume of about 1-to-20 picoLiters (pL) depending on design. The front surfaces 625A/625B each provide for a respective z-axis moving plate which controls height of the engagement mechanism (and thus printheads or other tools) above a surface of the substrate. The traveler and engagement mechanism can serve as the "first" and "second" components referenced earlier for the printhead assembly, e.g., these components in one embodiment are coupled by an electromechanical interface (not seen in FIG. 6A) which permits robotic adjustment of the transported tool in each of x, y and z dimensions. In this regard, U.S. Provisional Patent Application No. 62/459,402, referenced earlier, provides details relating to z-axis calibration of printheads and various other elements of the printer's coordinate reference system in general. The electromechanical interface can advantageously include stepper motors, fine adjustment screws and other mechanisms for adjusting (a) x, y and/or z mounting of each tool relative to the relevant engagement mechanism, and (b) pitch between respective tools (e.g., pitch between ink sticks). In addition, each tool can also include various fine adjustment mechanisms, e.g., for pitch adjustment between multiple printheads carried by each ink stick. The electromechanical interface can include a kinematic or similar mount for repeatably and reliably engaging each tool to within a micron of intended position in each dimension, with robotic adjustment mechanisms optionally configured to provide feedback for precise position adjustment of each tool relative to the engagement mechanism.

The electromechanical interface advantageously also includes a set of transducers as referenced earlier, e.g., to offset the engagement mechanism 624A/624B linearly in the "y" dimension relative to the associated traveler 623A/623B. As should be apparent from the discussion thus far, provision of a transducer correction mechanism to provide a "virtual straight edge" for the printhead(s) and provision of a transducer correction mechanism to provide another "virtual straight edge" for the gripper (not seen in FIG. 6A) facilitates a print grid which is more "regular," e.g., it helps ensure uniform droplet placement at precise, regular spacings associated with the print grid, thereby promoting enhanced layer uniformity.

As should be apparent, the depicted structural elements permit control over substrate x-axis position using common mode displacement of the substrate by the respective voice coil assemblies, as well as control over orientation of the substrate about the θ dimension (i.e., rotation about the z-axis). Various embodiments of the depicted gripper system can maintain the orientation of a substrate parallel to the y-axis of travel to within +/−4300 micro-radians, or less, depending on implementation. As mentioned earlier, when it is also desired to adjust substrate position to further match deviations in printhead (printhead assembly) position and orientation, this control over orientation together with common mode x-axis displacement, and the effective implementation of a floating pivot point for the substrate, permit precision repositioning of the substrate to simulate perfect, virtual edges (or guides) for each of substrate motion and traveler motion (e.g., printhead, camera, etc.). As noted earlier, each of the vacuum gripper and the printhead assembly/traveler also includes an optical system (not seen in the FIG.) for detecting alignment marks, i.e., to provide an electronic position signal that indicates with precision location of the gripper or printhead assembly along the associated transport path.

As should be observed, the use of voice coils in conjunction with air (gas) bearing support of a substrate, as well the vacuum based engagement between the gripper and substrate, provide an efficient mechanism for a frictionless, effective mechanism for both transporting and fine tuning position of a substrate. This structure helps maintain contact-minimized interaction with the substrate during electronic component fabrication (e.g., during layer deposition and/or cure), which helps avoid distortions and defects which could otherwise be engendered as a result of substrate deformation, localized substrate temperature fluctuation induced by contact, or other effects such as electrostatic energy buildup. At the same time, a near frictionless support and transducer system, in combination, help provide micron-scale or better throws used to perform fine tuning of substrate position. These structures help perform precise substrate corrections necessary to obtain one or more "virtual transport paths," notwithstanding mechanical imperfections as referenced earlier, and notwithstanding that a substrate that serves as the deposition target may be meters long and meters wide. The voice coils can also be configured to provide a relatively large throw, for example, from sub-micron to one hundred microns or more, which may be important depending on implementation (e.g., when a system at issue, given its manufacturing tolerances, experiences jitter of this magnitude).

Figure 6B:
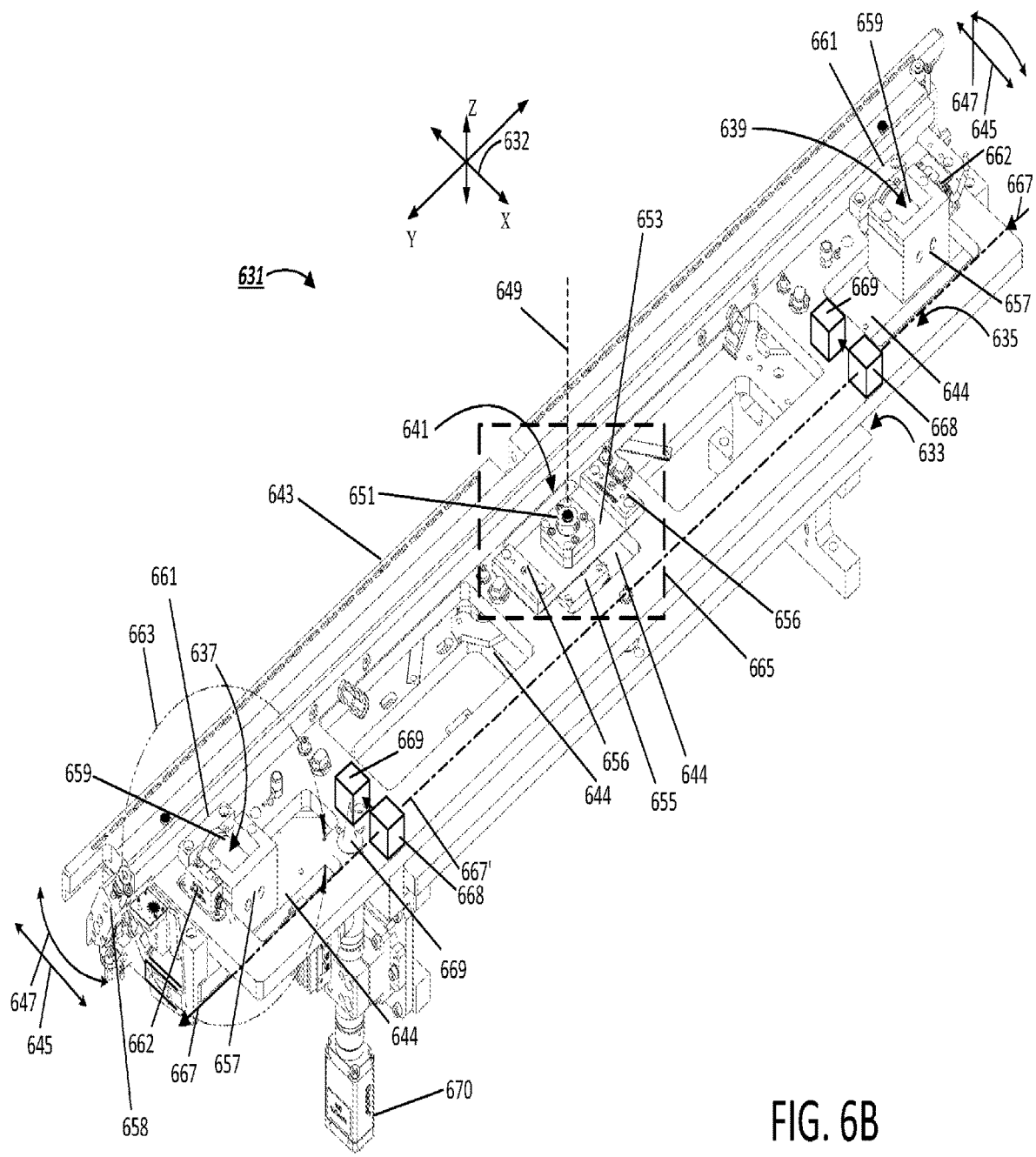
FIG. 6B is a detailed perspective view of an embodiment of a gripper.

FIG. 6B shows a vacuum gripper 631 in additional detail. The vacuum gripper 631 once again comprises a first component 633 (which rides atop a y-axis carriage, not seen in the FIG.), a second component 635 which engages substrates, and two linear transducers 637 and 639. Note that as depicted, the second component sits vertically above the first component as both are advanced along the gripper's direction of transport (e.g., along the "y-dimension" depicted by legend 632); the second component supports a vacuum chuck 643 that is used to selectively engage substrates. Unlike previous examples predicated on the use of a virtual pivot point, this example further includes a floating mechanical pivot assembly or mechanism 641 which provides a mechanical linkage between the first and second components 633/635 as the gripper is advanced along the y-dimension and helps provide structural support for embodiments where the linear transducers are embodied as voice coils. The floating pivot mechanism includes a pivot shaft 651, an assembly upper plate 653 (which is mounted to the gripper's second component 635) and an x-axis sliding lower plate 655 which moves on rails relative to a support frame 644 provided by the gripper's first component 633. The assembly upper plate preferably is made of a relatively thin material to provide flexure, for example, to permit leveling of the gripper's second component relative to the substrate and the floatation table, and is rigidly affixed to the second gripper's second component using mounting brackets 656. Succinctly stated, as component 633 is advanced along the y-dimension, the floating mechanical pivot mechanism 641 constrains the component 635 to also advance along the y-dimension while permitting x-axis sliding interaction between these components 633/635 and rotation about a floating pivot axis 649.

The floating pivot point permits differential- or common-mode drive of the transducers 637 and 639, as discussed previously; these various motions are further represented by sets of motion arrows 645/647. Generally speaking, each transducer couples a mounting block 657 (e.g., mounted relative to frame 644 of the gripper's first component) and a mounting plate 661 (mounted to the gripper's second component), with a linear actuator 659 coupling the mounting block and the mounting plate and providing precise displacement along the x-axis. As denoted by dashed-line outlines 663 and 665, the design of the transducers 637/639 and floating mechanical pivot mechanism 641 will be shown and discussed in greater detail in connection with FIGS. 6C and 6D.

FIG. 6B also illustrates positioning of an optical guide 667 relative to the various components of the gripper. In this design, the beam of light is above a top surface of the offsettable component (635) of the gripper, but below a plane occupied by the substrate; such a configuration promotes ease of access for purposes of adjusting optical components for purposes of proper alignment. In alternative embodiments, the optical guide (i.e., the beam of light in this example) can be directed within a cavity between the gripper's first and second components 633/655 and thus is seen in semi-dashed line where the beam crosses the gripper, to denote that the beam can be hidden from view at this particular location in such an alternate embodiment, e.g., as denoted by numeral 667'. A beam splitter 668 for each transducer is also mounted to the gripper's second component 635, and is used to redirect laser light from the optical guide to a detector for each transducer, represented by numeral 669. The design of the beam splitter and/or the detector 668/669 for each transducer advantageously features adjustment screws to adjust each, e.g., such that the beam splitter and/or detector being can be aligned such that the detector reads zero error when the gripper's second component is ideally positioned relative to a previously-aligned optical guide (667). These various elements are also mounted, in one embodiment, to the top surface of the gripper's offsettable component 635, but below a plane occupied by the substrate; in alternative embodiments, these elements can be mounted elsewhere (e.g., in between components 633 and 635, i.e., beneath the top surface of component 635, in a manner hidden from view. The beam splitter, detector and adjustment screws are each advantageously positioned so as to be accessible (e.g., using a screwdriver or other tool) so as to permit offline adjustment for purposes of this calibration. In alternate embodiments, proper beam splitter and/or detector alignment can be detected, or misalignment can be detected and factored in to the correction process in other ways; for example, in one embodiment, a test substrate can be introduced, fiducials on the test substrate can be imaged at multiple locations, and a misaligned optical beam, beam splitter and/or detector can have readings at different transport path advancement positions stored and factored into the error correction process at run-time, with transducer correction signals effectively being "skewed" at run time so that the gripper's second component travels ideally, e.g., based on preprogrammed adjustments to readings of a misaligned optical guide or associated optical components. It must also be pointed out that in various other embodiments, the optical components can be configured differently, e.g., a detector can be mounted separately from the gripper, and/or the optical source can be mounted to the transported component and/or the various components can be mounted in other locations.

Notably, FIG. 6B also shows an "upward-facing" camera 670, which as stated earlier is used to image a fiducial via a focal path 669 (represented as an optical cone in the FIG.) for purposes of aligning the vacuum gripper and printhead assembly (not shown) to define the printer's coordinate reference system, and to identify relative distance and position of various printhead assembly components (e.g., precise printhead nozzle position and the printhead assembly camera, not shown in the FIG., in terms of the printer's coordinate reference system).

Figure 6C:
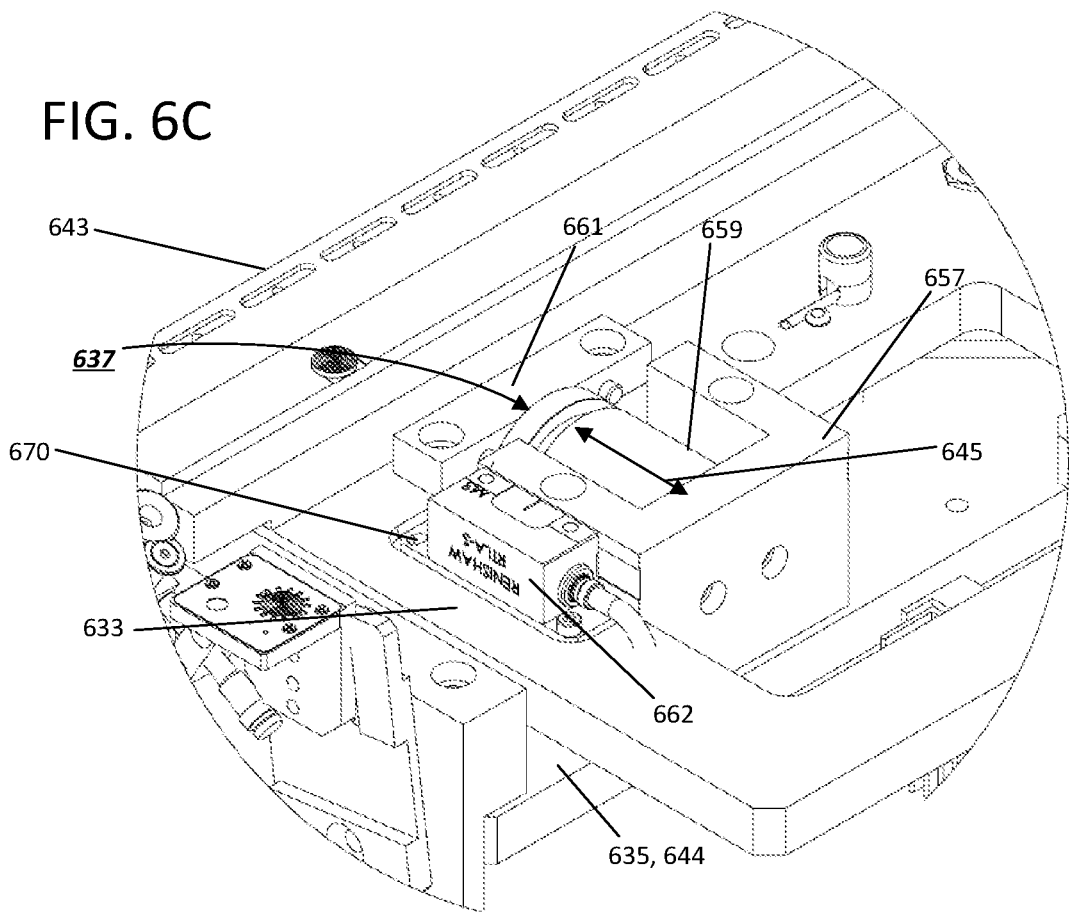
FIG. 6C is a close-up, perspective view of a transducer assembly from the gripper of FIG. 6B.

FIG. 6C shows an enlarged view of the linear transducer 637 from FIG. 6B. Once again, the other transducer (designated by numeral 639 in FIG. 6B) is generally identical or symmetrical in design to the transducer 637.

More particularly, the linear transducer in this example is predicated on a voice coil design with first and second components 633/635 of the gripper supported on an air bearing. The voice coil is contained within a cylindrical housing 659 to permit displacement of the second component (e.g., the vacuum chuck bar and substrate) relative to the second component along the general direction of double arrows 645. A adjustment plate 670 advantageously permits fine adjustments of transducer xyz orientation as between these two components, so as to linearly move the second components along the x-dimension axis (see dimensional legend 632 in FIG. 6B); once again, this can provided for with a configuration of manually adjustable screws that are adjusted and/or calibrated infrequently. The voice coil in this embodiment has a magnet-based design that provides for fast, accurate microscopic throws to displace the mounting plate 661 toward and away from the mounting block 657 as a function of an electronic control signal, i.e., once again, in the direction of double arrows 645.

Figure 6D:
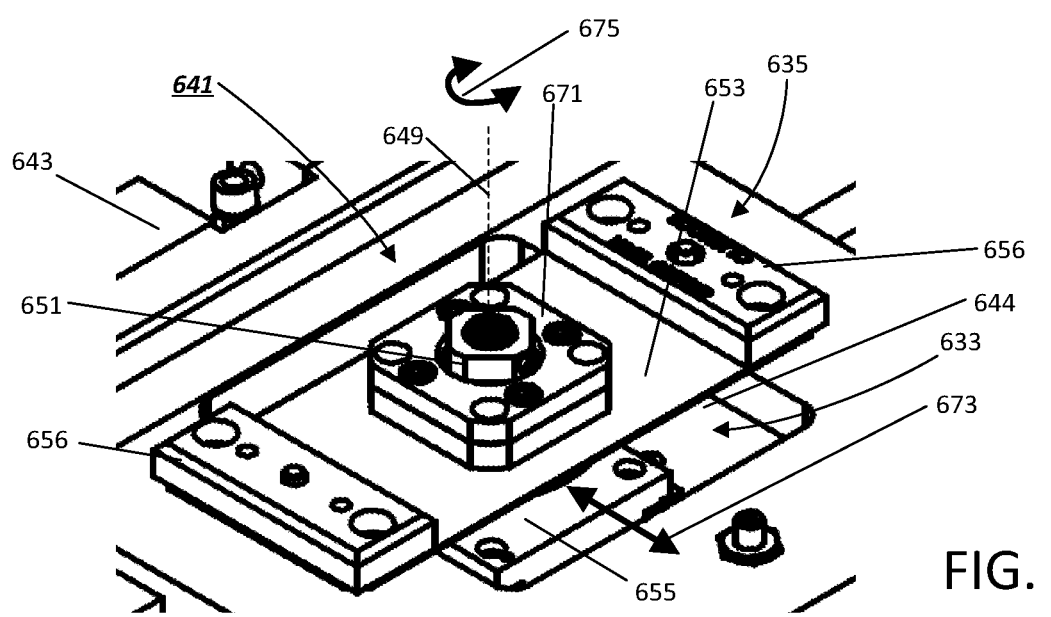
FIG. 6D is a close-up, perspective view of a floating, mechanical pivot assembly from the gripper of FIG. 6B.

FIG. 6D shows the floating, mechanical pivot mechanism 641 from FIG. 6B. As noted earlier, an assembly upper plate 653 carries a bushing which permits pivot of the assembly upper plate (and the gripper's second component and vacuum chuck) about a pivot axis 649. This axis is defined by a pivot shaft 651 which extends vertically downward parallel to the z-dimension, and which couples to the x-axis sliding lower plate 655. Although not seen in the FIG., the x-axis sliding lower plate 655 is coupled to the gripper's first component (via by support frame 644) by rails, so as to permit relatively frictionless x-axis displacement of the assembly upper plate 653, the pivot shaft 651, the vacuum chuck 643 and the gripper's second component 635 on a general basis relative to component 633 (and support frame 644), all while at the same time constraining these two components 633/635 to move together in the y-dimension. This structure provides mechanical support for a floating pivot point, with common-mode and differential-mode voice coil displacements being used, to respectively provide error-mitigating offsets of the second component along the direction of arrows 673 and rotation arrows 675. Note that a floating pivot point is not required for all embodiments, e.g., in embodiments where the transducer provides sufficient output impedance, a mechanical pivot mechanism can be potentially omitted. Whether a mechanical support structure is used or not, a floating pivot point advantageously permits common-mode and differential-mode control over multiple transducers, so as to reposition a substrate in x and θ dimensions, and so approximate a "straight edge" ideal transport path; various modifications and alternatives will no doubt occur to those of ordinary skill in the art.

Figure 6E:
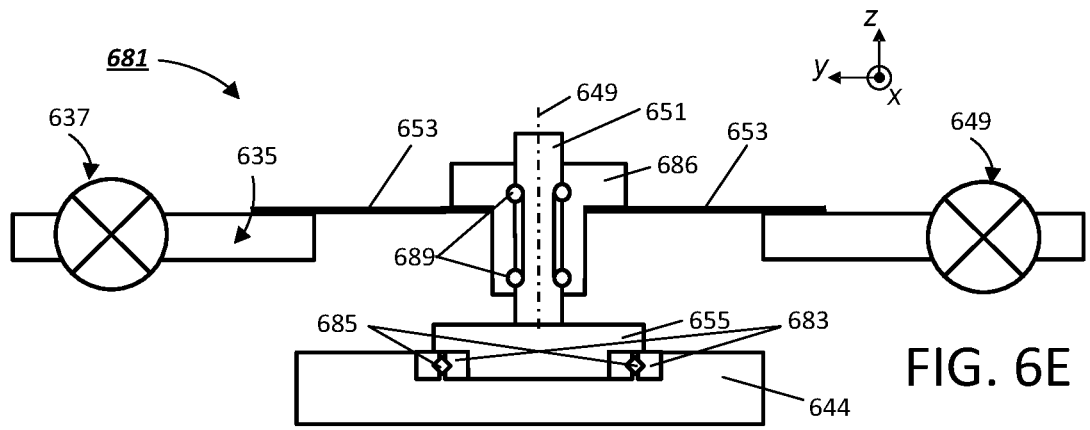
FIG. 6E is a schematic side view of the error correction system represented by FIGS. 6B-6D, with an emphasis on design of the floating, mechanical pivot assembly.

FIG. 6E provides a schematic view 681, which illustrates elements of the pivot mechanism represented by FIGS. 6B-6D. More specifically, this FIG. now illustrates a linear x-axis rails 683 which effectively provide a bearing 685 on either side of the x-axis sliding lower plate 655 to permit that structure (and everything supported above it) to ride into and out of the drawing page. At the same time, the assembly upper plate 653 mounts a bushing 686 so as to permit free rotation of that plate relative to the x-axis siding lower plate 655 about pivot axis 649. More specifically, the bushing 686 supports bearings 689 to permit this rotation. FIG. 6E also illustrates the flexure provided by the assembly upper plate 653, relative to the gripper's second component 635 and transducers 637/639.

While the transducer correction mechanisms depicted in FIGS. 6A-6D have been exemplified in the context of a gripper assembly, the same basic structure can also be used for the printhead assembly (or for each printhead assembly or other tool carrier). Specifically, a first component rides a track (or x-axis carriage assembly) atop a gas bearing, while a second component carrying printheads (or other tools) is displaced in a "y" and/or "z" dimension as a function of positional error in that dimension as a function of x-axis position (and/or other factors, e.g., temperature). For correction in a given dimension, two transducers are again used with a virtual or floating pivot point to effectuate both y and θ corrections (or z and xz-plane angular correction) in relative position of a printhead relative to a substrate, and in so doing, cause the printhead to follow a virtual straight edge path. Optionally using two such correction mechanisms together, to provide straight edge paths for each the gripper and printhead conveyance system, respectively, one may effectively provide for a very precise, regular print grid which provides for greater precision over droplet placement. Z-axis adjustment of the printhead can also be controlled using a transducer-based motion correction system of similar design, to provide for corrections in height of a printhead orifice plate relative to a substrate surface, and thereby manage height difference to also have improved precision. Other degrees of freedom may also be corrected in this manner. In a precision motion system, especially a printer based fabrication system, where a coordinate reference system used for printing/manufacture is effectively tied to multiple transport paths, the use of plural correction systems of this type improves precision over droplet landing location and thus facilitates greater uniformity in fabricated layers; in turn, this makes it easier to produce thinner layers, e.g., having thicknesses of five microns or less. It again bears noting that although the designs discussed above emphasize the use of a "virtual straight edge," for purposes of improving print grid regularity, all embodiments are not so limited, and nearly any desired "ideal" path can be approximated using the teachings provided here.

IV. Various Use Cases, Revisited

FIGS. 7A-7I are used to revisit a number of specific use cases relative to the techniques introduced above.

Figure 7A:
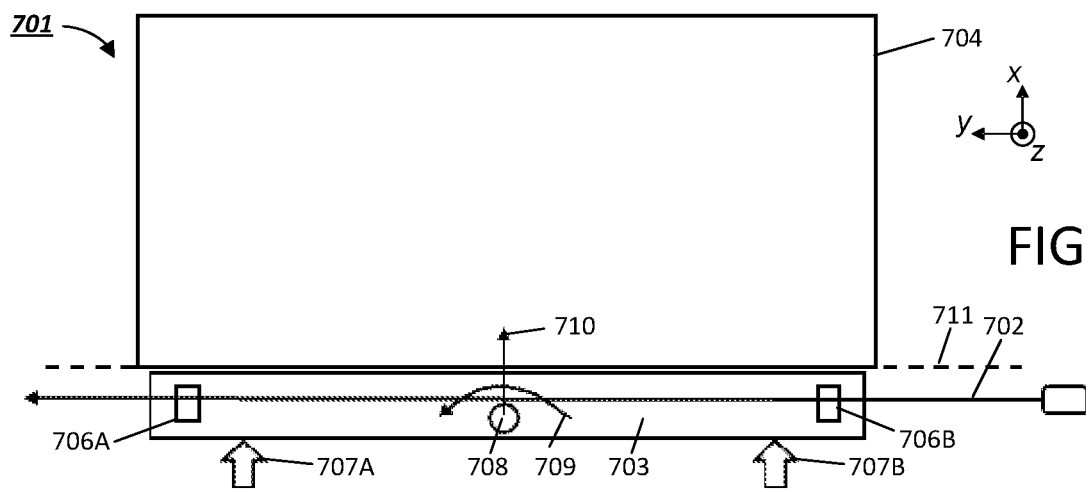
FIG. 7A shows an embodiment 701 where an optical guide 702 is used to ensure straight motion of a gripper 703 and substrate 704.

More specifically, FIG. 7A shows an embodiment 701 where an optical guide 702 is used to ensure straight motion of a gripper 703 and substrate 704. The depicted structure implements a continuous process which is performed in real time. A robotic gripper (not shown) holds the substrate as it is advanced in the conveyance system; in the depicted embodiment, the optical beam 702 (i.e., a beam produced by a laser source 705) ideally remains parallel to the substrate and at a constant distance therefrom as the latter is advanced through the system (this is represented by virtual straight edge 711). To the extent that deviation occurs, the offset (in linear position) and rotation of the gripper's second component relative to the beam 702 is measured by two laser sensors 706A/706B. Path deviation measurements from the two laser sensors enable two actuators 707A/707B (e.g., piezoelectric transducers, voice coils, etc.) to adjust the rotation angle 709 (about an optional mechanical pivot assembly 708) and linear position 710 along a direction orthogonal to the beam, so as to preserve the "ideal" relationship between the gripper's second (offsettable) component and the beam.

Figure 7B:
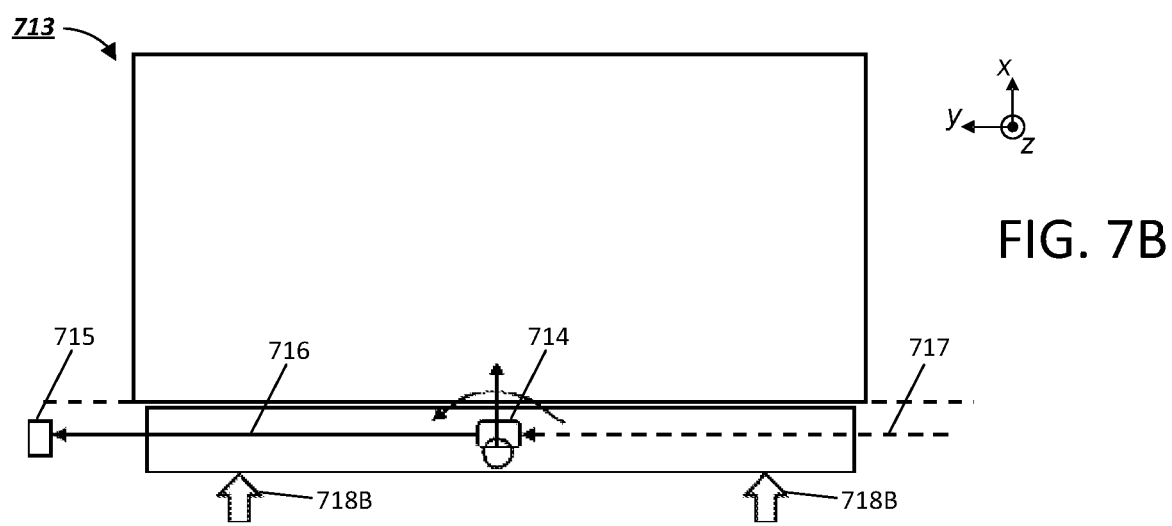
FIG. 7B shows an embodiment 713 where a laser source and/or light redirection optics are mounted to a gripper's offsettable component, or other element being transported.

FIG. 7B shows another embodiment 713, but this time where a laser source and/or optics 714 are mounted in fixed relationship to the "thing" being transported and where a sensor 715 is stationary. Differential readings over time from the sensor for example can be used to detect and correct rotation error and steady state beam misalignment can be used to detect and correct linear position of the thing being transported in a direction orthogonal to a beam 716. As indicated by dashed extension line 717, one variation of this configuration features the laser source stationary, such that a beam is directed along line 717 to the transported item and is redirected by optics 714 mounted to the offsettable component to the sensor in a way that permits detection of deviation from the desired path. Many variations will occur to those having skill in the art, e.g., any mechanism where a light or other radiation source, a beam, a detector, and so forth are used to detect positional deviation are contemplated; without limitation in other embodiments, both the laser source and detector can be stationary while optics (such as flat or curvilinear mirrors or beam splitters) are mounted in a manner fixed relative to the offsettable component, in a manner to promote detection of positional deviation. Whichever design is used, signals from the sensor(s) are once again used to direct actuators 718A/718B so as to maintain alignment of the beam.

Figure 7C:
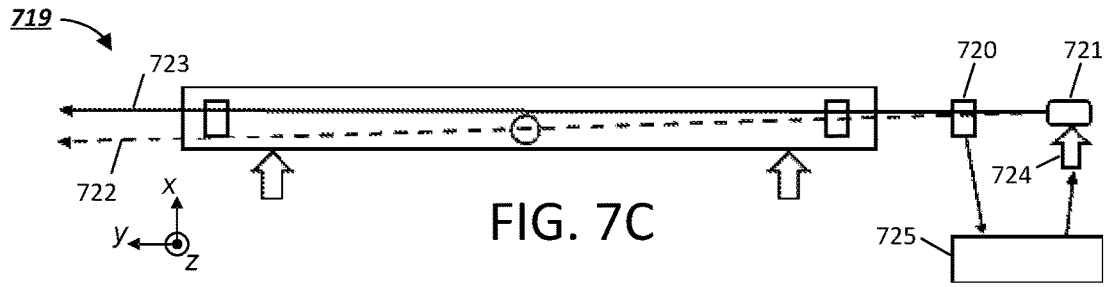
FIG. 7C shows an embodiment 719 where a sensor 720 is used to calibrate a light source 721, e.g., so as to detect and/or correct for path error 722 relative to an intended path 723.

FIG. 7C shows an embodiment 719 where a sensor 720 is used to calibrate a light source 721, e.g., so as to detect and/or correct for path error 722 relative to an intended path 723. A laser sensor near the laser source is used to optically measure the laser beam direction. If the laser beam direction deviates from the intended path 723, then position of the laser and/or deflection of its beam is adjusted (manually and/or electronically, under the influence of an electronic control signal) until the intended path is achieved. For example, in one embodiment, a laser mount can be controlled by piezoelectric (or other) transducers or other deflection means 724 (under the influence of processing circuitry 725) to adjust inclination and/or rotation of the laser source until proper alignment is obtained. Note that advantageously, the laser sensor can be designed to detect path deviation in two dimensions, to ideally effect correction of alignment errors using an automated control loop with a response within milliseconds. Note also that design of a suitable laser sensor is within the level of one of ordinary skill in the art, e.g., in some embodiments, a beam-splitter and four-cell sensor can be used to align the beam, as referenced earlier; many suitable adjustment and sensing mechanisms will occur to those having skill in optics, including without limitation, those based on analog designs (e.g., an analog output is produced with voltage proportional to position or deviation), convex or concave mirrors and beam splitters, interferometry, and other mechanisms.

Figure 7D:
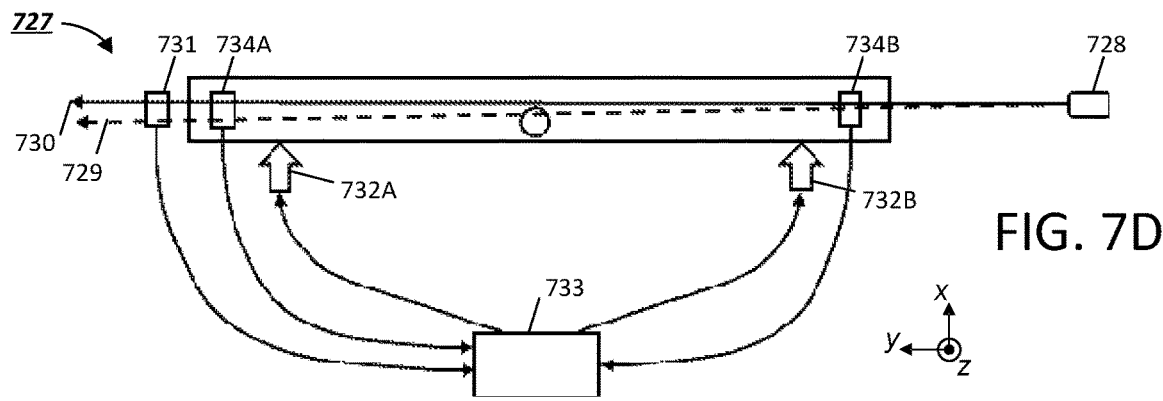
FIG. 7D shows an embodiment 727 where a light source 728 is improperly aligned; unlike the embodiment of FIG. 7C, however, deviation between an erroneous optical path 729 and a correct optical path 730 is corrected for electronically, by using transducers (represented by arrow-icons 732A/732B) to perform compensating offsets. Signals to control these offsets can be stored in digital memory and retrieved during system operation or otherwise added to dynamic corrections as a function of transport path position, such that a transported component follows the correct path 730.

FIG. 7D shows another embodiment 727 where a light source 728 is improperly aligned; unlike the embodiment of FIG. 7C, however, deviation between an erroneous optical path 729 and a correct optical path 730 is mitigated passively and electronically, e.g., by using a first sensors 731 to detect error and actuators 732A/732B to perform compensating offsets. Signals to control these offsets can be stored in digital memory 733 and retrieved during system operation or otherwise added to dynamic corrections (identified at run time from second sensors 734A/734B) as a function of transport path position, such that a transported object follows the correct path 730. FIG. 7D shows an added laser position sensor 731 on the left near the end of the laser beam. This sensor allows one to remove the sensor 720 (and associated active laser attitude control, represented in FIG. 7C); that is, instead of actively compensating for laser alignment error, the error is measured by the added laser sensor 731 and corrected using two transducers (i.e., while moving the substrate, as a function of substrate position).

Figure 7E:
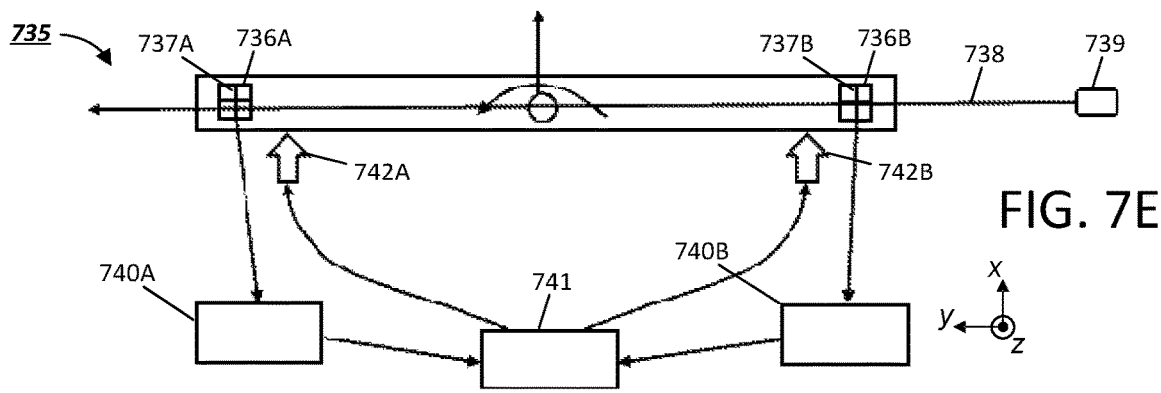
FIG. 7E shows an embodiment 735 that implements a zero-target control loop; sensors 736A/736B dynamically detect deviation from a desired path in one or more dimensions (in this case represented by deviation between "crosshairs" 737A/737B and a beam 738 from a laser source 739); a motion controller 741 provides feedback to drive transducers 742A/742B so as to always drive error to zero.

FIG. 7E shows an embodiment 735 that implements a zero-target control loop; sensors 736A/736B dynamically detect deviation from a desired path in one or more dimensions (in this case represented by deviation between "crosshairs" 737A/737B and a beam 738 from a laser source 739); processing electronics 740A/740B preprocess outputs from the sensors such that a zero signal is the norm (indicating "no adjustment"); this output is provided to a motion controller (i.e., a processor-implemented zero-target controller) 741, which generates correction signals to provide feedback to drive transducers 742A/742B when correction is required, i.e., so as to always drive error to zero. FIG. 7E does not explicitly show which method is used for correcting for laser alignment error, but without limitation, either the active control method introduced relative to FIG. 7C or the transducer-compensation method represented by FIG. 7D can be used for this purpose; other methodologies will occur to those having skill in the art.

Figure 7F:
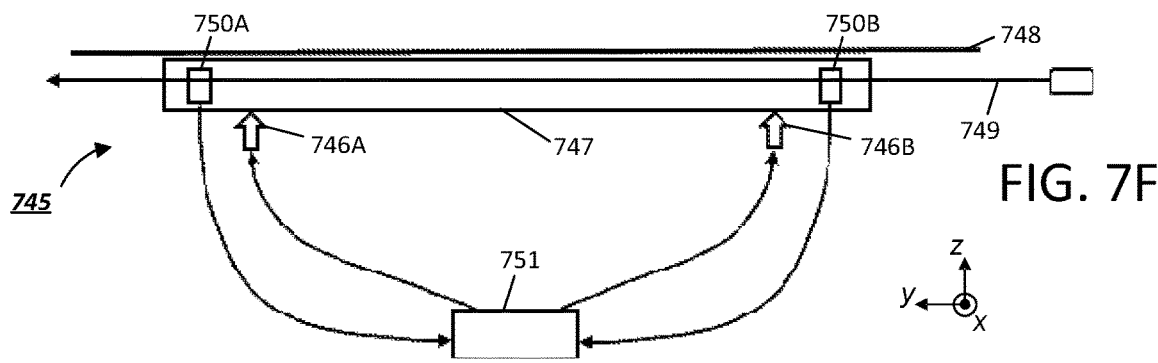
FIG. 7F shows an embodiment 745 where transducers 746A/746B are driven to maintain a transported object (e.g., a gripper 747 and substrate 748) as always level relative to an optical guide 749. In this case, sensors 750A/750B detect deviation of the substrate and/or part of the gripper from the optical guide 749, and drive two transducers 746A/746B to equalize jitter in height, or to otherwise precisely control height.

FIG. 7F shows an embodiment 745 where actuators 746A/746B are driven to maintain a transported object (e.g., a gripper 747 and/or substrate 748) as always level in terms of z-axis height relative to a beam or optical guide 749. In this case, sensors 750A/750B detect deviation of the gripper (or other conveyance mechanism) from the optical guide 749, and drive the two actuators 746A/746B to equalize jitter in height or to otherwise precisely control height (e.g., to maintain a predetermined height profile such as to match zones as referenced earlier). A processor-based motion controller 751 can once again be used to assist with this purpose.

Figure 7G:
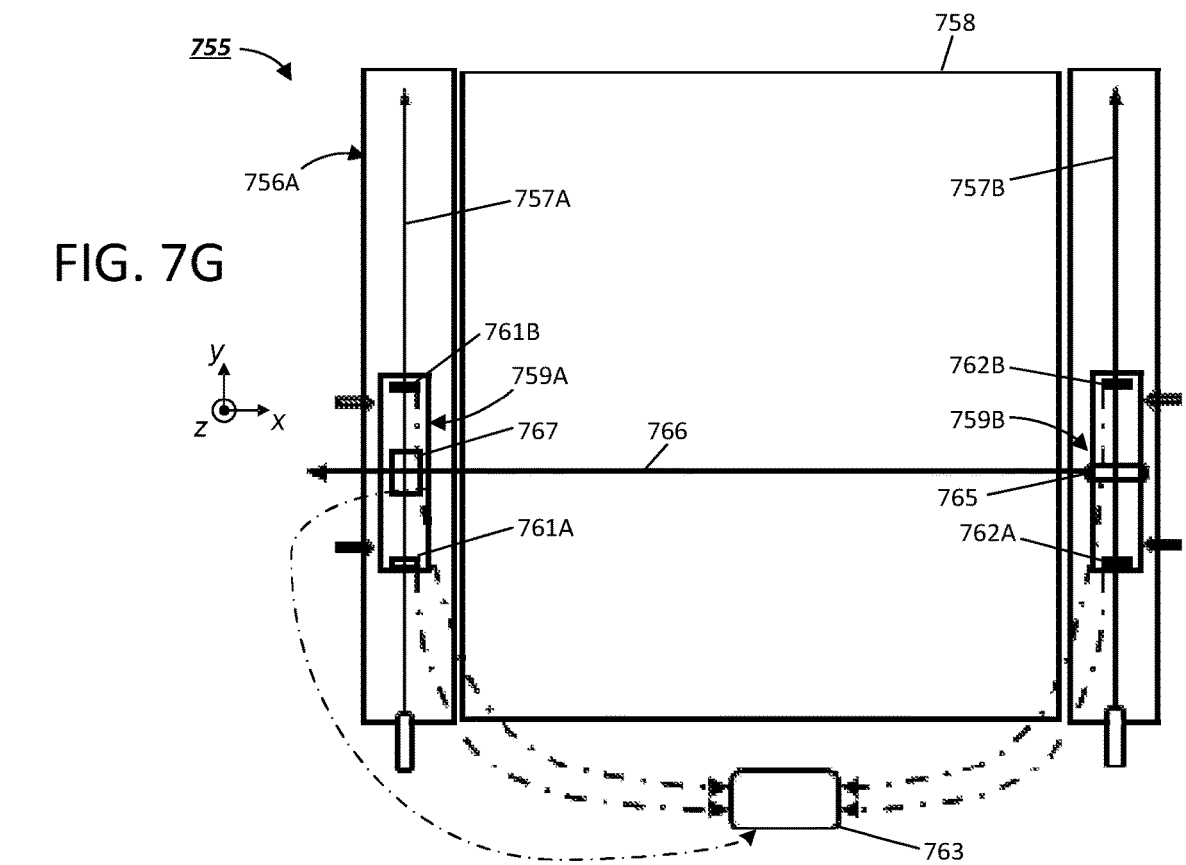
FIG. 7G shows an embodiment 755 which uses two parallel conveyance systems 756A/756B for a given direction of transport. In this case, each conveyance system has its own optical guide 757A/757B and transducer compensation system 759A/759B. One of the conveyance systems 7566 also mounts another light source 765, which generates an optical guide 766, used to align and synchronize the two conveyance systems 756A/756B. A signal from a detector 767 on the second conveyance system 756A is fed to a motion controller 763 so as to maintain synchronization between the conveyance systems.

FIG. 7G shows an embodiment 755 which uses two parallel conveyance systems 756A/756B for a given direction of transport. In this case, whether due to size of the substrate being received or due to other specifics of the manufacturing process, it is assumed that a substrate or other transported element 758 is to be transported by multiple traveling components along parallel conveyance paths, and that it is desired that each conveyance system (i.e., each one two parallel vacuum gripper systems in this example) be controlled exactly in sync to avoid mechanical jitter and/or substrate skew. To this end, each of the parallel conveyance systems 756A/756B has its own optical guide or beam 757A/757B and transducer compensation system 759A/759B, each generally corresponding to one of the embodiments described herein. Sensor pairs 761A/761B and 762A/762B report signals to motion controller circuitry 763 which controls two motors (not shown), one corresponding to each conveyance system 756A/756B. One of the conveyance systems 7566 also mounts another light source 765 (e.g., a laser source), which generates yet a third optical guide 766, while the other conveyance system 756A mounts a third sensor 767, e.g., a four cell design as described earlier. As shown in phantom lines, path deviation signals from each of the five sensors 761A/761B/762A/762B and 767 are fed to the motion controller circuitry, which advances or retards one or both of the motors so that each of the parallel conveyance system 756A/756B is advanced exactly in parallel. For embodiments that use multiple transducer correction systems (e.g., to control both x offset and z height, for each of lateral displacement and/or fly height control), the third optical guide 766 and signal from the third sensor can be used to detect height differential between the second, offsettable component (i.e., of each gripper system in this embodiment). Just as was the case with FIGS. 7C-D, the components associated with the third optical guide can optionally further include components used during a calibration mode or process to ensure that the third optical guide is level and is orthogonal to the direction of transport provided by the parallel conveyance systems 756A/756B.

Figure 7H:
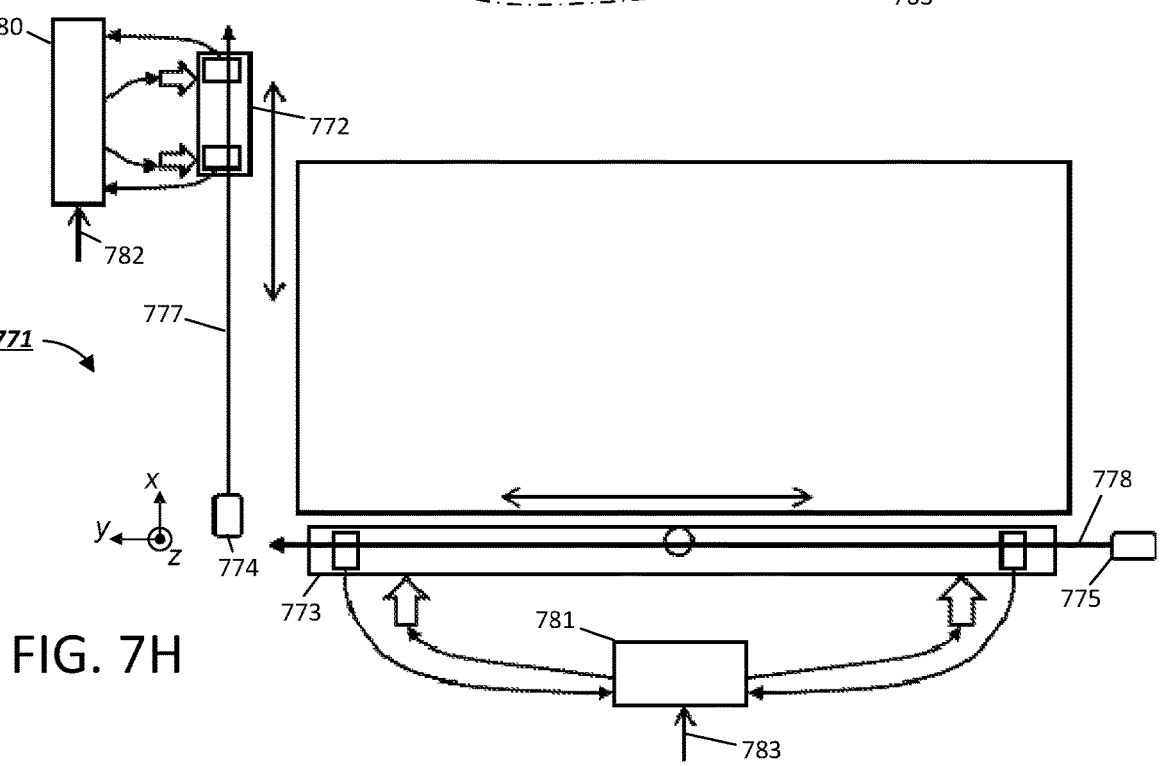
FIG. 7H shows an embodiment 771 where two conveyance systems 772 and 773 each have their own source 774/775 and motion controller 780/781. The result is that errors are corrected transparently to general system motion control, such that each motion controller 780/781 can receive respective (absolute position coordinate) command signals 782/783 to establish proper position relative to a system coordinate reference system.

FIG. 7H shows an embodiment 771 where two conveyance systems 772 and 773 used for orthogonal transport paths each have their own respective laser source 774/775 and associated optical guide 777/778 and motion controller 780/781. The result is that errors are corrected transparently to general system motion control, such that each motion controller 780/781 can receive respective drive signals or command signals 782/783, i.e., as absolute position commands, to establish proper position relative to a system coordinate reference system.

Figure 7I:
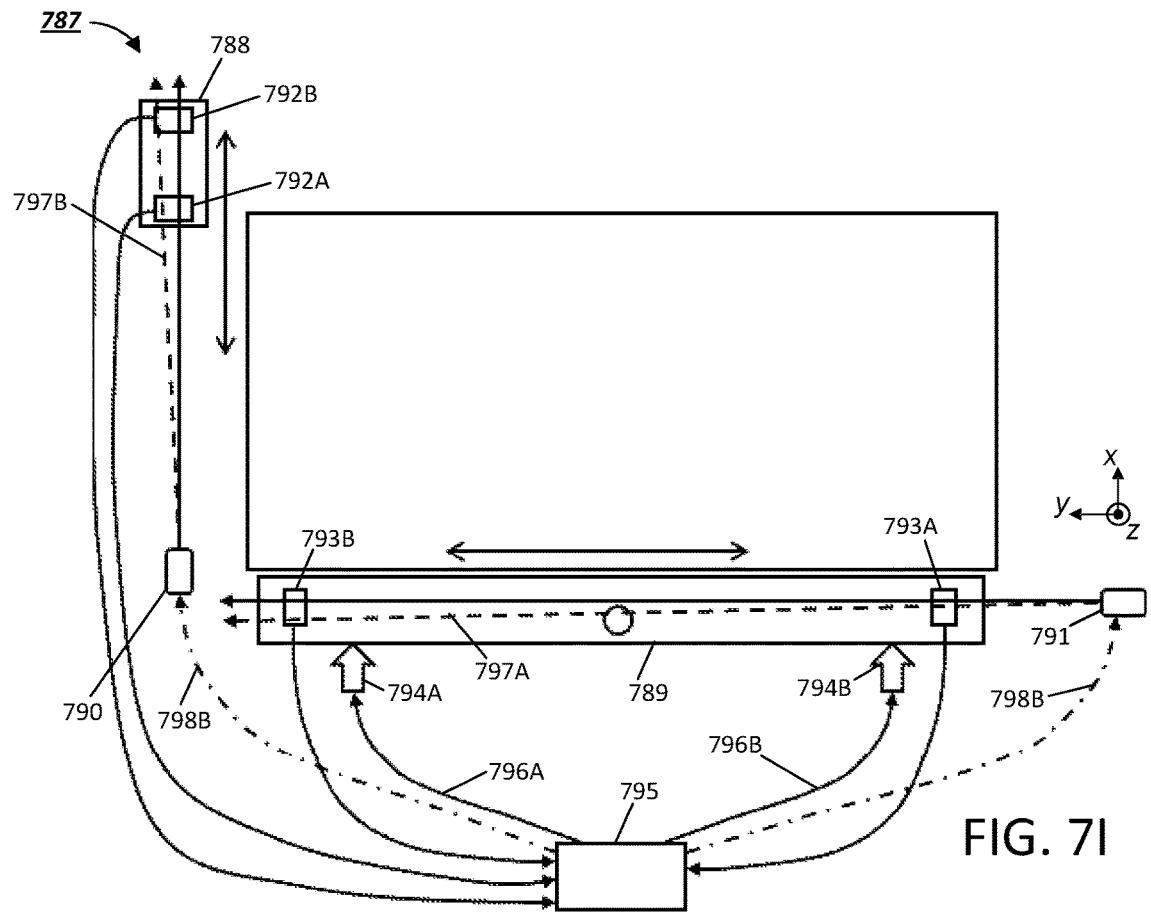
FIG. 7I shows an embodiment 787 where two conveyance systems 788/789 each have their own source 790/791 and sensor pairs 792A,B/793A,B, but where only one system has a transducer-based error correction system (794A/B); in this case, a motion controller 795 generates transducer control signals 796A/796B so that one of the conveyance systems (789) compensates for error associated with other conveyance system 788. Non-motion errors, such as error in alignment of the optical guide for either conveyance system and/or non-orthogonality between the conveyance systems, can also be corrected.

FIG. 7I shows an embodiment 787 where two conveyance systems 788/789 each have their own source 790/791 and sensor pairs 792A/792B and 793A/793B, but where only one conveyance system has actuators 794A/794B to correct for motion jitter; in this case, a motion controller 795 generates transducer control signals 796A/796B so that actuators 794A/794B are driven to compensate for error associated with other conveyance system 788, as was introduced above in connection with the discussion of FIG. 3E. Non-motion errors, such as error in alignment of the optical guide for either conveyance system and/or non-orthogonality between the conveyance systems can also be corrected, as introduced earlier (this non-orthogonality is represented by two depicted erroneous beam paths 797A/797B). As denoted by respective correction signals 798A/798B sent to each laser source 790/791, one or both optical sources can be calibrated electronically (or by mixing any of the optional alignment/calibration techniques introduced earlier) to correct for non-orthogonality, for example, by realigning laser paths, adjusting correction signals provided to actuators 794A/794B, and so on.

Note that while a variety of options and use cases have been described above, it should be noted that the various techniques and options should be viewed as optional and capable of being mixed and matched with each other in any permutation or combination. As a non-limiting example, it is possible (and is expressly contemplated) that one may use a zero-target controller (and associated "crosshair" sensors, introduced above in connection with the embodiment shown in FIG. 7E) in the embodiment of FIG. 7H. Other combinations, permutations and modifications will no doubt be apparent to those having ordinary skill in the art, which are similar to one or more of the examples discussed above.

V. Multi-Dimensional Control of an Offsettable Conveyance System Component

One embodiment of a gripper error correction system, as noted above, can correct for error in multiple dimensions that are orthogonal to a conveyance path and/or orthogonal to an optical guide. As exemplified above, in an environment where a conveyance system moves a transported component along a first translational axis (e.g., along the "y" axis of motion), a set of one or more actuators or transducers, such as voice coils or piezoelectric transducers can be used to offset the transported component along a second translational axis (e.g., along the "x" axis of motion), while a set of one or more actuators or transducers, such as voice coils or piezoelectric transducers can be used to offset the transported component (or another component) along a third translational axis (e.g., along the "z" axis of motion), with all three of these axes being orthogonal to one another. In another embodiment, three or more actuators can be used for each offsettable component, so as to facilitate levelization of that component. These various design options will be discussed below in connection with FIGS. 8A and 8B.

Figure 8A:
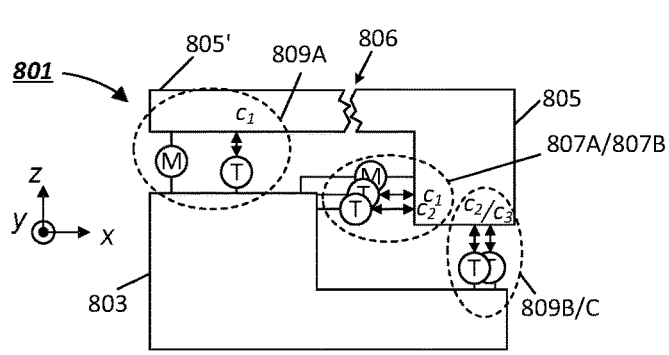
FIG. 8A is a cross-sectional view of an assembly that uses two different sets of transducers "T" to correct for error in two or more dimensions.

FIG. 8A is a cross-sectional view of an assembly 801 that uses two different sets of transducers "T" to correct for error in two or more dimensions. More specifically, a first, track-guided component 803 of a conveyance system travels along a first dimension of travel (i.e., along the "y" axis in this example, into the drawing page) while a second, offsettable component 805 is constrained to travel with the first component along the first dimension of travel. The depicted assembly has two transducer sets, including set 807, which is seen to have transducers to displace the second component relative to the first component along the "x" axis, much as described in connection with the gripper embodiments discussed above, and a second set 809, which is seen to have transducers to displace the second component relative to the first component along the "z" axis, to adjust fly height. In this example, the second transducer set is seen to optionally have three transducers and associated contact points $c_1$-$c_3$, to permit automated planar levelization of the second component 805 along the "z" axis (i.e., to adjust unintended tilt of the second component in xz and yz planes). As denotes by numeral 805' and broken linkage 806, the second component optionally can be structured as two or more components, e.g., so as to be offsettable from each other along the "z" axis and offsettable as a group from the first component along the "x" axis. Each transducer set is seen to include a mechanical linkage/support structure (labeled "M" in the figure), such as the floating pivot plate assembly described earlier or a structural support analogy, so as structurally constrain components 803 and 805 to move with each other along the "y" axis while permitting offsettable component 805 to travel in x and z dimensions relative to the first component 803.

Figure 8B:
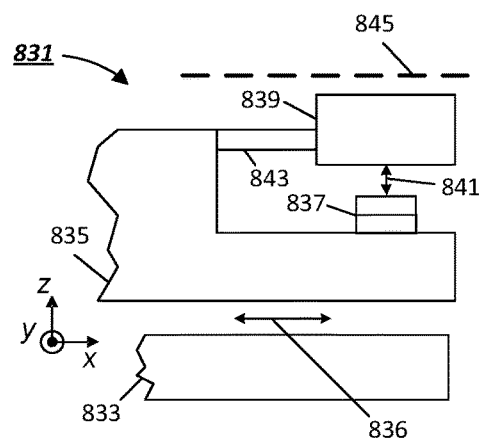
FIG. 8B is a cross-sectional view of another assembly that uses two different sets of transducers "T" to correct for error in two or more dimensions.

FIG. 8B is a cross-sectional view of another assembly 831 that uses two different sets of transducers "T" to correct for error in two or more dimensions. In this figure, a first component is represented by numeral 833 while a second offsettable component is represented by numeral 835; these components in this example also are constrained to travel together along the "y" axis, while being selectively offsettable from one another in the direction of arrows 836 (i.e., along the "x" axis). In one embodiment, these components are structurally identical to the gripper design of FIG. 6B, with a set of transducers used to effectuate displacement in the direction of arrows 836 and mechanical linkage between components 833 and 835 not being visible in the figure.

To correct for fly height in this example, the second component 835 supports a vacuum chuck 839 which is once again used to engage a substrate, represented by dashed line 845. One or more transducers 837 are used to selectively displace the vacuum chuck 839 along the "z" axis, in the direction of arrows 841. In this case, the vacuum chuck 839 is also supported by a flexure 843 which provides spring force to permit slightly negative "z" axis displacement of the vacuum chuck 839 and substrate 845 when no force is exerted by the one or more transducers 839, but which also provides sufficient spring force so as to permit slightly positive "z" axis displacement of the vacuum chuck 839 and the substrate 845 when the transducers are actuated to their full throws; depending on embodiment, the transducers can be piezoelectric transducers when the required throws are less than about 3 microns, while voice coils or similar transducers can be used for larger throws, e.g., five microns or more. Other types of actuators can also be used, depending on embodiment.

While in this example a flexure is used to provide structural support that constrains the two components to travel together along the "y" axis, along with floating pivot assembly (e.g., as seen in FIG. 6D), other types of structures performing these functions will no doubt occur to those having ordinary skill in mechanics; the examples presented above are consequently to be viewed as illustrative only, and not limiting.

VI. Conclusion

Reflecting on the various techniques and considerations introduced above, a manufacturing process can be performed to mass produce products quickly and at low per-unit cost. Applied to display device or solar panel manufacture, e.g., flat panel displays, these techniques enable fast, per-panel printing processes, with multiple panels optionally produced from a common substrate. By providing for fast, repeatable, error-free printing techniques (e.g., using common inks and printheads from panel-to-panel), it is believed that printing can be substantially improved, for example, reducing per-layer printing time to a small fraction of the time that would be required without the techniques above, all while guaranteeing precision deposition of ink on a consistent basis within a desired target area of each substrate. Again returning to the example of large HD television displays, it is believed that each color component layer can be accurately and reliably printed for large substrates (e.g., generation 8.5 substrates, which are approximately 220 cm×250 cm) in one hundred and eighty seconds or less, or even ninety seconds or less, representing substantial process improvement. Improving the efficiency and quality of printing paves the way for significant reductions in cost of producing large HD television displays, and thus lower end-consumer cost. As noted earlier, while display manufacture (and OLED manufacture in particular) is one application of the techniques introduced herein, these techniques can be applied to a wide variety of processes, computer, printers, software, manufacturing equipment and end-devices, and are not limited to display panels. In particular, it is anticipated that the disclosed techniques can be applied to any process where a printer is used to deposit a layer of multiple products as part of a common print operation, including without limitation, to many microelectronics applications.

Note that the described techniques provide for a large number of options. In one embodiment, panel (or per-product) misalignment or distortion can be adjusted for on a product-by-product basis within a single array or on a single substrate. A printer scan path can be planned without need for adjustment/adaptation based on one or more alignment errors, such that misorientation of a substrate (or other transported item, such as a printhead) is automatically compensated for via transducers which couple a substrate and conveyance system (e.g., a gripper). In one embodiment, transducer correction can be used to mitigate error in a different transport path (e.g., a printhead transport path), or multiple transducers or transducer sets can be used to correct for multidimensional position and/or orientation error. In various embodiments, as mentioned, error is not premeasured, but rather, is detected dynamically and used to fine tune substrate and/or individual panel position so as to provide for perfect alignment.

Also, while various embodiments have illustrate the use of a gripper (or mechanism to couple the substrate to a conveyance mechanism), and the use of two transducers to effectuate fine tuning, other embodiments can use different numbers of these elements. For example, in one embodiment, two or more grippers can be used, each having their own, dedicated transducers. In addition, while the techniques described above have been exemplified as applied to a printer that uses a vacuum gripper system, many other applications can benefit from the described techniques including applications that use a different type of conveyance mechanism, a different type or printer, a different type of deposition mechanism, or another type of transport path or mechanism. Clearly, many variations exist without departing from the inventive principles described herein.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Thus, for example, not all features are shown in each and every drawing and, for example, a feature or technique shown in accordance with the embodiment of one drawing should be assumed to be optionally employable as an element of, or in combination of, features of any other drawing or embodiment, even if not specifically called out in the specification. Accordingly, the specification and drawings are to be regarded in an illustrative rather than a restrictive sense.

We claim:

1. A method of fabricating a thin-film layer, the method comprising:
    controlling a conveyance system to provide relative transport between a material source and a substrate along a conveyance path, wherein during the relative transport, the substrate is to be supported by a support structure and the material source is to deposit a material onto the substrate in order to form the thin-film layer;
    providing an optical source to form an optical beam and providing an optical detector located at a fixed displacement from at least one of the material source or the substrate;
    causing the optical detector to detect divergence of the position of the optical detector from the optical beam during the relative transport, and responsively generate an output; and
    driving at least one transducer to displace at least one of the material source or the detector relative to the conveyance path, in dependence on the output, so as to cause the position of the optical detector to remain coincident with the beam during the relative transport.

2. The method of claim 1, wherein the method further comprises forming an electronic product from the substrate, the electronic product comprising the thin-film layer.

3. The method of claim 1, wherein the conveyance system comprises a gripper that is to selectively engage the substrate and transport the substrate along the conveyance path, and wherein the method further comprises driving the at least one transducer during the relative transport so as to cause the substrate to travel a straight line relative to the optical beam for at least a portion of the conveyance path.

4. The method of claim 3, wherein the material source comprises a printhead, wherein the method further comprises causing the printhead is to deposit a liquid ink onto the substrate, the material to be supplied to the substrate by the liquid ink and comprising a film-forming substance, and wherein the method further comprises processing the liquid ink following deposition onto the substrate so as to solidify the film-forming substance relative to the liquid ink, to form the thin-film layer, using at least one of a (1) a radiation source to cure the film-forming substance to form the thin-film layer, or a (2) a heat source to evaporate solvent from the liquid ink to cause the film-forming substance to form the thin-film layer.

5. The method of claim 2, wherein the optical source is a laser and the optical beam is a laser beam oriented in a manner parallel to the conveyance path, and wherein the method further comprises using the laser beam as a virtual guide, and driving the at least one transducer so as to correct for deviation between the virtual guide and the conveyance path.

6. The method of claim 1, wherein:
the support structure comprises a floatation table;
the method further comprises using the floatation table to provide a gas cushion;
the conveyance system comprises a vacuum gripper that is to use a vacuum to selectively engage the substrate; and
the method further comprises selectively engaging the substrate with the vacuum gripper and pulling the substrate along the conveyance path atop the gas cushion with the vacuum gripper during the relative transport.

7. The method of claim 6, wherein the at least one transducer comprises a voice coil having a linear throw which is oriented in a direction independent to a direction of the optical beam.

8. The method of claim 7, wherein the direction of the linear throw is normal to a surface of the substrate, and wherein the method further comprises using the linear throw to adjust a height of the substrate relative to the support structure.

9. The method of claim 7, wherein the direction of the linear throw is parallel to the surface of the substrate, and wherein the method further comprises using the linear throw to adjust a distance between the substrate and the transport path.

10. The method of claim 7, wherein:
the conveyance system comprises a track;
the gripper comprises a first part, which travels along the track, and a second part, which mounts the optical detector and the vacuum gripper;
the voice coil couples the first part with the second part; and
the gripper further comprises a mechanical linkage between the first part and the second part; and the method further comprises advancing the first part along the track during the relative transport, and using the mechanical linkage to constrain the second part to travel with the first part in a direction of the conveyance path during the travel of the first part along the track, while permitting the displacement of the second part relative to the first part by the voice coil, toward and away from the track.

11. The method of claim 1, wherein the substrate is a first substrate and the method is to fabricate the thin-film layer on each given substrate of a series of substrates, including the first substrate, wherein each given substrate of the series of substrates features at least one fiducial, and wherein the method further comprises:
using a camera to image the fiducial of each given substrate of the series of substrates, including the first substrate;
mechanically positioning each given substrate of the series of substrates relative to the conveyance path, so as to align each given substrate of the series of substrates relative to the conveyance path; and
causing the vacuum gripper to engage each given substrate of the series of substrates for the relative transport following the alignment of the given substrate of the series of substrates relative to the conveyance path.

12. The method of claim 1, wherein the at least one transducer comprises two transducers, each having a linear throw that is parallel to a surface of the substrate, and wherein the method further comprises driving the two transducers in common-mode to displace the substrate in a direction perpendicular to the conveyance path and in differential-mode to rotate the substrate relative to the conveyance path.

13. The method of claim 1, wherein the at least one transducer comprises a piezoelectric transducer.

14. The method of claim 1, wherein the conveyance path is characterized by mechanical imperfections, and wherein the method further comprises using optical beam, the optical detector and the at least one transducer to cause the relative transport to follow a straight line notwithstanding the mechanical imperfections.

\* \* \* \* \*